(12) United States Patent
Wang et al.

(10) Patent No.: US 8,367,503 B2
(45) Date of Patent: Feb. 5, 2013

(54) SEMICONDUCTOR DEVICE AND A METHOD OF MANUFACTURING THE SAME

(75) Inventors: Junli Wang, Kanagawa (JP); Tomoyuki Hirano, Kanagawa (JP); Toyotaka Kataoka, Kanagawa (JP); Yoshiya Hagimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/181,583

(22) Filed: Jul. 13, 2011

(65) Prior Publication Data

US 2011/0269280 A1    Nov. 3, 2011

Related U.S. Application Data

(62) Division of application No. 12/168,427, filed on Jul. 7, 2008, now Pat. No. 7,994,603.

(30) Foreign Application Priority Data

Jul. 9, 2007    (JP) .................... 2007-179387

(51) Int. Cl.
*H01L 21/00* (2006.01)
(52) U.S. Cl. .................... 438/275; 257/E21.19
(58) Field of Classification Search .......... 438/275–278; 257/E21.19
See application file for complete search history.

(56) References Cited

U.S. PATENT DOCUMENTS

2006/0228843 A1   10/2006   Liu et al.

FOREIGN PATENT DOCUMENTS

| JP | 64-076739 | 3/1989 |
|----|-----------|--------|
| JP | 2000-100966 | 4/2000 |
| JP | 2000-195966 | 7/2000 |
| JP | 2000-307010 | 11/2000 |
| JP | 2000-031291 | 1/2001 |
| JP | 2001-102443 | 4/2001 |
| JP | 2004-004675 | 1/2004 |
| JP | 2004-095938 | 3/2004 |
| JP | 2006-060173 | 3/2006 |
| JP | 2006-093242 | 4/2006 |
| JP | 2006-351978 | 12/2006 |

OTHER PUBLICATIONS

Japanese Patent Office Action corresponding to Japanese Serial No. 2010-156552 dated Oct. 2, 2012.

*Primary Examiner* — Richard A. Booth
(74) *Attorney, Agent, or Firm* — SNR Denton US LLP

(57) ABSTRACT

A semiconductor device, including: a first group of transistors formed on a semiconductor substrate; and a second group of transistors formed on the semiconductor substrate, each of which is lower in operating voltage than each of the transistors in the first group; wherein each of the transistors in the first group includes a first gate electrode formed on the semiconductor substrate through a first gate insulating film, and a silicide layer formed on the first gate electrode; each of the transistors in the second group includes a second gate electrode formed in a trench for gate formation, formed in an insulating film above the semiconductor substrate, through a second gate insulating film; and a protective film is formed so as to cover the silicide layer on each of the first gate electrodes of the first group of transistors.

8 Claims, 68 Drawing Sheets

FIG. 3A
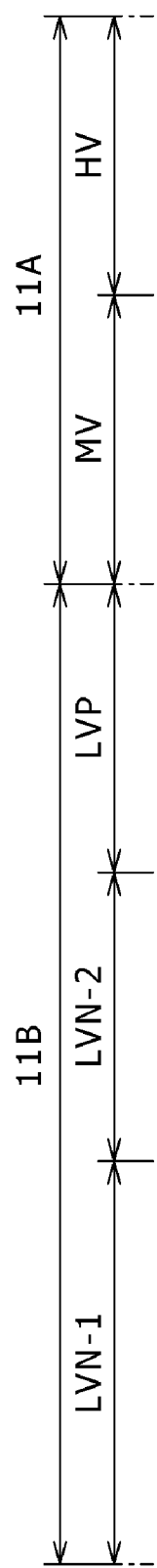
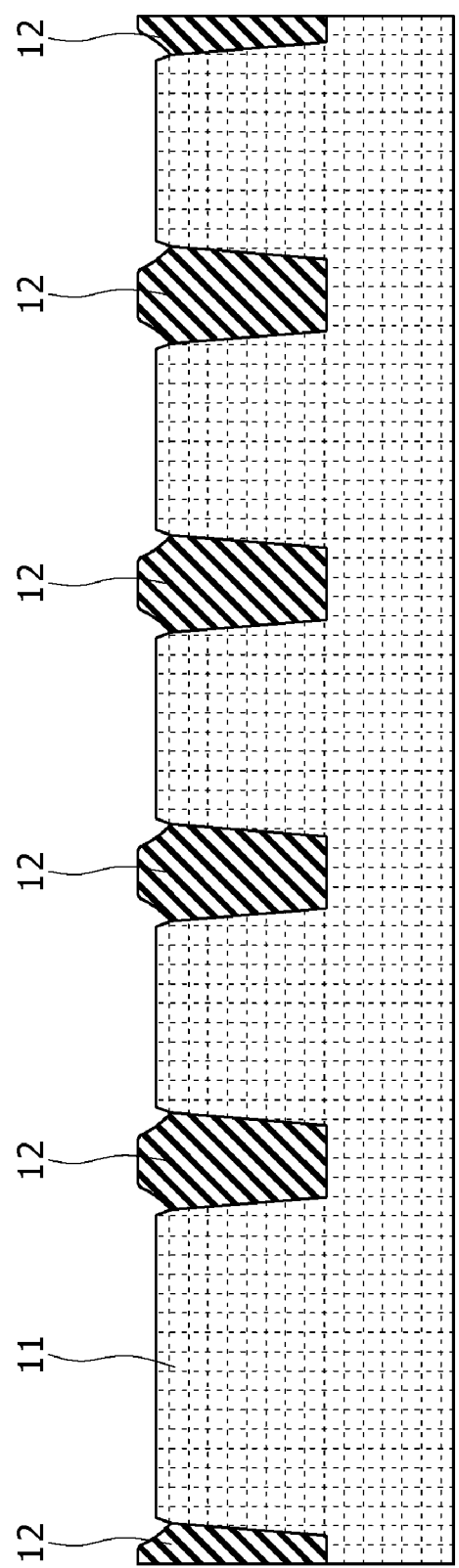

FIG. 3B
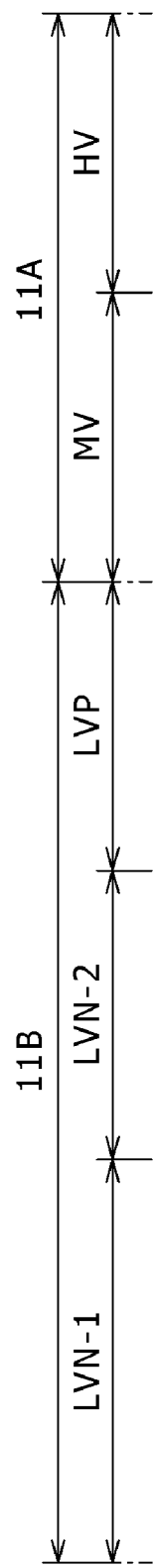
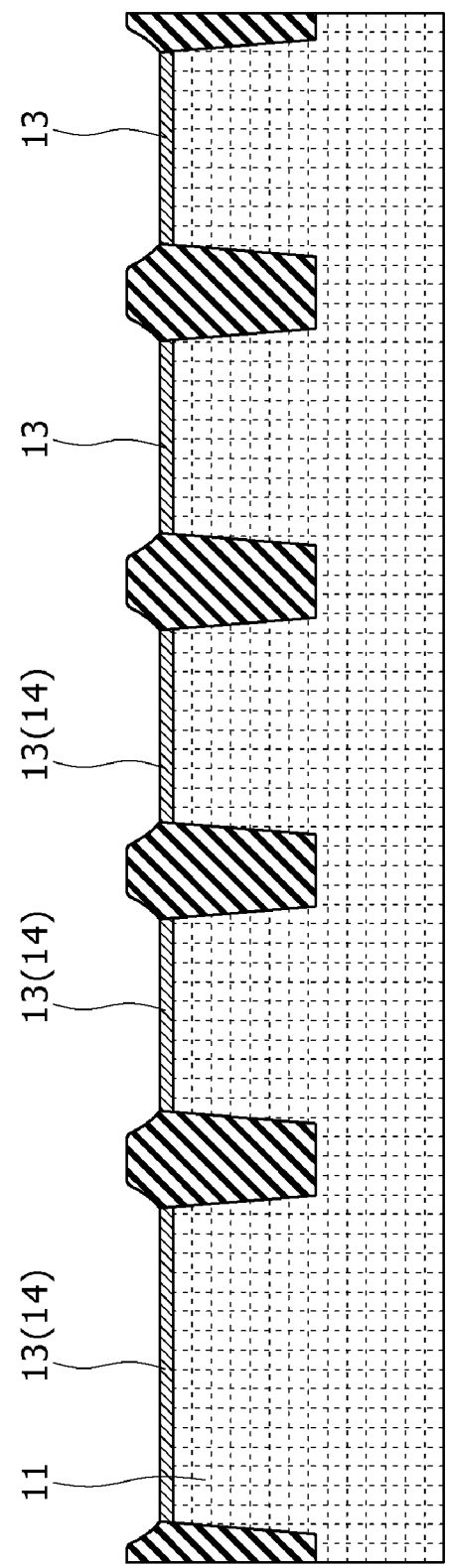

FIG.3C
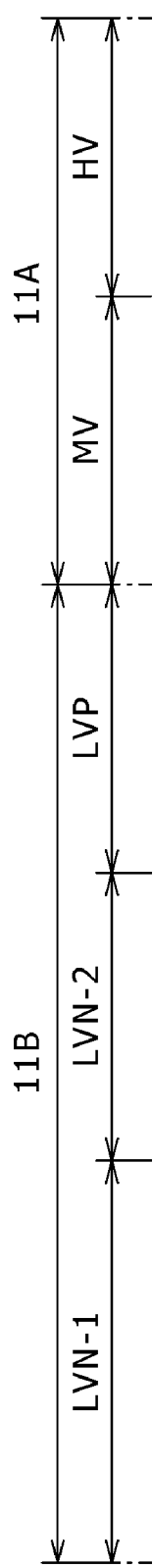
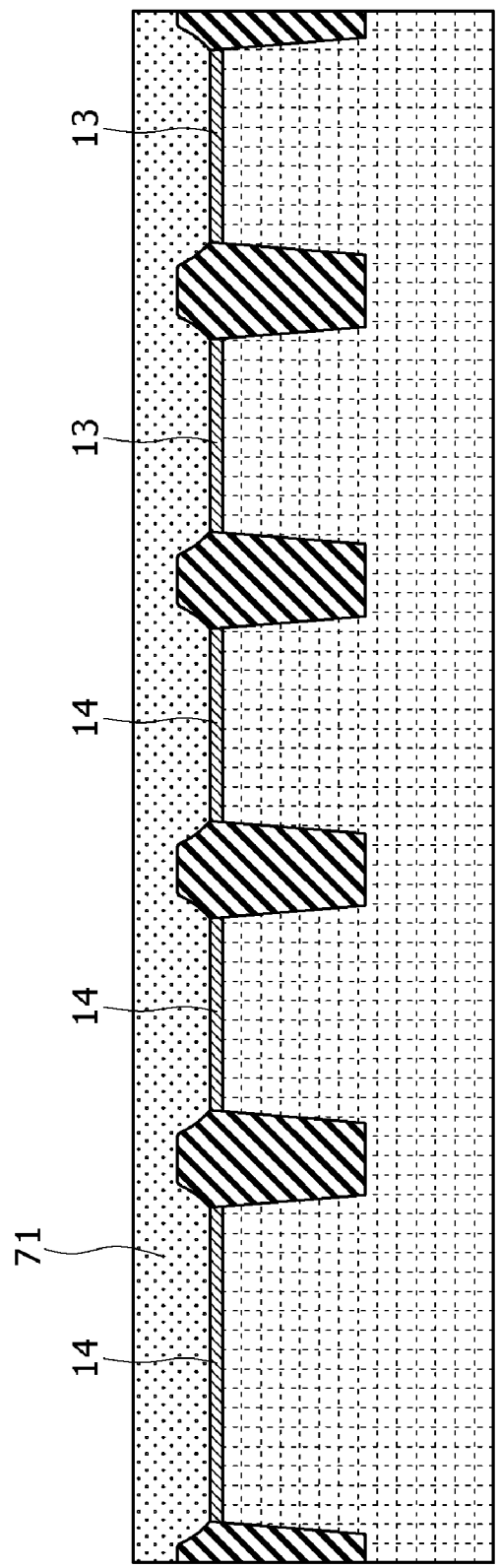

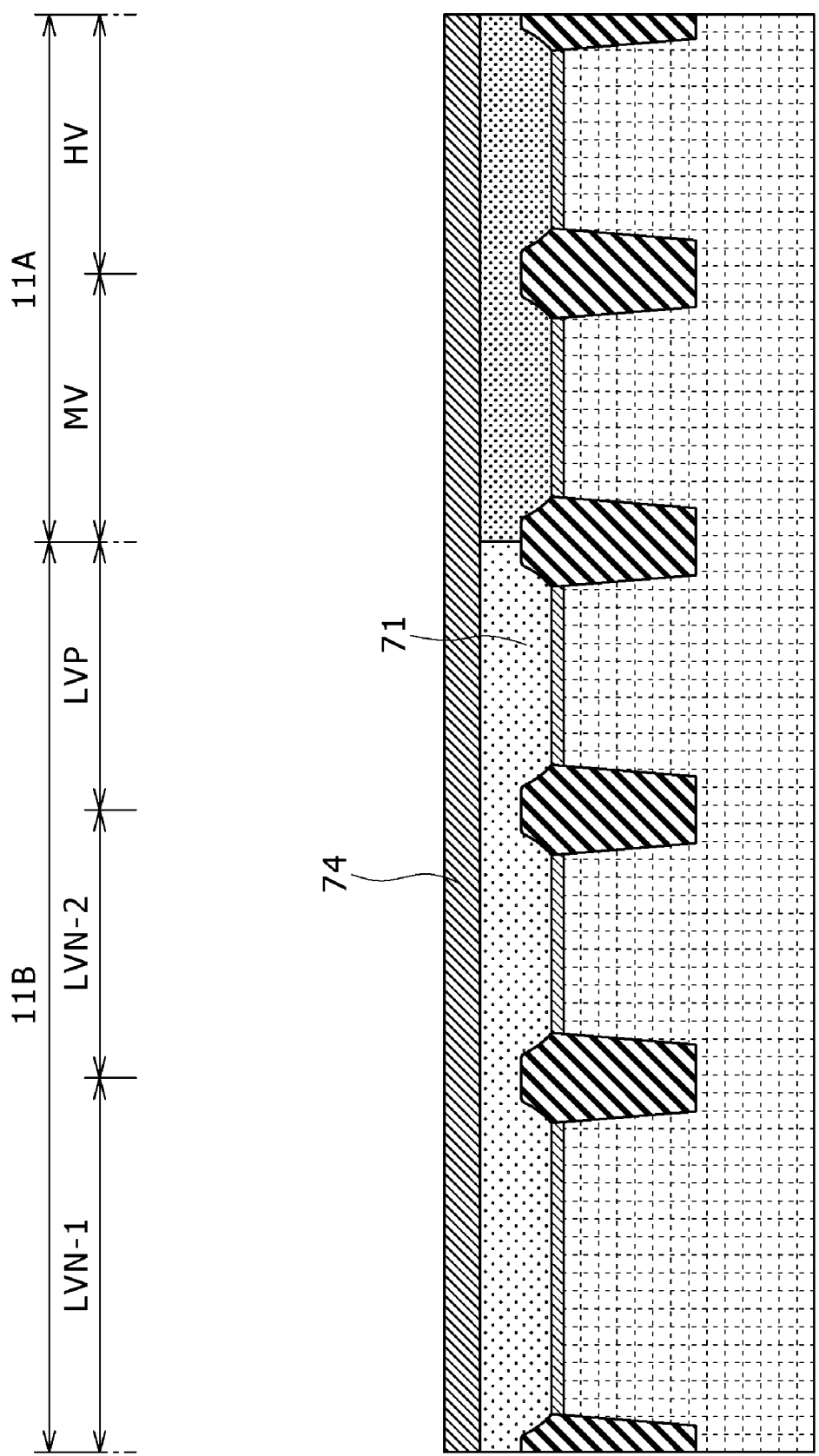

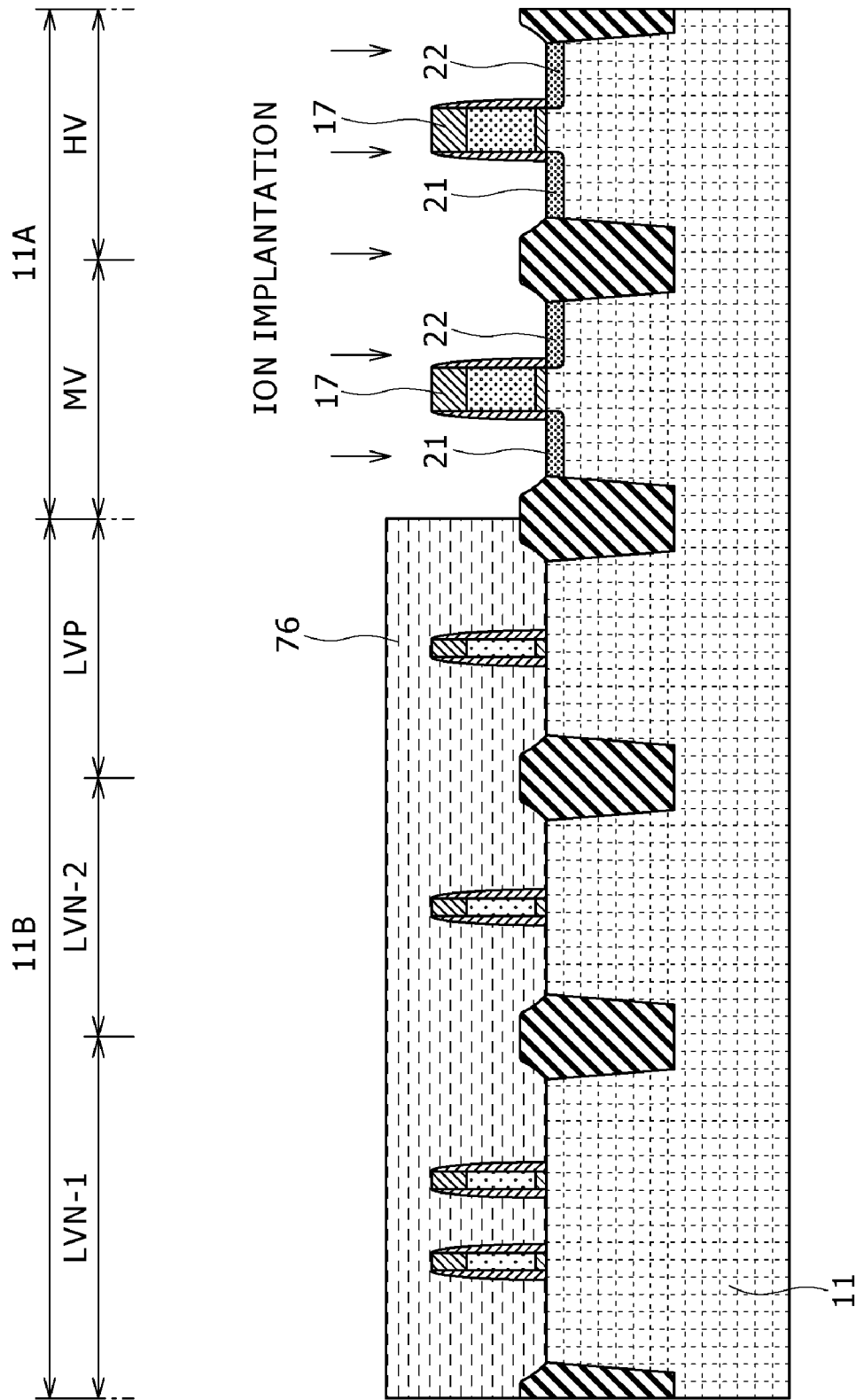

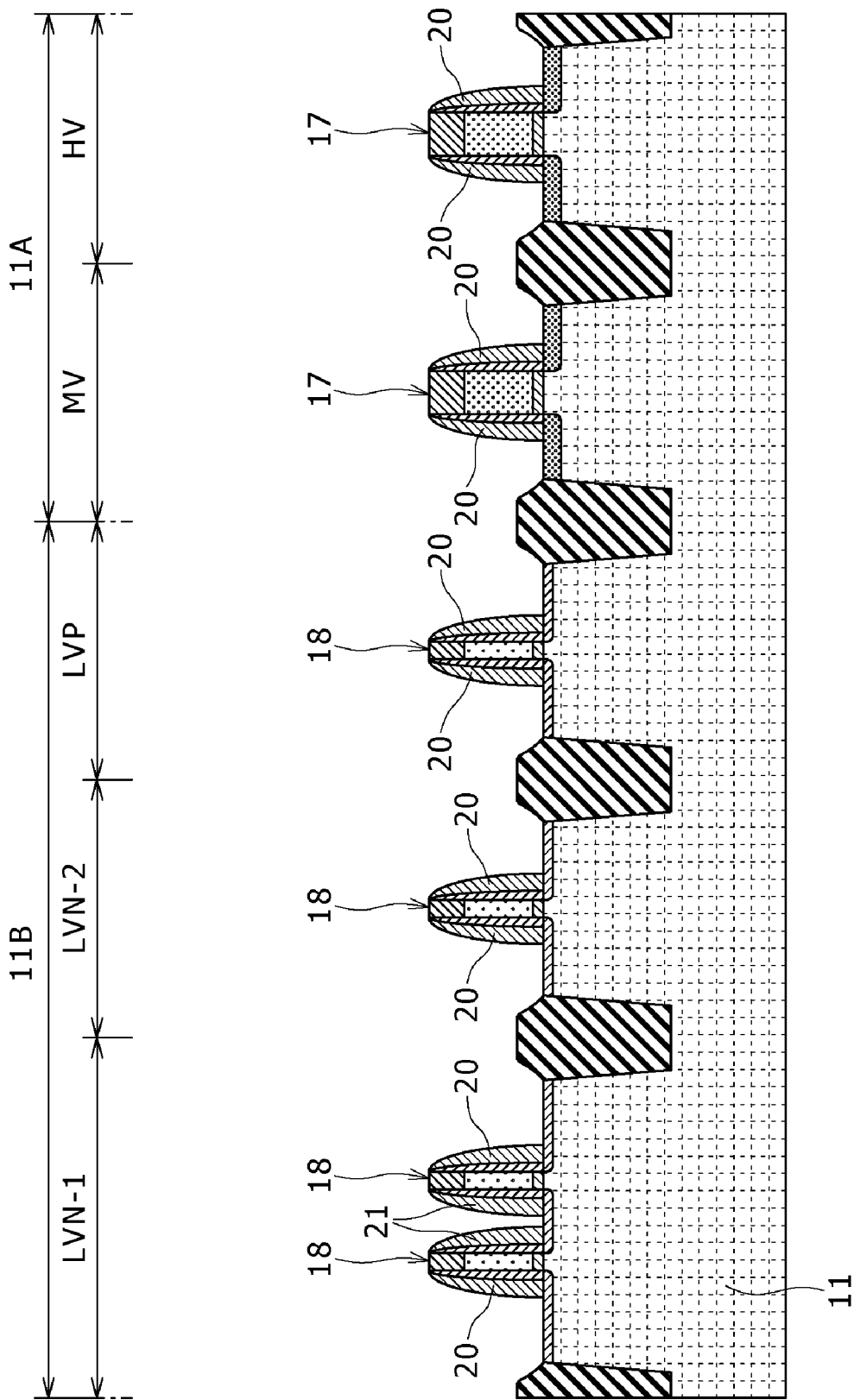

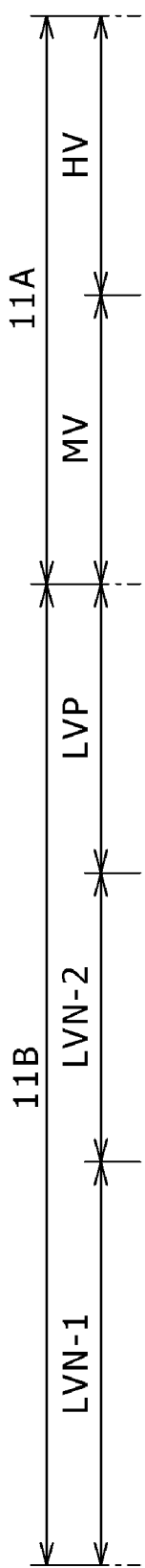
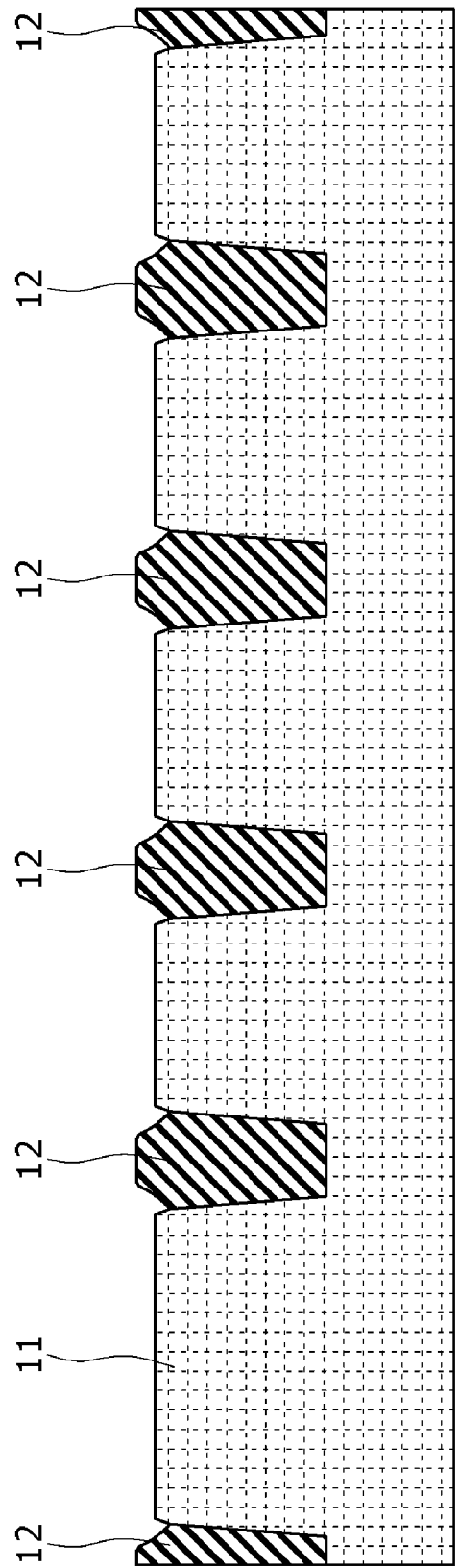
FIG.6A

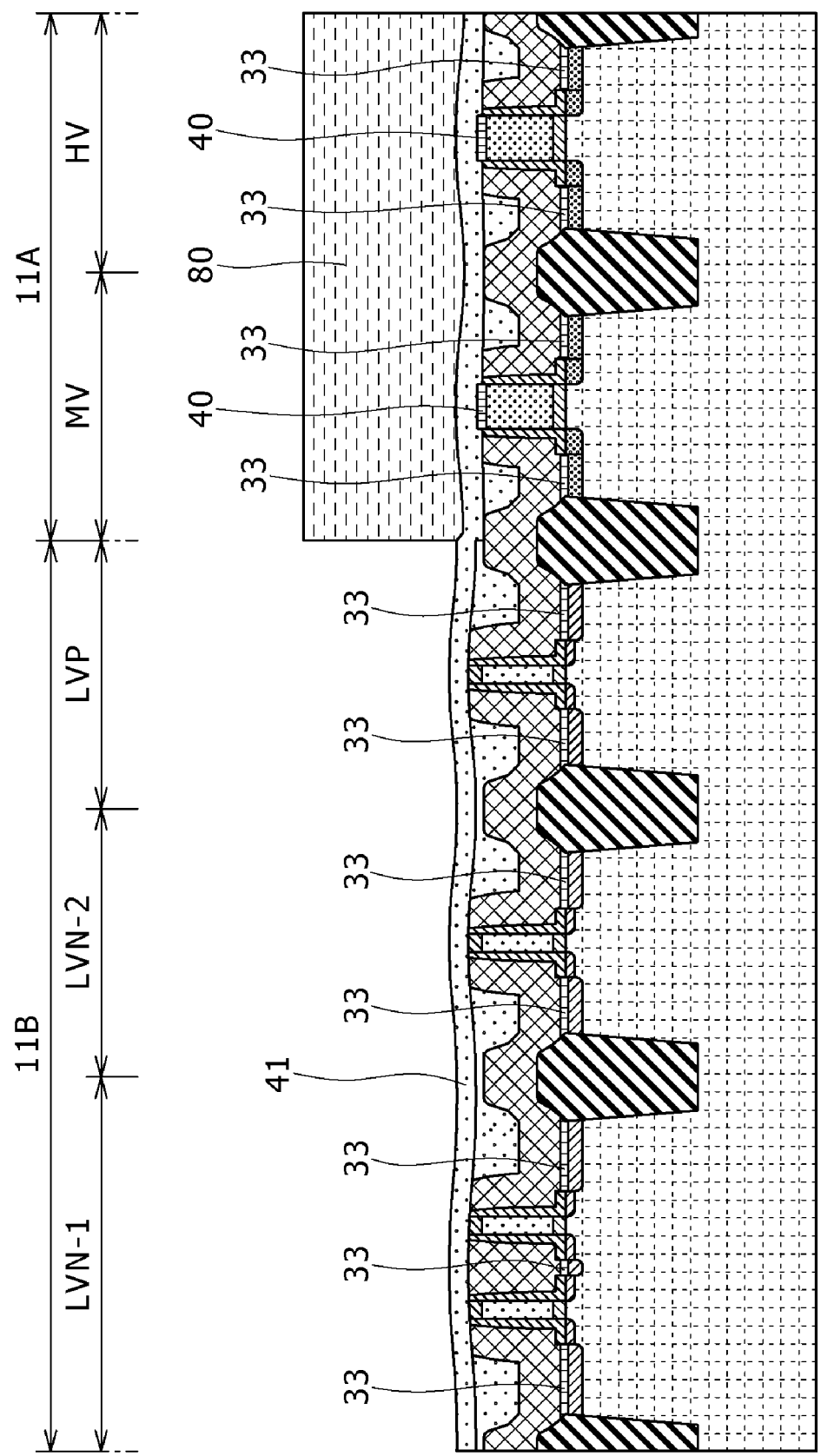

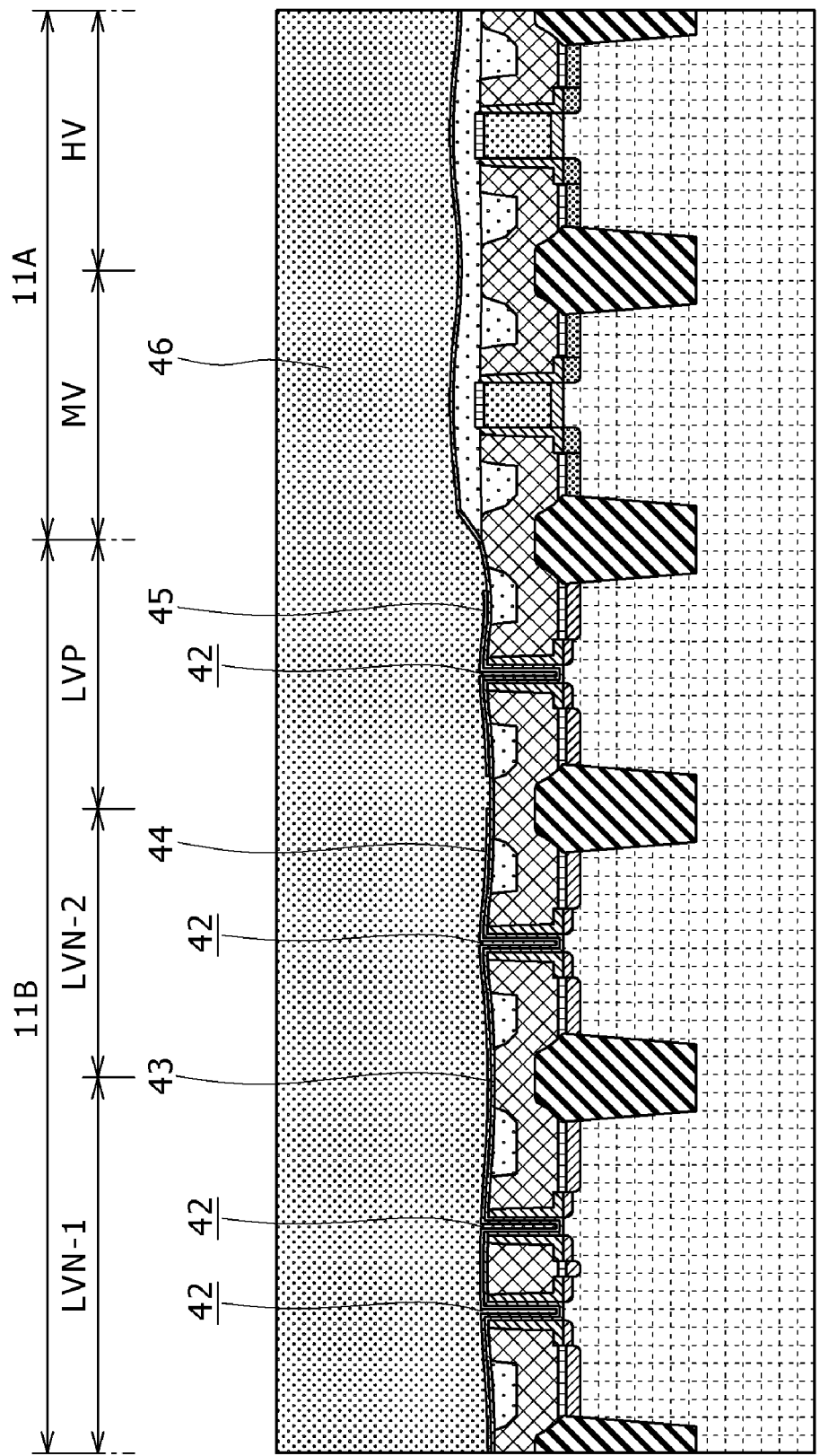

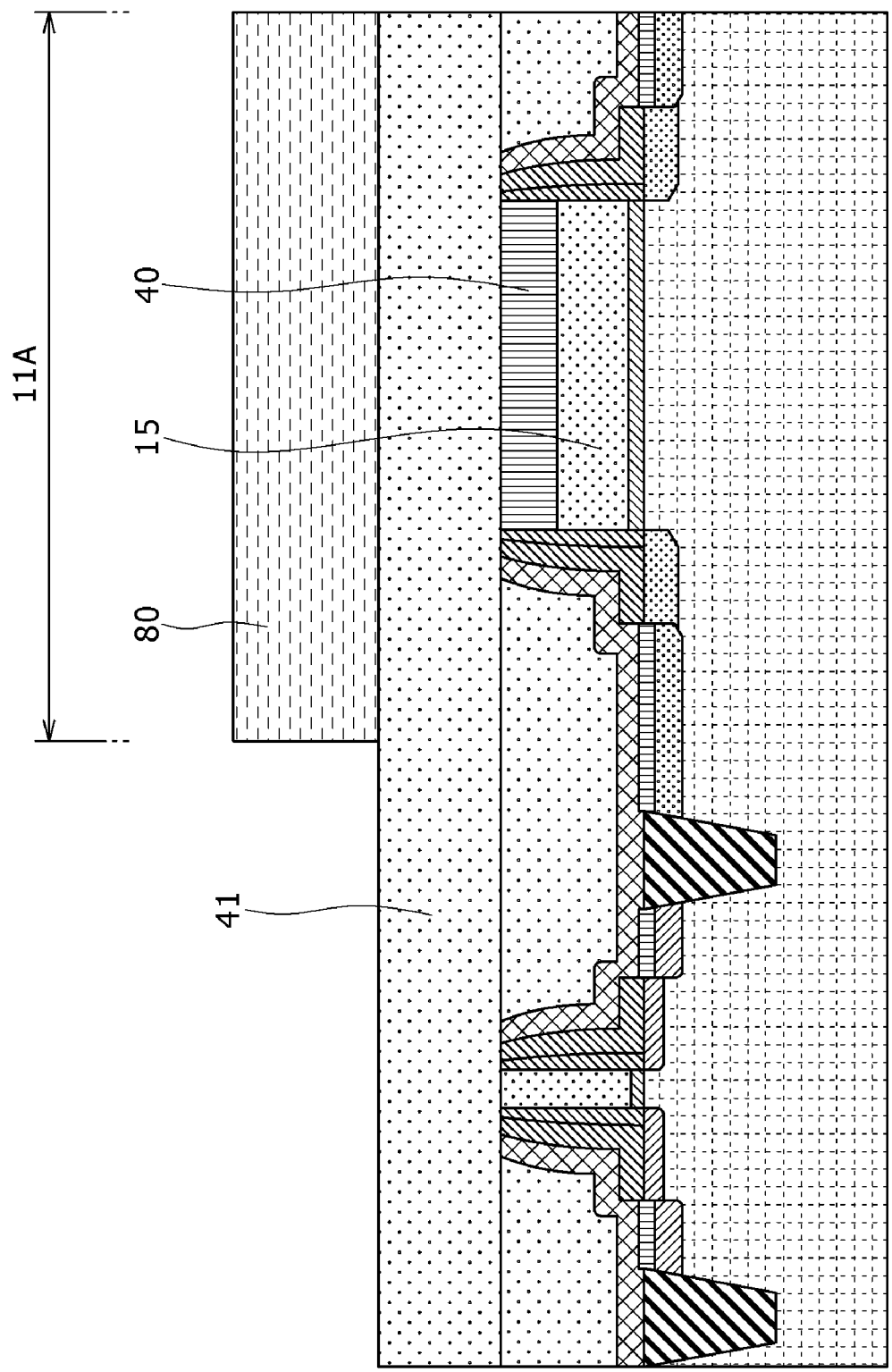

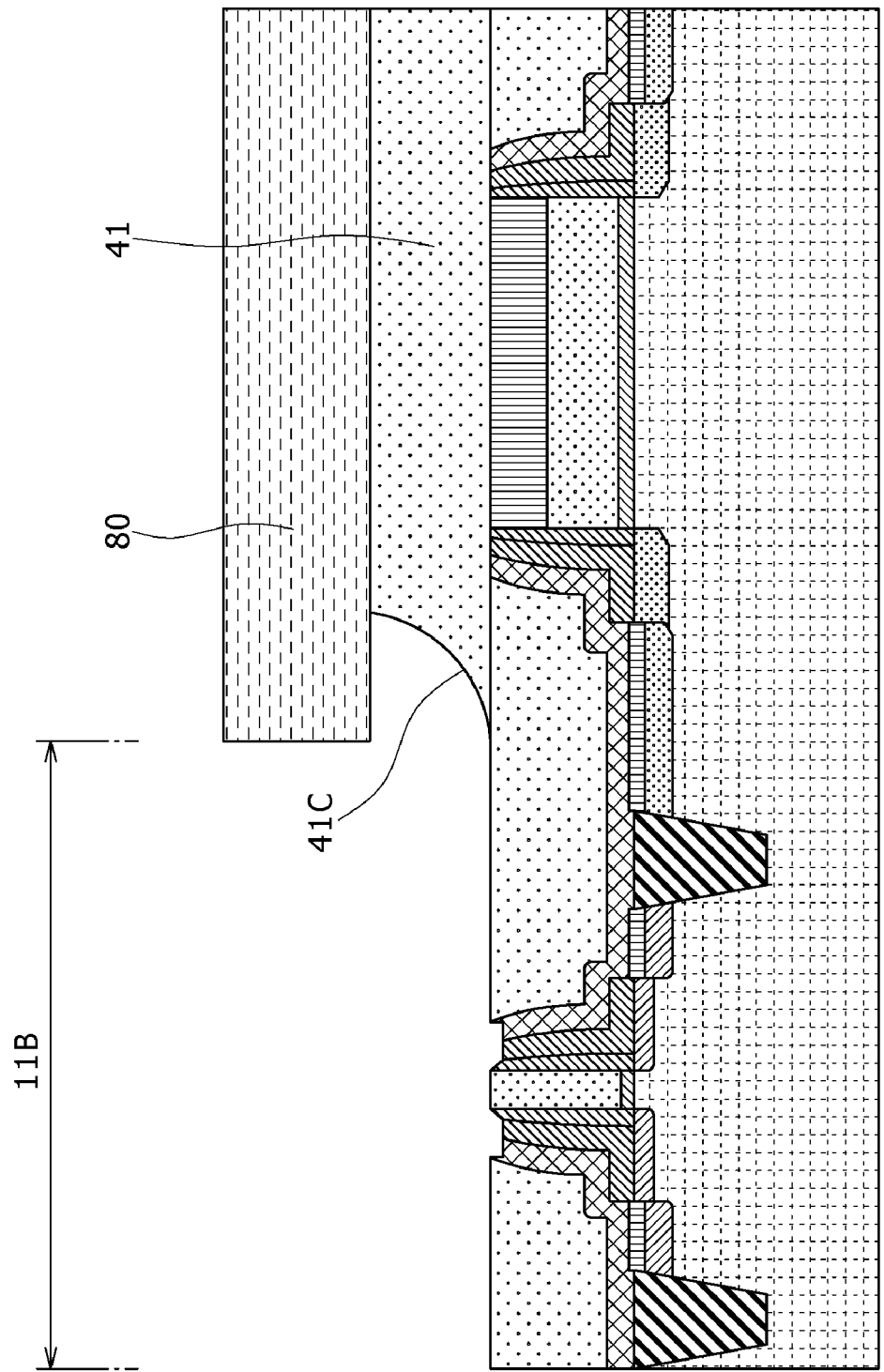

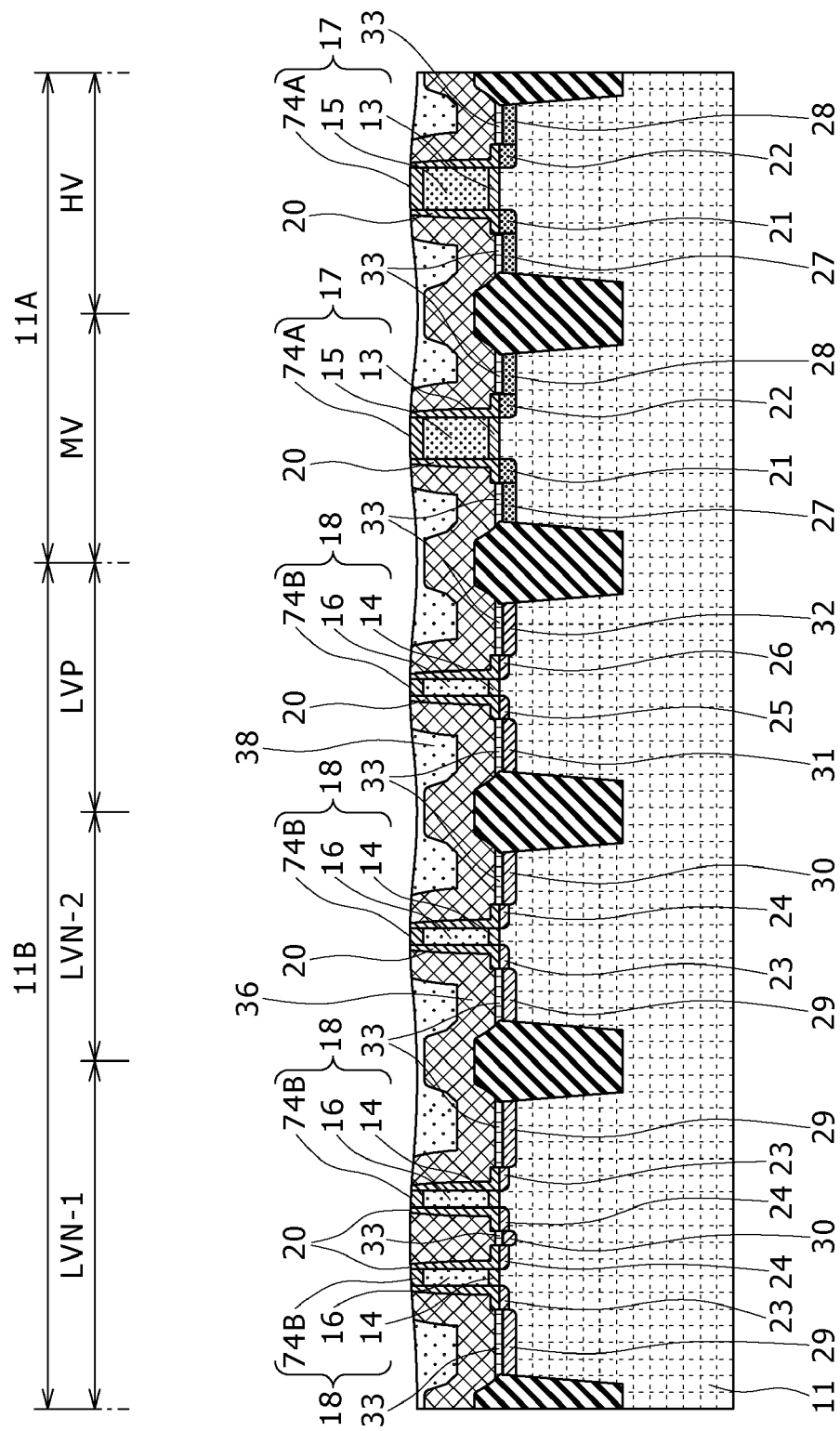

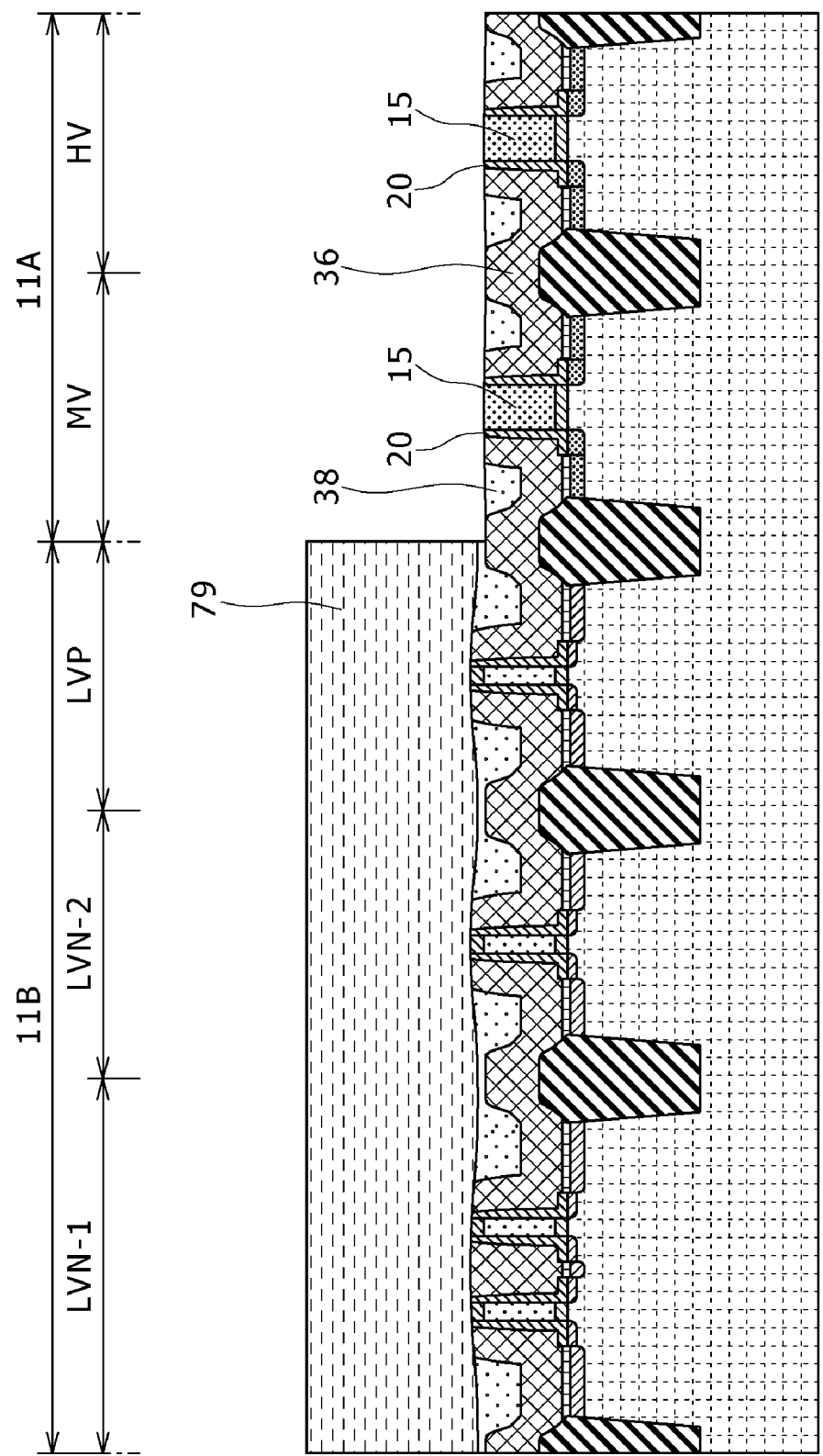

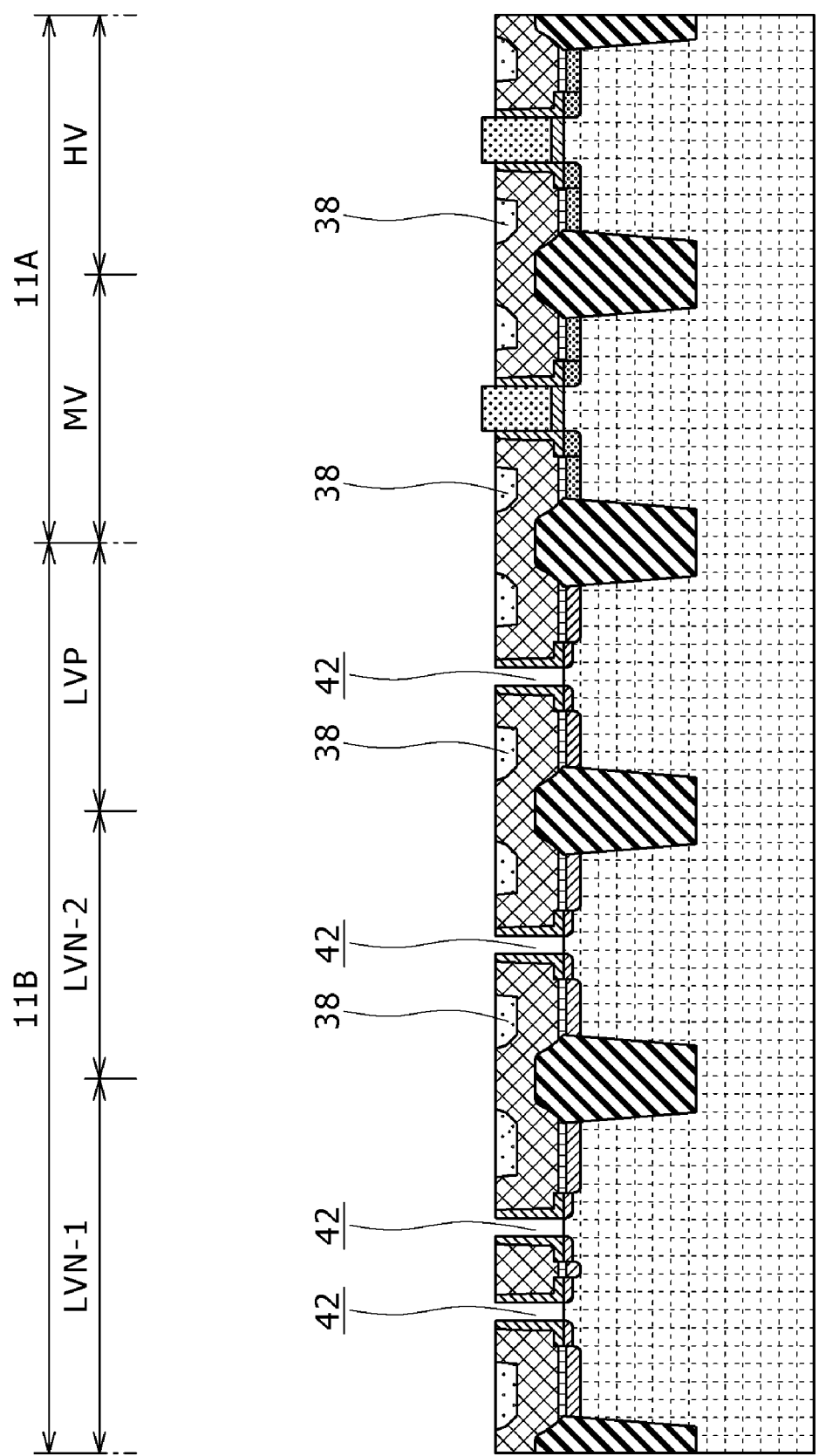

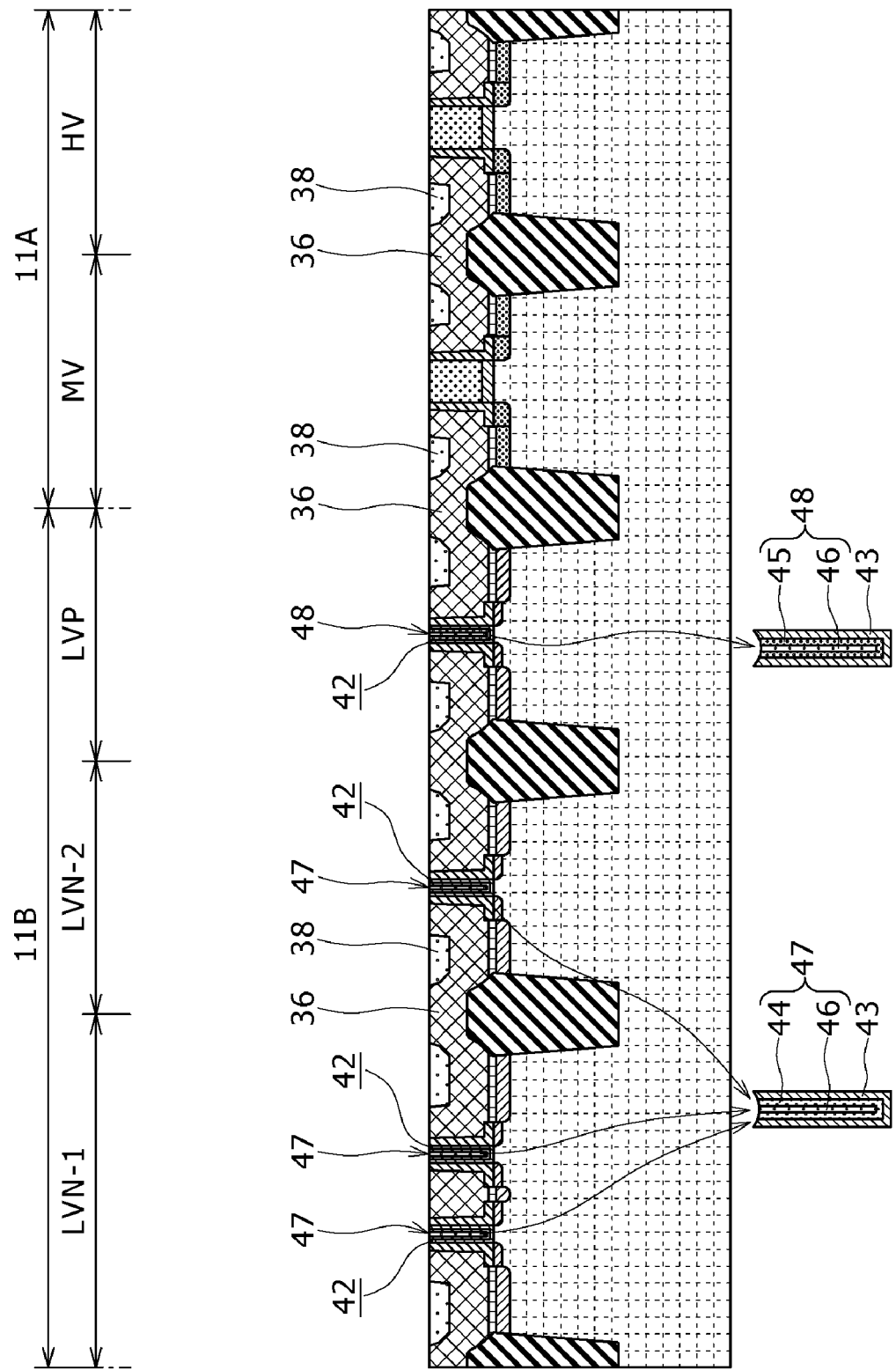

SEMICONDUCTOR DEVICE AND A METHOD OF MANUFACTURING THE SAME

RELATED APPLICATION DATA

This application is a division of U.S. patent application Ser. No. 12/168,427, filed Jul. 7, 2008, the entirety of which is incorporated herein by reference to the extent permitted by law. The present application claims priority to Japanese Patent Application No. JP 2007-179387 filed in the Japan Patent Office on Jul. 9, 2007, the entirety of which also is incorporated by reference herein to the extent permitted by law.

BACKGROUND OF THE INVENTION

The present invention relates to a semiconductor device in which transistors different in applied voltage from one another are embedded, and a method of manufacturing the same.

An increase in gate leakage current in silicon oxide system gate insulating film, and depletion in a polysilicon system gate electrode have become problems with promotion of high integration of MISFETs. As measures taken to cope with such problems, adoption of a gate stack structure having a gate insulating film having a higher permittivity larger than that of a silicon oxide, and a metallic gate (hereinafter referred to as "a high permittivity film/metallic gate") is discussed for high-speed operation and low-power consumption MIS type transistors. However, utilizing a normal manufacturing method results in that a heat history after the high permittivity film/metallic gate is formed is high. As a result, there is encountered such a problem that the characteristics and reliability of the high-permittivity insulating film are deteriorated, and a value of a work function of the metallic gate shifts from a design value.

In order to solve this problem, a buried gate (for example, a damascene gate) structure is proposed. This buried gate structure is obtained by completing a prime heat treatment process necessary for transistor formation before the high permittivity film/metallic gate is formed. The technique relating to this buried gate structure, for example, is described in Japanese Patent Laid-Open No. 2001-102443 (hereinafter referred to as Patent Document 1). A method of forming this buried gate structure when a metallic electrode, for example, is used is described as follows. That is to say, a gate insulating film and a gate electrode portion are removed once after a transistor structure having a silicon oxide system gate insulating film and a polysilicon system gate electrode is formed, and a metallic system oxide film and a metallic electrode are newly buried therein. According to this method, the metallic electrode is prevented from being deteriorated because the heat treatment necessary for the transistor formation is completed before the formation of the metallic electrode.

However, the high-speed operation and the low-power consumption are demanded for the actual semiconductor devices. For this reason, in order to meet these requirements, a transistor adopting the metallic system oxide film and the metallic electrode, and a transistor adopting an existing silicon oxide system gate insulating film and the polysilicon system gate electrode for the high-speed operation are mixedly formed in the actual semiconductor device. Therefore, the damascene gate structure having the high permittivity film/metallic gate for the high-speed operation and low-voltage operation, and a gate structure having a thicker gate insulating film showing a high withstand voltage have to be formed on the same semiconductor substrate of the same chip in the embedded manner.

Patent Document 1 discloses a method of manufacturing a transistor structure having a polysilicon gate electrode made of cobalt silicide and a gate insulating film formed from a silicon oxide film, and a damascene structure having a titanium nitride film and a tantalum oxide film. In addition, a method is also proposed in which a damascene gate electrode for a high-speed operation and low-voltage operation is formed to be higher than a polysilicon gate electrode for a high-withstand voltage operation in a damascene gate processing stage. Also, this method aims at preventing the polysilicon gate electrode from being polished when a metal is polished by utilizing a chemical mechanical polishing (CMP) method. This method, for example, is described in Japanese Patent Laid-Open No. 2004-6475 (hereinafter referred to as Patent Document 2).

In the case of the structure in which the low-voltage operation transistor (LV) having the damascene structure having the high-permittivity film/metallic gate for the high-speed and low-power consumption operation, and the high-withstand voltage (high-voltage operation) transistor (MV/HV) having the silicon oxide/polysilicon gate are integrated on one chip, it is disclosed to form a gate silicide layer of the high-withstand transistor before the formation of the low-voltage operation transistor. This, for example, is described in Patent Documents 1 and 2.

With the technique described in Patent Document 1, when a dummy polysilicon gate of the low-voltage operation transistor is removed, a cobalt silicide layer of the polysilicon gate of the high-withstand voltage transistor is used as a mask in order to prevent the polysilicon gate in the high-withstand voltage transistor region from being etched. However, there is still left such a problem that a gate resistance value increases because the cobalt silicide layer is trimmed.

On the other hand, as shown in the technique described in Patent Document 2, when an interlayer insulating film is polished by utilizing the CMP method, the central portion of the interlayer insulating film sags downward due to roughness and denseness of a density with which the gate is formed. As a result, there is caused such a problem that a metalized film formed by utilizing an electroless plating method is left in the resulting recess portion when the metallic film is subsequently polished by utilizing the CMP method. When the polishing is performed excessively for the purpose of preventing the metallic film from being left in the recess portion, the polysilicon gate is over-trimmed. In order to solve this problem, the method described in Patent Document 2 is proposed such that the damascene gate (replacement gate) of the low-voltage operation transistor is formed to be higher than the gate of the high-withstand voltage transistor in the stage of processing the dummy gate. However, it is not easy to suitably determine the processing conditions or the like for the dry etching of the dummy gate for the purpose of controlling a base step necessary for the lithography process in the phase of processing the dummy gate.

SUMMARY OF THE INVENTION

The problem to be solved is as follows. That is to say, in the semiconductor device having a group of transistors different in operating voltage from one another, for example, a group of low-voltage operation transistors, and a group of high-withstand voltage (high-voltage operation) transistors on the same semiconductor substrate, it is difficult to form the silicide layer for reduction of the resistance value of each of the gate electrodes in the group of high-withstand voltage transistors.

In the light of the foregoing, it is therefore desired to provide a semiconductor device which is capable of forming a group of low-voltage operation transistors, and a group of high-withstand voltage (high-voltage operation) transistors on the same semiconductor substrate, and reducing a resistance value of each of gate electrodes of the group of high-withstand voltage transistors, and a method of manufacturing the same.

In order to attain the desire described above, according to an embodiment of the present invention, there is provided a semiconductor device, including: a first group of transistors, and a second group of transistors each of which is lower in operating voltage than each of the transistors in the first group, the first group of transistors and the second group of transistors being formed on a semiconductor substrate. In the semiconductor device, each of the transistors in the first group includes a first gate electrode formed on the semiconductor substrate through a first gate insulating film, and a silicide layer formed on the first gate electrode; each of the transistors in the second group includes a second gate electrode formed in a trench for gate formation, formed in an insulating film above the semiconductor substrate, through a second gate insulating film; and a protective film is formed so as to cover the silicide layer on each of the first gate electrodes of the first group of transistors.

The semiconductor device according to the embodiment of the present invention includes the first group of transistors, and the second group of transistors each of which is lower in operating voltage than each of the transistors in the first group on the semiconductor substrate. In addition thereto, the protective film is formed so as to cover the silicide layer on each of the first gate electrodes of the first group of transistors. Therefore, the structure is adopted such that when the second gate electrodes of the second group of transistors are formed, the silicide layers of the first group of transistors are protected. As a result, the reduction or disappearance of the silicide layer is avoided, and thus the electrical resistance value of each of the second gate electrodes is reduced owing to the presence of the silicide layer.

According to another embodiment of the present invention, there is provided a semiconductor device, including: a first group of transistors, and a second group of transistors each of which is lower in operating voltage than each of the transistors in the first group, the first group of transistors and the second group of transistors being formed on a semiconductor substrate. In the semiconductor device, each of the transistors in the first group includes a first gate electrode formed on the semiconductor substrate through a first gate insulating film, and a silicide layer formed on the first gate electrode; each of the transistors in the second group includes a second gate electrode formed in a trench for gate formation, formed in an insulating film above the semiconductor substrate, through a second gate insulating film; each of the first gate electrodes of the first group of transistors is formed so as to be lower than each of the second gate electrodes of the second group of transistors; a protective film is formed so as to cover the silicide layer on each of the first gate electrodes of the first group of transistors; and a surface of the insulating film in a region having the second group of transistors formed therein, and a surface of the protective film are formed to have a flat surface-like shape.

The semiconductor device according to the another embodiment of the present invention includes the first group of transistors, and the second group of transistors each of which is lower in operating voltage than each of the transistors in the first group on the semiconductor substrate. In addition thereto, the protective film is formed so as to cover the silicide layer on each of the first gate electrodes of the first group of transistors. Therefore, the structure is adopted such that when the second gate electrodes of the second group of transistors are formed, the silicide layers of the first group of transistors are protected. As a result, the reduction or disappearance of the silicide layer is avoided, and thus the electrical resistance value of each of the first gate electrodes is reduced owing to the presence of the silicide layer. Also, the surface of the insulating film covering the first group of transistors, and the surface of the protective film are formed to have the flat surface-like shape. As a result, there is solved the problem that the conductive material used when the second gate electrodes are formed is left in the stepped portion.

According to still another embodiment of the present invention, there is provided a semiconductor device, including: a first group of transistors, and a second group of transistors each of which is lower in operating voltage than the transistors in the first group of transistors, the first group of transistors and the second group of transistors being formed on a semiconductor substrate. In the semiconductor device, each of the transistors in the first group includes a first gate electrode formed on the semiconductor substrate through a first gate insulating film, and a silicide layer formed on the first gate electrode; each of the transistors in the second group includes a second gate electrode formed in a trench for gate formation, formed in an insulating film above the semiconductor substrate, through a second gate insulating film; and a protective film is formed so as to cover each of the second gate electrodes of the second group of transistors.

The semiconductor device according to the still another embodiment of the present invention includes the first group of transistors, and the second group of transistors each of which is lower in operating voltage than each of the transistors in the first group on the semiconductor substrate. In addition thereto, the protective film is formed so as to cover each of the first gate electrodes of the second group of transistors. Therefore, when the silicide layer are formed on each of the first gate electrodes of the first group of transistors, even if each of the second gate electrodes of the second group of transistor, for example, is formed in the form of a metallic electrode, it is avoided to incur the damage on each of the second gate electrodes of the second group of transistor. Therefore, a structure is obtained in which after the second gate electrodes are formed, the silicide layers can be formed on the first gate electrodes, respectively. As a result, the electrical resistance value of each of the first gate electrodes is reduced owing to the presence of the silicide layer.

According to yet another embodiment of the present invention, there is provided a method of manufacturing a semiconductor device including a first group of transistors, and a second group of transistors each of which is lower in operating voltage than each of the transistors in the first group, the first group of transistors and the second group of transistors being formed on a semiconductor substrate, each of the transistors in the first group having a first gate electrode formed on the semiconductor substrate through corresponding one of first gate insulating films, and a silicide layer formed on corresponding one of the first gate electrodes, each of the transistors in the second group having a second gate electrode formed in a trench for gate formation, formed in an insulating film above the semiconductor substrate, through corresponding one of second gate insulating films. The manufacturing method includes the steps of: forming a protective film for covering the silicide layer after the silicide layer is formed on each of the first gate electrodes of the first group of transistors;

and forming the second gate electrodes in the trenches for gate formation through the second gate insulating films, respectively.

With the method of manufacturing a semiconductor device according to the yet another embodiment of the present invention, the first group of transistors, and the second group of transistors each of which is lower in operating voltage than each of the transistors in the first group are formed on the semiconductor substrate. In addition thereto, the second gate electrodes of the second group of transistors are formed after formation of the protective film for covering the silicide layer on each of the first gate electrodes of the first group of transistors. Therefore, when the second gate electrodes are formed, for example, even if the polishing is performed for the purpose of removing an extra portion of a metallic material constituting each of the second gate electrodes, the slimming or disappearance of the silicide layer on each of the first gate electrodes is avoided owing to the presence of the protective film. Thus, the silicide layer of each of the transistors in the first group is protected. As a result, the electrical resistance value of each of the first gate electrodes is reduced owing to the presence of the silicide layers.

According to a further embodiment of the present invention, there is provided a method of manufacturing a semiconductor device including a first group of transistors, and a second group of transistors each of which is lower in operating voltage than each of the transistors ion the first group, the first group of transistors and the second group of transistors being formed on a semiconductor substrate, each of the transistors in the first group having a first gate electrode formed on the semiconductor substrate through corresponding one of first gate insulating films, and a silicide layer formed on corresponding one of the first gate electrodes, each of the transistors in the second group having a second gate electrode formed in a trench for gate formation, formed in an insulating film above the semiconductor substrate, through corresponding one of second gate insulating films. The manufacturing method includes the steps of: forming the silicide layer on each of the first gate electrodes after each of the first gate electrodes of the first group of transistors is formed so as to be lower than each of the second gate electrodes of the second group of transistors by removing an upper portion of the insulating film and upper portions of the first gate electrodes of the first group of transistors; forming a protective film for covering each of the silicide layers so that a surface of the insulating film in a region having the trenches for gate formation formed therein, and a surface of the protective film are formed to have a flat surface-like shape; and filling a conductive material in each of the trenches for gate formation formed by removing the second gate electrodes and the second gate insulating films of the second group of transistors through corresponding one of the second insulating films, thereby forming the second gate electrodes of the second group of transistors.

With the method of manufacturing a semiconductor device according to the further embodiment of the present invention, the first group of transistors, and the second group of transistors each of which is lower in operating voltage than each of the transistors in the first group are formed on the semiconductor substrate. In addition thereto, after formation of the protective film for covering the silicide layer on each of the first gate electrodes of the first group of transistors, the conductive material is filled in each of the trenches for gate formation through the corresponding one of the gate insulating films, thereby forming the second gate electrodes of the second group of transistors. Therefore, the slimming or disappearance of the silicide layer on each of the first gate electrodes of the first group of transistors is avoided in the process for removing the extra conductive material at that time. As a result, the electrical resistance value of each of the first gate electrodes is reduced owing to the presence of the silicide layer. In addition thereto, the first gate electrodes of the first group of transistors are formed so as to be lower than the second gate electrodes of the second group of transistors before formation of the protective film by removing the upper portion of the interlayer insulating film, and the upper portions of the first gate electrodes in the first group of transistors. Thus, even when the silicide layer is formed on each of the first gate electrodes of the first group of transistors, the silicide layer is formed so as to be lower than each of the second gate electrodes of the second group of transistors. As a result, in the phase of forming the protective film, even when the surface of the insulating film in the region having the trenches for gate formation formed therein, and the surface of the protective film are formed to have the flat surface-like shape, the silicide layer on each of the first gate electrodes of the first group of transistors is protected because it is covered with the protective film. In addition, the surface of the insulating film in the region having the second group of transistors formed therein, and the surface of the protective film are formed to have the flat surface-like shape. As a result, there is solved the problem that the conductive material used when the second gate electrodes are formed is left in the stepped portion.

According to an even further embodiment of the present invention, there is provided a method of manufacturing a semiconductor device including a first group of transistors, and a second group of transistors each of which is lower in operating voltage than each of the transistors in the first group, the first group of transistors and the second group of transistors being formed on a semiconductor substrate, each of the transistors in the first group having a first gate electrode formed on the semiconductor substrate through corresponding one of first gate insulating films, and a silicide layer formed on corresponding one of the first gate electrodes, each of the transistors in the second group having a second gate electrode formed in a trench for gate formation, formed in an insulating film above the semiconductor substrate, through corresponding one of second gate insulating films. The manufacturing method includes the step of forming a protective film for covering each of the second gate electrodes of the second group of transistors after the second gate electrodes of the second group of transistors are formed, and forming the silicide layer on each of the first gate electrodes of the first group of transistors.

With the method of manufacturing a semiconductor device according to the even further embodiment of the present invention, the first group of transistors, and the second group of transistors each of which is lower in operating voltage than each of the transistors in the first group are formed on the semiconductor substrate. In addition thereto, since the silicide layer is formed on each of the first gate electrodes after the second gate electrodes are formed, the electrical resistance value of each of the first gate electrodes is reduced owing to the presence of the silicide layer. Also, the protective film for covering each of the second gate electrodes of the second group of transistors is formed before the silicide layer is formed on each of the first gate electrodes of the first group of transistors. As a result, each of the second gate electrodes of the second group of transistors is protected when the silicide layers are formed.

According to the semiconductor device of the embodiment of the present invention, there is obtained an advantage that the first group of transistors (the group of high-withstand voltage (high-voltage operation) transistors), and the second group of transistors (for example, the group of low-voltage operation transistors) are formed on the same semiconductor substrate, thereby making it possible to reduce the electrical resistance value of each of the first gate electrodes of the first group of transistors.

According to the semiconductor device of the another embodiment of the present invention, there is obtained an advantage that the first group of transistors (the group of high-withstand voltage (high-voltage operation) transistors), and the second group of transistors (for example, the group of low-voltage operation transistors) are formed on the same semiconductor substrate, thereby making it possible to reduce the electrical resistance value of each of the first gate electrodes of the first group of transistors. In addition, the surface of the insulating film for covering the first group of transistors, and the surface of the protective film are formed to have the flat surface-like shape. As a result, it is possible to solve the problem that the conductive material is left in the stepped portion of the protective film, which results in that it is possible to avoid the problem about the short-circuit occurring between the wirings, and the like.

According to the semiconductor device of the still another embodiment of the present invention, there is obtained an advantage that the first group of transistors (the group of high-withstand voltage (high-voltage operation) transistors), and the second group of transistors (for example, the group of low-voltage operation transistors) are formed on the same semiconductor substrate, thereby making it possible to reduce the electrical resistance value of each of the second gate electrodes of the second group of transistors.

According to the method of manufacturing a semiconductor device of the yet another embodiment of the present invention, there is obtained an advantage that the first group of transistors (the group of high-withstand voltage (high-voltage operation) transistors), and the second group of transistors (for example, the group of low-voltage operation transistors) are formed on the same semiconductor substrate, thereby making it possible to reduce the electrical resistance value of each of the first gate electrodes of the first group of transistors.

According to the method of manufacturing a semiconductor device of the further another embodiment of the present invention, there is obtained an advantage that the first group of transistors (the group of high-withstand voltage (high-voltage operation) transistors), and the second group of transistors (for example, the group of low-voltage operation transistors) are formed on the same semiconductor substrate, thereby making it possible to reduce the electrical resistance value of each of the first gate electrodes of the first group of transistors.

According to the method of manufacturing a semiconductor device of the even further another embodiment of the present invention, there is obtained an advantage that the first group of transistors (the group of high-withstand voltage (high-voltage operation) transistors), and the second group of transistors (for example, the group of low-voltage operation transistors) are formed on the same semiconductor substrate, thereby making it possible to reduce the electrical resistance value of each of the first gate electrodes of the first group of transistors.

BRIEF DESCRIPTION OF THE DRAWINGS

FIGS. 6A to 6K are respectively cross sectional views showing manufacturing processes in a method of manufacturing the semiconductor device according to a second embodiment of the present invention;

FIG. 7A is a cross sectional view showing a change of the method of manufacturing the semiconductor device according to the second embodiment of the present invention;

FIG. 7B is a cross sectional view showing the change of the method of manufacturing the semiconductor device according to the second embodiment of the present invention;

FIGS. 10A to 10J are respectively cross sectional views showing manufacturing processes in a method of manufacturing the semiconductor device according to a third embodiment of the present invention;

FIGS. 13A to 13L are respectively cross sectional views showing manufacturing processes in a method of manufacturing the semiconductor device according to a fourth embodiment of the present invention.

DETAILED DESCRIPTION OF THE PREFERRED EMBODIMENTS

A semiconductor device according to a first embodiment of the present invention will be described in detail hereinafter with reference to a schematically structural cross sectional view of FIGS. 1, 2A and 2B.

Figure 1:
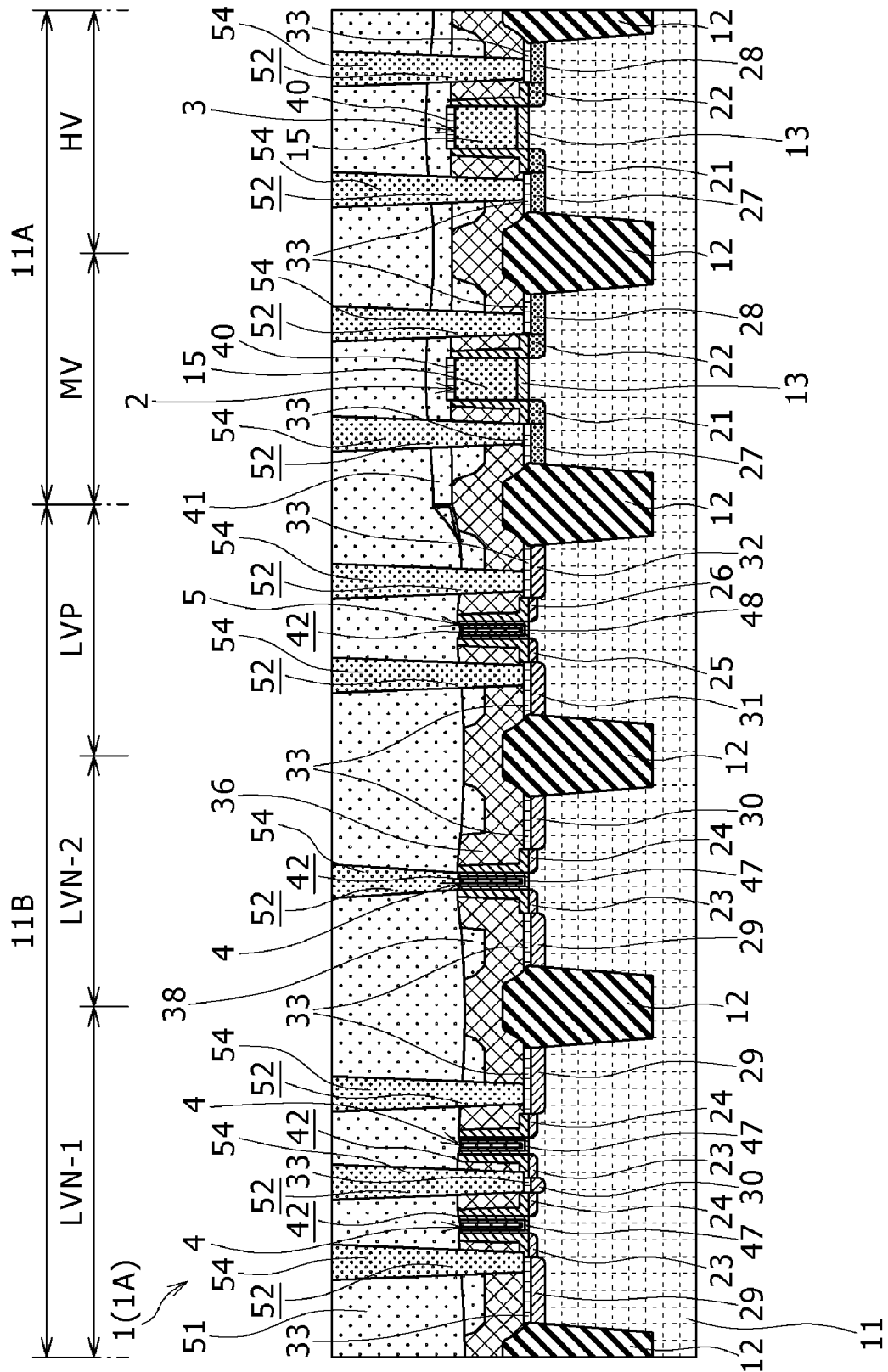
FIG. 1 is a cross sectional view schematically showing a structure of a semiconductor device according to a first embodiment of the present invention.
Figure 2A:
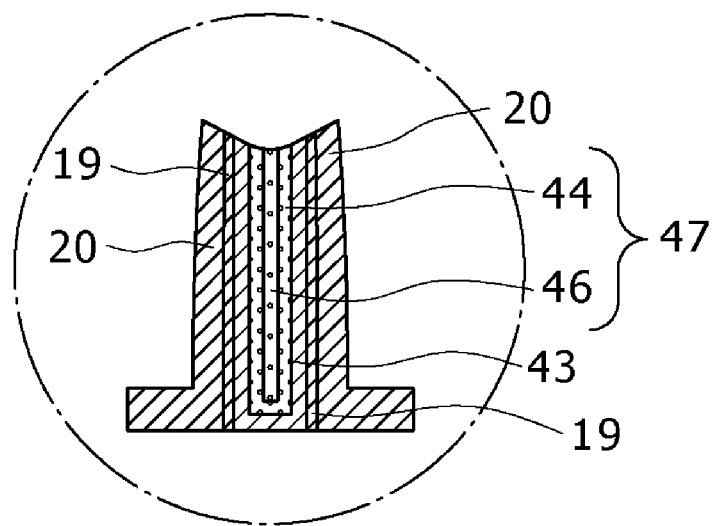
FIGS. 2A and 2B are respectively enlarged sectional views of the semiconductor device shown in FIG. 1.
Figure 2B:
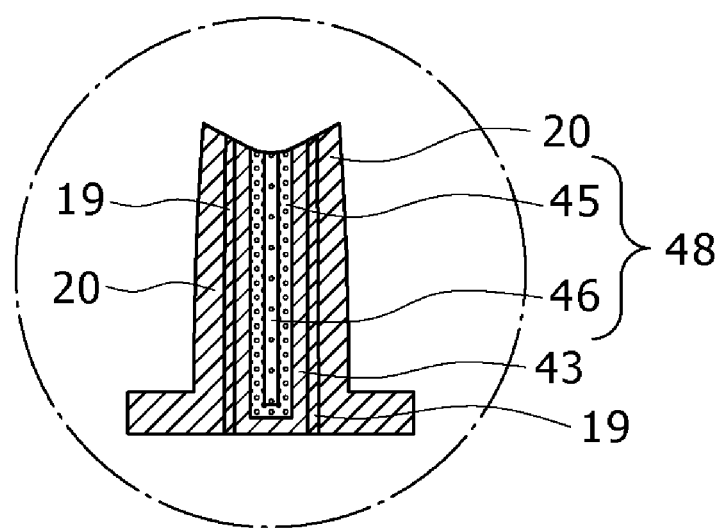

As shown in FIGS. 1, 2A and 2B, isolation regions 12 are formed in a semiconductor substrate 11. In this case, as an example, a region LVN-1, a region LVN-2, and a region LVP which have low-voltage transistors (such as MISFETs) formed therein, respectively, a region MV having a middle-voltage transistor (such as a MISFET) formed therein, and a region HV having a high-voltage transistor (such as a MISFET) formed therein are isolated by these isolation regions 12. Each of the regions MV and HV includes a region having an isolated pattern as well as a region in which a pattern density of the MISFET is dense. In addition, both the region HV as the formation region of the high-voltage transistor, and the region MV as the formation region of the middle-voltage transistor are given a generic name of a first region 11A. Also, the region LVN-1 in which the N-channel MISFETs as the low-voltage transistors are densely formed, the region LVN-2 in which the N-channel MISFET as the low-voltage transistor is formed in isolation, and the region LVP in which the P-channel MISFET as the low-voltage transistor is formed are given as a generic name of a second region 11B.

In addition, in this specification, in each of the embodiments which will be described below, as an example, the low-voltage transistor means a transistor having an operating voltage lower than 1.5 V, the middle-voltage transistor means a transistor having an operating voltage equal to or higher than 1.5 V and lower than 3.3 V, and the high-voltage (high-withstand voltage) transistor means a transistor having an operating voltage equal to or higher than 3.3 V.

In addition, an ion implantation for forming a P-type well region (not shown), an ion implantation for forming a buried layer (not shown) for blocking punch-through of a MISFET, and an ion implantation for adjusting a threshold voltage (Vth) are suitably performed for a region in which an N-channel MISFET is intended to be formed. As a result, an NMIS channel region is formed. In addition, an ion implantation for forming an N-type well region (not shown), an ion implantation for forming a buried layer (not shown) for blocking punch-through of a MISFET, and an ion implantation for adjusting a threshold voltage (Vth) are suitably performed for a region in which a P-channel MISFET is intended to be formed. As a result, a PMIS channel region is formed. It is noted that channel regions may be formed in the region HV having the high-voltage transistor formed therein, the region MV having the middle-voltage transistor formed therein, and the region LVN-1, the region LVN-2, and the region LVP which have the respective low-voltage transistors formed therein, respectively.

Gate insulating films 13 are formed on surfaces of the region HV and the region MV in the semiconductor substrate 11, respectively. The high-voltage transistor and the middle-voltage transistor have thick gate insulating films, respectively, in many cases. Each of the gate insulating films 13, for example, is formed from a silicon oxide film, and is also formed to have a thickness of 2 to 4 nm. First gate electrodes 15 are formed on the gate insulating films 13, respectively. Each of the first gate electrodes 15, for example, is made of polysilicon or amorphous silicon, and has a thickness of 100 to 150 nm.

Dummy gate insulating films and dummy gate electrodes (not shown) are temporarily formed on the region LVN-1, the region LVN-2, and the region LVP in the semiconductor substrate 11, respectively. Also, offset spacers 19 are formed on each of sidewalls of the dummy gate electrodes, and each of the sidewalls of the first gate electrodes 15, respectively. A thickness of each of the offset spacers 19, for example, is in the range of 6 to 10 nm.

Also, extension regions 21 and 22 of the N-channel MISFET are formed on a surface side of the semiconductor substrate 11 and below both sides of each of the first gate electrodes 15, respectively. In addition, extension regions 23 and 24 of the N-channel MISFET are formed on the surface side of the semiconductor substrate 11 and below both sides of each of the dummy gate electrodes of the region LVN-1 and the region LVN-2, respectively. Moreover, extension regions 25 and 26 of the P-channel MISFET are formed on the surface side of the semiconductor substrate 11 and below both sides of the dummy gate electrode of the region LVP, respectively.

Moreover, sidewalls 20 are formed on side portions of each of the first gate electrodes 15, and each of the dummy gate electrodes through the offset spacers 19, respectively.

Also, source/drain regions 27 and 28 are formed on the surface side of the semiconductor substrate 11 and below the both sides of each of the first gate electrodes 15 through the corresponding ones of the extension regions 21 and 22, respectively. In addition, source/drain regions 29 and 30 are formed on the surface side of the semiconductor substrate 11 and below the both sides of each of the dummy gate electrodes of the region LVN-1 and the region LVN-2 through the corresponding ones of the extension regions 23 and 24 of the N-channel MISFETs, respectively. Also, source/drain regions 31 and 32 are formed on the surface side of the semiconductor substrate 11 and below the both sides of the dummy gate electrode of the region LVP through the extension regions 25 and 26 of the P-channel MISFET, respectively.

A silicide layer 33 is formed on each of the source/drain regions 27 to 32. The silicide layer 33, for example, is made of cobalt silicide ($CoSi_2$), nickel silicide ($NiSi_2$), nickel platinum silicide, or the like.

Also, an insulating film is formed so as to partially cover the first gate electrodes 15, the dummy gate electrodes, and the like. The insulating film is composed of a liner film 36 formed over the entire surface of the semiconductor substrate 11, and a first interlayer insulating film 38 formed on the liner film 36.

The liner film 36, for example, is formed from a silicon nitride (SiN) film, and serves to apply a stress to corresponding one of channel portions of the transistors. For example, the liner film having a tensile stress is used in the N-channel MISFET for the purpose of increasing a mobility in a channel. Also, the liner film having a compressive stress is used in the P-channel MISFET for the purpose of increasing a mobility in a channel. In addition, the liner films 36 may be individually formed for the N-channel MISFET and the P-channel MISFET, respectively. Also, the stress applied by the liner film 36 can be normally determined depending on the film deposition conditions.

The first interlayer insulating film 38, for example, is formed from a silicon oxide ($SiO_2$) film formed by utilizing a high density plasma (HDP) CVD method. Also, surfaces of the first interlayer insulating film 38 and the liner film 36 are planarized so as to expose each of upper surfaces of the first gate electrodes 15.

A silicide layer 40 is formed on each of upper surfaces of the first gate electrodes 15. The silicide layer 40, for example, is made of cobalt silicide ($CoSi_2$), nickel silicide ($NiSi_2$), nickel platinum silicide or the like.

A protective film 41 for protecting the silicide layer 40 is formed so as to overlie the surfaces of the first interlayer insulating film 38 and the liner film 36 in the first region 11A. The protective film 41, for example, is formed from either a silicon oxide ($SiO_2$) film or a silicon nitride (SiN) film formed by utilizing a plasma CVD method. A film deposition temperature in the plasma CVD process at that time is set at 450° C. or less. As a result, damage is prevented from being incurred on each of the silicide layers 33 and 40 which are previously formed.

Trenches 42 for gate formation are formed so as to extend completely through the first interlayer insulating film 38 and the liner film 36 in the second region 11B by removing the dummy gate electrodes and the dummy gate insulating films.

A second gate insulating film 43 is formed on each of inner surfaces of the trenches 42 for gate formation. The second gate insulating film 43 is formed so that a capacity per unit area obtained based on the second gate insulating film 43 is smaller than that obtained based on each of the first gate insulating films 13 in the first region 11A. The second gate insulating film 43 is formed from a high-permittivity film. The high-permittivity film, for example, is made of an oxide, an oxysilicate, an oxynitride or a silicon oxynitride of hafnium, zirconium, lanthanum, yttrium, tantalum or aluminum. Specifically, the high-permittivity film, for example, is made of a hafnium oxide ($HfO_2$), a zirconium oxide ($ZrO_2$), a lanthanum oxide ($LaO_3$), a yttrium oxide ($Y_2O_3$), a tantalum oxide ($Ta_2O_5$), an aluminum oxide ($Al_2O_3$), a hafnium silicate ($HfSiO_x$), a zirconium silicate ($ZrSiO_x$), a lanthanum silicate ($LaSiO_x$), a yttrium silicate ($YSiO_x$), a tantalum silicate ($TaSiO_x$), an aluminum silicate ($AlSiO_x$), a zirconium titanate ($ZrTiO_x$), a hafnium aluminum oxide ($HfAlO_x$), or a hafnium zirconium oxide ($HfZrO_x$). Or, the high-permittivity film is made of a nitride of any of these compounds. For example, as a silicon oxynitride, there are nitrides of the metallic silicate described above such as a hafnium silicon oxynitride (HfSiON) or a zirconium silicon oxynitride (ZrSiON). A relative permittivity of the high-permittivity film fluctuates depending on a composition, a state (crystalline or amorphous), and the like. However, in general, the relative permittivity of the hafnium oxide ($HfO_2$) is in the range of 25 to 30, and the relative permittivity of the zirconium oxide ($ZrO_2$) is in the range of 20 to 25.

In addition, work function controlling films 44 and 45 for determining work functions are formed on the inner surfaces of the trenches 42 for gate formation through the second gate insulating films 43, respectively. Normally, the work function controlling film has the work function of 4.6 eV or less, preferably, 4.3 eV or less in the gate electrode of the N-channel MISFET. On the other hand, the work function controlling film has the work function of 4.6 eV or more, preferably, 4.9 eV or more in the gate electrode of the P-channel MISFET. Also, a difference between these work functions is preferably equal to or larger than 0.3 eV. Specifically, although fluctuating depending on the composition, the state (crystalline or amorphous) and the like, the work function of a hafnium silicide ($HfSi_x$) for the N-channel MISFET is in the range of about 4.1 to about 4.3 eV, and the work function of a titanium nitride (TiN) for the P-channel MISFET is in the range of about 4.5 to about 5.0 eV. As an example of the material for each of the work function controlling films 44 and 45 described above, there is a metal such as titanium (Ti), vanadium (V), nickel (Ni), zirconium (Zr), a niobium (Nb), molybdenum (Mo), ruthenium (Ru), hafnium (Hf), tantalum (Ta), tungsten (W) or platinum (Pt), an alloy thereof, or a compound thereof. As the metallic compound, there is a metallic nitride, or a compound of a metal and a semiconductor. Also, with regard to the compound of a metal and a semiconductor, as an example, there is a metallic silicide.

The work function controlling film 44 made of a metal or a metallic compound having the work function suitable for the N-channel MISFET is formed in each of the trenches 42 for gate formation in the region LVN-1, and the region LVN-2. For the material for the work function controlling film 44, as an example, there is a metal such as hafnium (Hf) or tantalum (Ta), an alloy thereof, or a compound thereof. Specifically, a hafnium silicide (HfSix) is more preferable for the work function controlling film 44.

In addition, the work function controlling film 45 made of a metal or a metallic compound having the work function suitable for the P-channel MISFET is formed in the trench 42 for gate formation in the region LVP. For the material for the work function controlling film 45, as an example, there is a metal such as titanium (Ti), molybdenum (Mo) or ruthenium (Ru), an alloy thereof, or a compound thereof. Specifically, a titanium nitride (TiN) or ruthenium (Ru) is more preferable for the work function controlling film 45.

Moreover, a conductive film 46 is formed as a conductive material so as to be filled in each of the insides of the trenches 42 for gate formation. A metallic material having an electrical resistance value lower than that of each of the work function controlling films 44 and 45, for example, is used for the conductive film 46. In this embodiment, tungsten (W) is used as an example of the metallic material.

As described above, the second gate electrode 47 of each of the low-voltage transistors (N-channel MISFETs) in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) in the second region 11B is formed from the conductive film 46 and the work function controlling film 45 which are left in the corresponding one of the trenches 42 for gate formation.

A second interlayer insulating film 51 is formed over all the surfaces of the liner film 36, the first interlayer insulating film 38, and the protective film 41. The second interlayer insulating film 51, for example, is formed from a silicon oxide ($SiO_2$) film.

Connection holes 52 to the first gate electrodes 15, the second gate electrodes 47 and 48, and the source/drain regions 27 to 32 of the transistors are formed so as to extend completely through the liner film 36, the first interlayer insulating film 38, the protective film 41, and the second interlayer film 51. Also, electrodes 54 each being made from a conductive film are formed so as to be filled in the connection holes 52, respectively.

As has been described, the middle-voltage voltage transistor (N-channel MISFET) 2 is formed in the region MV of the first region 11A, and the high-voltage transistor (N-channel MISFET) 3 is formed in the region HV thereof. Also, the low-voltage transistors (N-channel MISFETs) 4 are densely formed in the region LVN-1 of the second region 11B, the low-voltage transistor (N-channel MISFET) 4 is formed in isolation in the region LVN-2 thereof, and the low-voltage transistor (P-channel MISFET) 5 is formed in the region LVP thereof. In such a manner, the semiconductor device 1(1A) is formed.

In the semiconductor device 1(1A), described above, according to the first embodiment of the present invention, the middle-voltage transistor (N-channel MISFET) 2, and the high-voltage transistor (N-channel MISFET) 3 are formed as a first group of transistors in the region MV and the region HV, respectively, on the semiconductor substrate 11. In addition, the low-voltage transistors (N-channel MISFETs) 4, the low-voltage transistor (N-channel MISFET) 4, and the low-voltage transistor (P-channel MISFET) 5 are formed as a second group of transistors each having the lower operating voltage than that of each of the transistors in the first group in the region MV and region HV, respectively, on the semiconductor substrate 11. In addition thereto, the protective film 41 is formed so as to cover the silicide layer 40 formed on each of the first gate electrodes 15 of the first group of transistors. Therefore, during formation of the second gate electrodes 47 and 48 of the second group of transistors, for example, even when the polishing is performed to remove the extra portions of the metallic materials of which the second gate electrodes 47 and 48 are made, respectively, the slimming or disappearance of the silicide layer 40 formed on each of the first gate electrodes 15 is avoided owing to the presence of the protective film 41. As a result, the silicide layer 40 of the first group of transistors is protected. Therefore, an electrical resistance value of each of the first gate electrodes 15 can be reduced owing to the presence of the silicide layer 40.

A method of manufacturing the semiconductor device according to a first embodiment of the present invention will be described in detail with reference to cross sectional views, showing manufacturing processes, of FIGS. 3A to 3Y. The manufacturing method according to the first embodiment of the present invention is an example of a method of manufacturing the semiconductor device 1(1A) described above.

As shown in FIG. 3A, isolation regions 12 are formed in the semiconductor substrate 11 by performing an isolation process. The isolation regions 12 are formed for the purpose of, for example, isolating the region LVN-1, the region LVN-2 and the region LVP in which the low-voltage transistors (for example, the MISFETs) are formed, respectively, the region MV in which the middle-voltage transistor (for example, the MISFET) is formed, and the region HV in which the high-voltage transistor (for example, the MISFET) is formed from one another. Each of the regions MV and HV includes the region having the isolated pattern as well as the region in which the pattern density of the MISFET is dense. Also, the region HV in which the high-voltage transistor is intended to be formed, and the region MV in which the middle-voltage transistor is intended to be formed are given the generic name of the first region 11A. Also, the region LVN-1 in which the N-channel MISFETs as the low-voltage transistors are densely formed, the region LVN-2 in which the N-channel MISFET as the low-voltage transistor is formed in isolation, and the region LVP in which the P-channel MISFET as the low-voltage transistor is formed are given as the generic name of the second region 11B.

Hereinafter, a description will be given with respect to an example in which the isolation regions 12 are formed.

A silicon semiconductor substrate is used as the semiconductor substrate 11 described above. A silicon oxide ($SiO_2$) film and a silicon nitride (SiN) film are deposited in order on the semiconductor substrate 11. The silicon oxide ($SiO_2$) film is formed by, for example, utilizing a dry oxidation method. Also, the silicon nitride (SiN) film is formed by, for example, utilizing a LP-CVD method.

Next, resist patterning is performed for portions in which active regions are intended to be formed. Then, the silicon nitride film, the silicon oxide film, and the semiconductor substrate 11 are selectively etched in order with the resulting resist pattern as a mask, thereby forming the trenches (trench regions). At this time, the semiconductor substrate 11, for example, is selectively etched to a depth of 200 to 400 nm, thereby forming the trenches. Portions of the semiconductor substrate 22 under regions in each of which the silicon nitride film is left become the active regions, respectively. Also, field oxide films are formed in the trench portions thereby obtaining the isolation regions 12, respectively.

The field oxide films are formed by filling a silicon oxide ($SiO_2$) in each of the insides of the trenches, respectively. In this case, the filling-in process is carried out by, for example, utilizing an HDP-CVD method (a film deposition temperature, for example, is set in the range of 650 to 700° C.). As a result, it is possible to form the dense silicon oxide ($SiO_2$) film which is excellent in step coverage. It is noted that before the silicon oxide film is filled in each of the trenches, a silicon oxide film may be formed on each of inner surfaces of the trenches by utilizing a thermal oxidation method.

Subsequently, the deposited extra silicon oxide film is polished by utilizing a CMP method, thereby performing the planarization. This polishing for planarization is carried out to the extent that the silicon oxide film formed on the silicon nitride film can be removed. In addition, in order to reduce a global step, it is also possible to previously remove the silicon oxide film on each of the wide active regions by utilizing a lithography patterning method and a suitable etching method.

Next, the silicon nitride film is removed. This process for removing the silicon nitride film is performed by, for example, utilizing a wet etching method using a hot phosphoric acid. In such a manner, regions of the semiconductor substrate 11 isolated from one another by the isolation regions 12 become the active regions, respectively.

In addition, for densification of the silicon oxide ($SiO_2$) film, and rounding of each of the active region corner portions before the peeling-off of the silicon nitride (SiN) film, there may also be adopted a method of performing anneal in nitrogen gas ($N_2$) or oxygen gas ($O_2$), or in mixed gas of hydrogen gas ($H_2$) and oxygen gas ($O_2$). Subsequently, each of surfaces of the active regions is oxidized to form a silicon oxide film having a thickness of, for example, 8 to 10 nm.

Next, the ion implantation for forming the P-type well region (not shown), the ion implantation for forming the buried layer (not shown) for blocking punch-through of the MISFET, and the ion implantation for adjusting the threshold voltage (Vth) are suitably performed for the region in which the N-channel MISFET is intended to be formed. As a result, the NMIS channel region is formed. In addition, the ion implantation for forming the N-type well region (not shown), the ion implantation for forming the buried layer (not shown) for blocking punch-through of the MISFET, and the ion implantation for adjusting the threshold voltage (Vth) are suitably performed for the region in which the P-channel MISFET is intended to be formed. As a result, a PMIS channel region is formed. At this time, the ion implantations may be carried out for the region HV having the high-voltage transistor formed therein, the region MV having the middle-voltage transistor formed therein, and the region LVN-1, the region LVN-2, and the region LVP which have the low-voltage transistors formed therein under the respective ion implantation conditions.

Next, as shown in FIG. 3B, the gate insulating films 13 are formed on a surface of the region HV, and a surface of the region MV in the semiconductor substrate 11, respectively. The high-voltage transistor and the middle-voltage transistor have the thick first gate insulating films, respectively, in many cases. Each of the gate insulating films 13, for example, is formed from a silicon oxide film. This silicon oxide film, for example, is formed at 750 to 900° C. by utilizing a thermal oxidation method, and has a thickness of 2 to 4 nm. Although the first gate insulating films 13 are formed in the active regions of the second region 11B, respectively, concurrently with formation of the gate insulating films 13 in the first region 11A, they are used as dummy gate insulating films 14 in the second region 11B, respectively.

Next, a gate forming process is carried out. As shown in FIG. 3C, firstly, an electrode formation film 71 for formation of the first gate electrodes 15 and the dummy gate electrodes is formed over the gate insulating films 13 and the dummy gate insulating films 14. The electrode formation film 71, for example, is formed by depositing a polysilicon or amorphous silicon layer over the entire surface through the gate insulating films 13 and the dummy gate insulating films 14 on the semiconductor substrate 11. For example, when the electrode formation film 71 is made of polysilicon, a polysilicon layer, for example, is deposited to have a thickness of 100 to 150 nm at a film deposition temperature of 580 to 620° C. by using monosilane ($SiH_4$) gas as a raw material gas by utilizing the LP-CVD method.

Figure 3D:
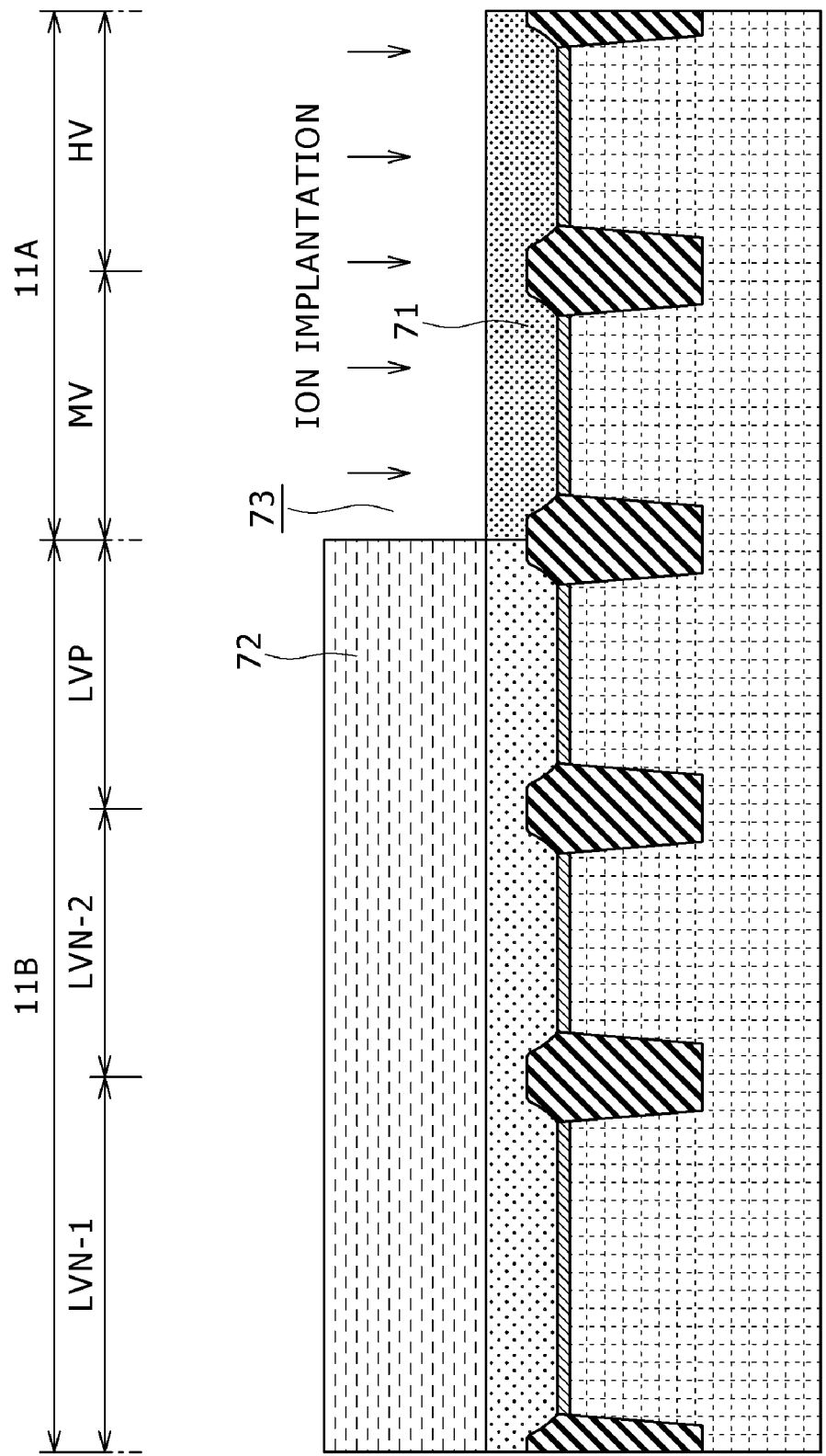
FIGS. 3A to 3Y are respectively cross sectional views showing manufacturing processes in a method of manufacturing the semiconductor device according to a first embodiment of the present invention.

Next, an ion implantation process for reducing the gate resistance value is carried out. As shown in FIG. 3D, a resist film 72 is formed on the electrode formation film 71 by utilizing a resist application technique and a lithography technique, and an opening 73 is formed in the resist film 72 so as to correspond to a portion of the electrode formation film 71 in the first region 11A. Subsequently, in order to reduce the gate resistance value of the portion of the electrode formation film 71 in the first region 11A, an ion implantation is performed for the portion of the electrode formation film 71 in the first region 11A. After that, the resist film 72 is removed.

Next, as shown in FIG. 3E, a hard mask layer 74 is formed on the electrode formation film 71. The hard mask layer 74 is formed as follows. That is to say, a silicon nitride (SiN) layer, for example, is deposited to have a thickness of about 50 to about 100 nm by, for example, utilizing the LP-CVD method.

Figure 3F:
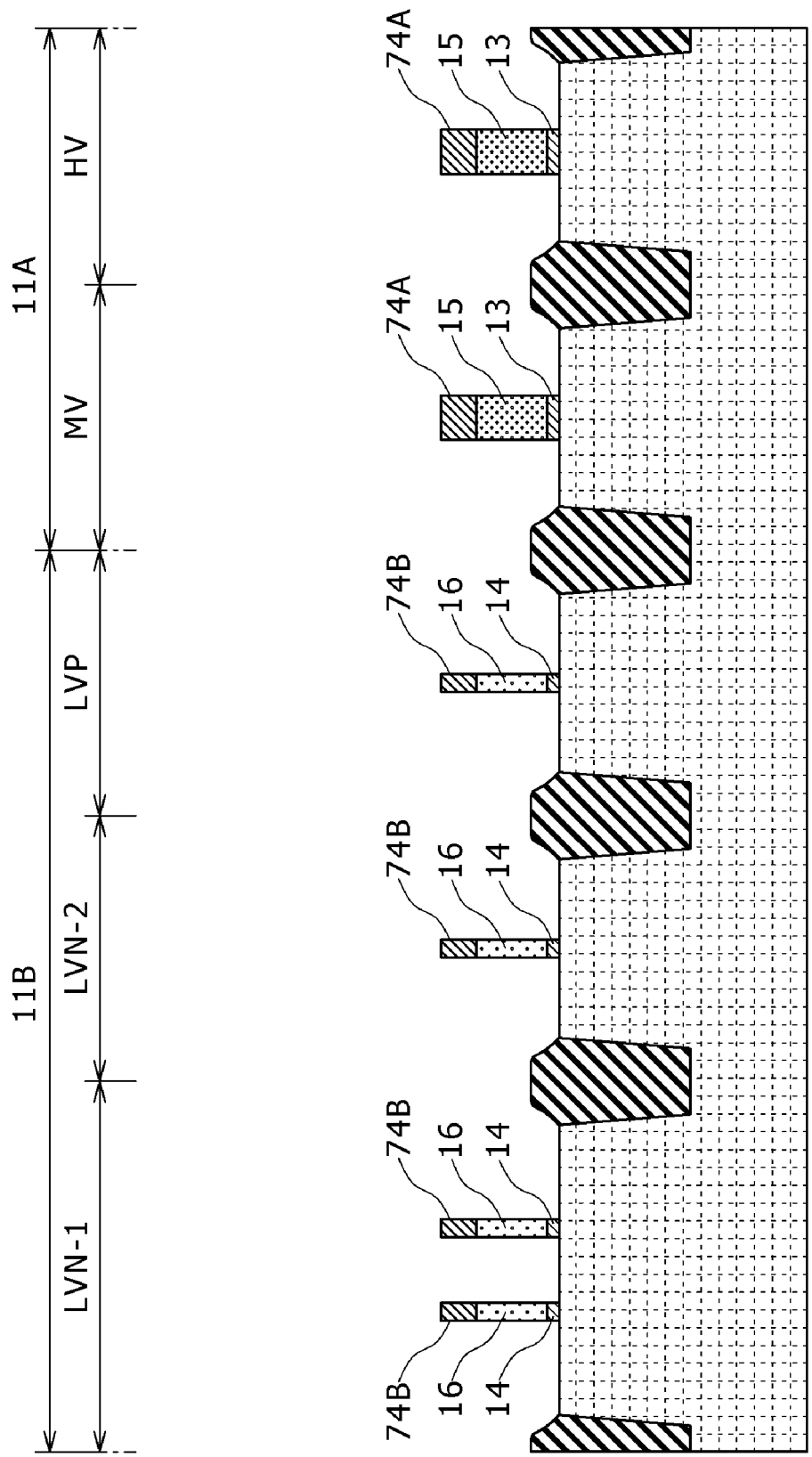

Next, as shown in FIG. 3F, a resist pattern (not shown) for formation of the first gate electrodes 15 and the dummy gate electrodes is formed on the electrode formation film 71 by utilizing the resist application technique and the lithography technique. After that, the hard mask layer 74 (refer to FIG. 3E) is processed with the resist pattern as an etching mask by, for example, utilizing an anisotropic etching method, thereby forming a hard mask 74A and a hard mask 74B. Here, the hard mask 74A is used to form the first gate electrodes 15 of the high-voltage transistor and the middle-voltage transistor in the first region 11A. Also, the hard mask 74B is used to form the second gate electrodes 47 and 48 of the low-voltage transistors in the second region 11B. For the anisotropic etching method, for example, hydrogen bromide (HBr) or chlorine (Cl) system gas is used as etching gas. Moreover, the dummy gate electrodes 16 are formed in the second region 11B by using the hard mask 74A as an etching mask at the same time that the first gate electrodes 15 are formed in the first region 11A by using the hard mask 74B as an etching mask. At this time, the gate insulating films 13, and the dummy insulating films 14 are also selectively etched. In addition, after formation of the resist pattern described above, a trimming treatment or the like using oxygen plasma is performed to slim the resist pattern, thereby making it possible to slimly form the dummy pattern electrodes 16. For example, with a 32-nm node technique, a gate can also be formed to have a length of about 20 to about 30 nm.

Figure 3G:
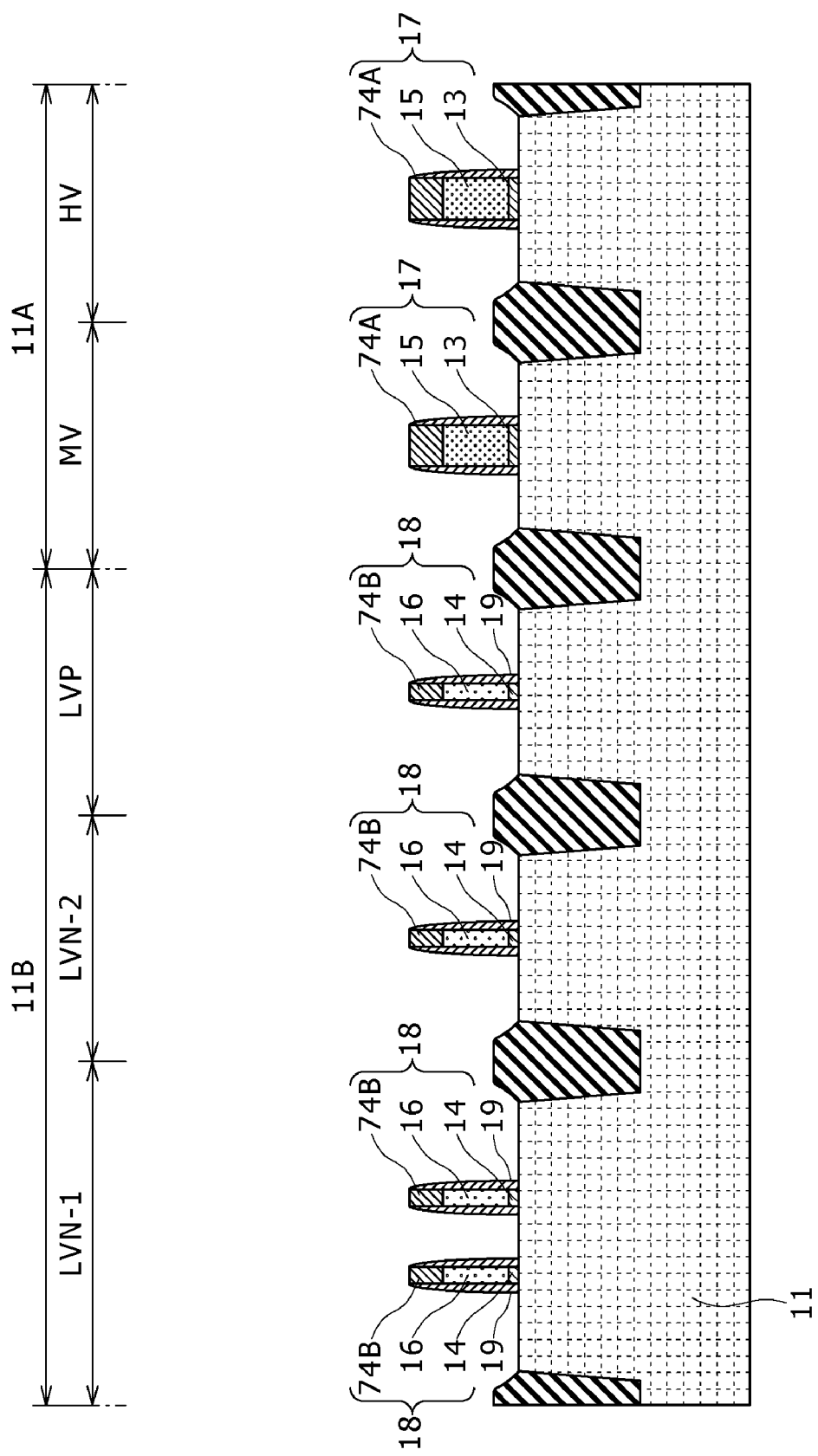

Next, offset spacers are formed. As shown in FIG. 3G, an insulating film for formation of the offset spacers is formed on the semiconductor substrate 11 by, for example, utilizing the LP-CVD method. In this case, this insulating film is formed so as to cover gate portions 17 each having the hard mask 74A, the first gate electrode 15, the gate insulating film 13, and the like, and dummy gate portions 18 each having the hard mask 74B, the dummy gate electrode 16, the dummy gate insulating film 14, and the like. This insulating film, for example, is formed from a silicon nitride film by utilizing the LP-CVD method. Next, the etch back is performed for the entire surface of the insulating film, thereby forming the offset spacers 19. The silicon nitride film deposited by utilizing the LP-CVD has a thickness of, for example, 6 to 10 nm.

Next, as shown in FIG. 3H, an ion implantation mask 76 is formed on the semiconductor substrate 11 in the second region 11B. This ion implantation mask 76 is formed as follows. That is to say, for example, after a resist film is formed over the entire surface by utilizing the resist application technique, it is processed by utilizing the lithography technique so that the first region 11A is exposed and the second region 11B is covered therewith. In such a manner, the ion implantation mask 76 is formed. Next, the ion implantation is performed for the semiconductor substrate 11 by using that resist film as the ion implantation mask 76, thereby forming the extension regions 21 and 22 on the surface side of the semiconductor substrate 11 and below the both sides of each of the gate portions 17 in the first region 11A. Note that, in the case where the N-channel MISFET and the P-channel MISFET are individually formed in the first region 11A, the ion implantation masks corresponding to the region of the N-channel MISFET and the region of the P-channel MISFET, respectively, have to be formed separately from each other, and the ion implantations corresponding to the N-channel MISFET and the P-channel MISFET, respectively, have to be formed. After that, the ion implantation mask 76 is removed away.

Figure 3I:
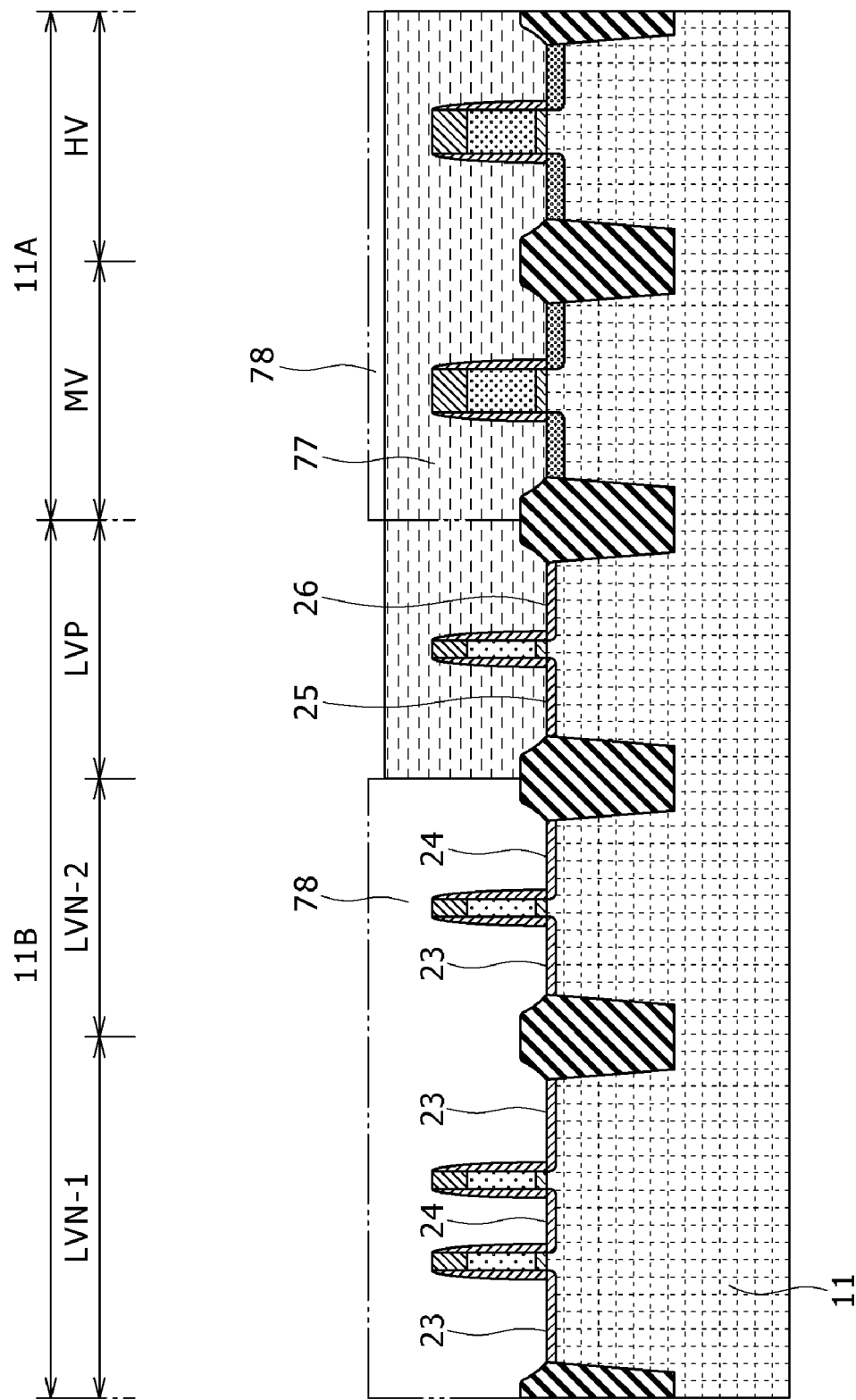

Next, as shown in FIG. 3I, an ion implantation mask 77 is formed on the semiconductor substrate 11. This ion implantation mask 77 is formed as follows. That is to say, after a resist film is formed over the entire surface by, for example, utilizing the resist application technique, it is processed by utilizing the lithography technique so that the regions LVN-1 and LVN-2 in the second region 11B are exposed and the first region 11A and the region LVP in the second region 11B are covered therewith. In such a manner, the ion implantation mask 77 is formed. An ion implantation is performed for the semiconductor substrate 11 by using the ion implantation mask 77, thereby forming the extension regions 23 and 24 of each of the N-channel MISFETs on the surface side of the semiconductor substrate 11 and below the both sides of each of the dummy gate portions 18 in the second region 11B. Thereafter, the ion implantation mask 77 is removed away.

Next, another ion implantation mask 78 (a portion indicated by a chain double-dashed line) is formed on the semiconductor substrate 11. This ion implantation mask 78 is formed as follows. That is to say, after a resist film is formed over the entire surface by, for example, utilizing the resist application technique, it is processed by utilizing the lithography technique so that the region LVP in the second region 11B is exposed, and the regions LVN-1 and LVN-2 in the second region 11B and the first region 11A are covered therewith. In such a manner, the ion implantation mask 78 is formed. An ion implantation is performed for the semiconductor substrate 11 by using the ion implantation mask 78, thereby forming the extension regions 25 and 26 of each of the P-channel MISFETs on the surface side of the semiconductor substrate 11 and below the both sides of each of the dummy gate portions 18 in the region LVP of the second region 11B. Thereafter, the ion implantation mask 78 is removed away.

In each of the ion implantation processes, each of the gate portions 17, each of the dummy gate portion 18, and each of the offset spacers 19 are also used as the ion implantation masks. In the manner as described above, the N-channel MISFET and the P-channel MISFET are individually formed in the second region 11B. It is noted that any pair of extension regions 21 and 22, extension regions 23 and 24, and extension regions 25 and 26 may be first formed.

Next, sidewalls are formed. As shown in FIG. 3J, an insulating film for formation of the sidewalls is formed on the semiconductor substrate 11 by, for example, utilizing the LP-CVD method. In this case, this insulating film is formed so as to cover the gate portions 17, the dummy gate portions 18, the offset spacers (not shown), and the like. This insulating film is formed in the form of a laminated film of a silicon nitride film (having a thickness of, for example, 15 to 30 nm), and a tetra ethyl ortho silicate (TEOS) film (having a thickness of, for example, 40 to 60 nm) by, for example, utilizing the LP-CVD method. Next, the etch back is performed for the entire surface of that insulating film, thereby forming the sidewalls 20.

Figure 3K:
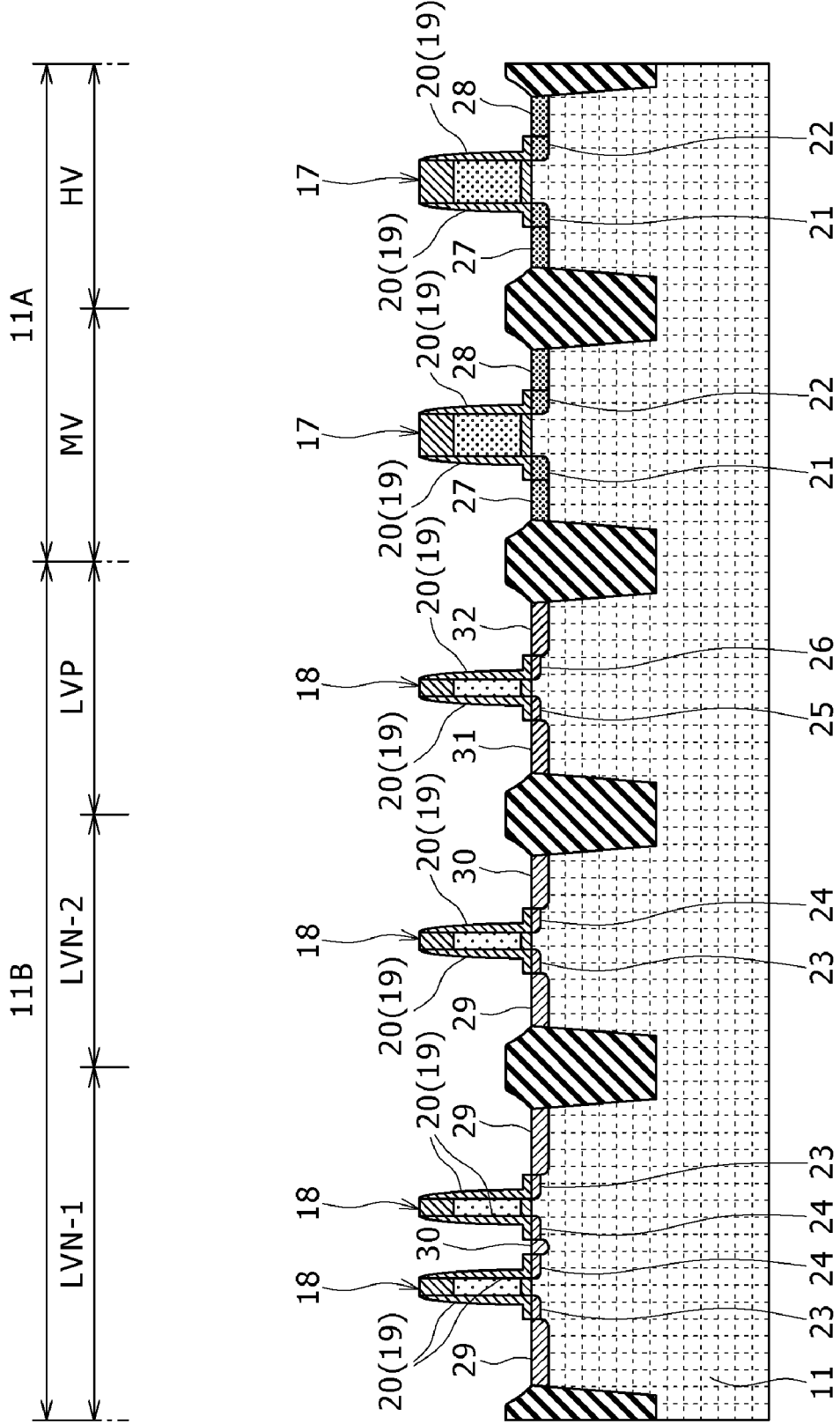

Next, the source/drain regions are formed. As shown in FIG. 3K, an ion implantation mask (not shown) is formed on the semiconductor substrate 11 in the second region 11B. This ion implantation mask is formed as follows. That is to say, after a resist film is formed on the entire surface by, for example, utilizing the resist application technique, it is processed by utilizing the lithography technique so that the first region 11A is exposed, and the second region 11B is covered therewith. In such a manner, the ion implantation mask is formed. Next, the ion implantation is performed for the semiconductor substrate 11 by using this resist film as the ion implantation mask. As a result, the source/drain regions 27 and 28 are formed on the surface side of the semiconductor substrate 11 and below the both sides of each of the gate portions 17 in the first region 11A through the corresponding ones of the extension regions 21 and 22, respectively. In the ion implantation process described above, each of the gate portions 17, each of the sidewalls 20 (including the offset spacers 19 as well), and then like are also used as the ion implantation mask. After that, that ion implantation mask is removed away.

Likewise, an ion implantation mask (not shown) is formed on the semiconductor substrate 11 so as to cover the first region 11A, and the region LVP of the second region 11B. This ion implantation mask 77 is formed as follows. That is to say, after a resist film is formed over the entire surface by, for example, utilizing the resist application technique, it is processed by utilizing the lithography technique so that the regions LVN-1 and LVN-2 in the second region 11B are exposed, and the first region 11A and the region LVP of the second region 11B are covered therewith. In such a manner, the ion implantation mask is formed. Next, the ion implantation is performed for the semiconductor substrate 11 by using this resist film as the ion implantation mask. As a result, the source/drain regions 29 and 30 are formed on the surface side of the semiconductor substrate 11 and below the both sides of each of the dummy gate portions 18 of the region LVN-1 and the region LVN-2 in the second region 11B through the corresponding ones of the extension regions 23 and 24, respectively. In the ion implantation process described above, each of the dummy gate portions 18, each of the sidewalls 20 (including the offset spacers 19 as well), and the like are also used as the ion implantation mask. After that, that ion implantation mask is removed away.

Likewise, an ion implantation mask (not shown) is formed on the semiconductor substrate 11 so as to cover the first region 11A, and the regions LVN-1 and LVN-2 in the second region 11B. This ion implantation mask is formed as follows. That is to say, after a resist film is formed over the entire surface by, for example, utilizing the resist application technique, it is processed by utilizing the lithography technique so that the region LVP in the second region 11B is exposed, and the regions LVN-1 and LVN-2 in the second region 11B and the first region 11A are covered therewith. In such a manner, the ion implantation mask is formed. Next, the ion implantation is performed for the semiconductor substrate 11 by using this resist film as the ion implantation mask. As a result, the source/drain regions 31 and 32 are formed on the surface side of the semiconductor substrate 11 and below the both sides of the dummy gate portion 18 of the region LVP in the second region 11B through the extension regions 25 and 26, respectively. In the ion implantation process described above, each of the dummy gate portions 18, each of the sidewalls 20 (including the offset spacers 19 as well), and the like are also used as the ion implantation mask. After that, that ion implantation mask is removed away.

In the manner as described above, the N-channel MISFET and the P-channel MISFET are individually formed in the first region 11A. It is noted that the order of the ion implantation processes described above is by no means limited to the order described above. Thus, any pair(s) of source/drain regions 27 and 28 of the first region 11A, and source/drain regions 29 and 30 of the region LVN-1, source/drain regions 29 and 30 of the region LVN-2, and source/drain regions 31 and 32 of the region LVP in the second region 11B may be formed first or last.

Subsequently, the TEOS portions of the sidewalls are removed. This removal process is performed by, for example, utilizing a wet etching method using a dilute hydrofluoric acid. After that, a heat treatment for activating the implanted impurity ions is carried out. For example, in this heat treatment, the impurity ions are activated at 1,000° C. for five seconds, thereby forming the source/drain regions 27 to 32 of the respective MISFETs. In addition, for the purpose of promoting the dopant activation to suppress the diffusion, it is also possible to carry out a heat treatment adopting a spike rapid thermal anneal (RTA).

Figure 3L:
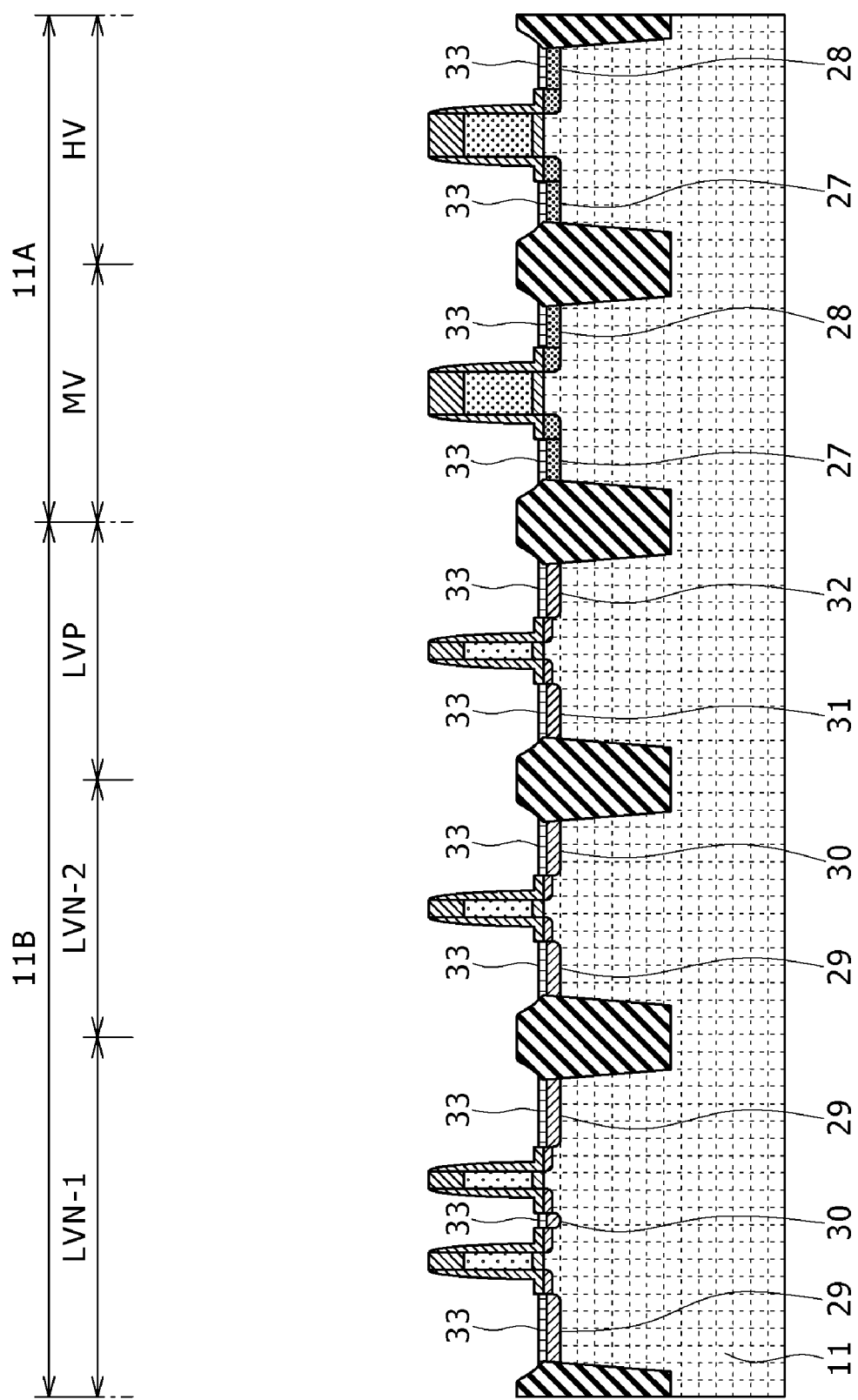

Next, as shown in FIG. 3L, a silicide layer 33 is formed on each of the source/drain regions 27 to 32. Firstly, a metallic layer for formation of a silicide layer is formed over the entire surface. In this case, as an example, the metallic layer is made of cobalt (Co). A cobalt layer is deposited over the entire surface to have a thickness of, for example, 6 to 8 nm by, for example, utilizing a sputtering method, thereby forming the metallic layer. Next, the RTA is performed at a temperature of 500 to 600° C., so that the metallic layer is reacted with only silicon (Si) of the semiconductor substrate 11, thereby forming the silicide layer 33. Since the metallic layer is made of cobalt, the silicide layer 33 is made of cobalt silicide (for example, CoSi). After that, unreacted cobalt on the insulating films (such as the isolation regions 12, the hard mask layer 74 and the sidewalls 20) is removed by utilizing a wet etching method using a sulfuric acid ($H_2SO_4$) and hydrogen peroxide ($H_2O_2$). Subsequently, a heat treatment is performed, thereby forming a cobalt silicide ($CoSi_2$) layer having a low resistance value. This heat treatment, for example, is performed at a temperature of 650 to 850° C. for 30 seconds in the RTA. In addition, the metallic layer may also be made of nickel (Ni) or nickel platinum (NiPt) instead of being made of cobalt (Co). In this case, a nickel silicide ($NiSi_2$) layer is formed. In any case, the temperature in the RTA can be suitably set.

Figure 3M:
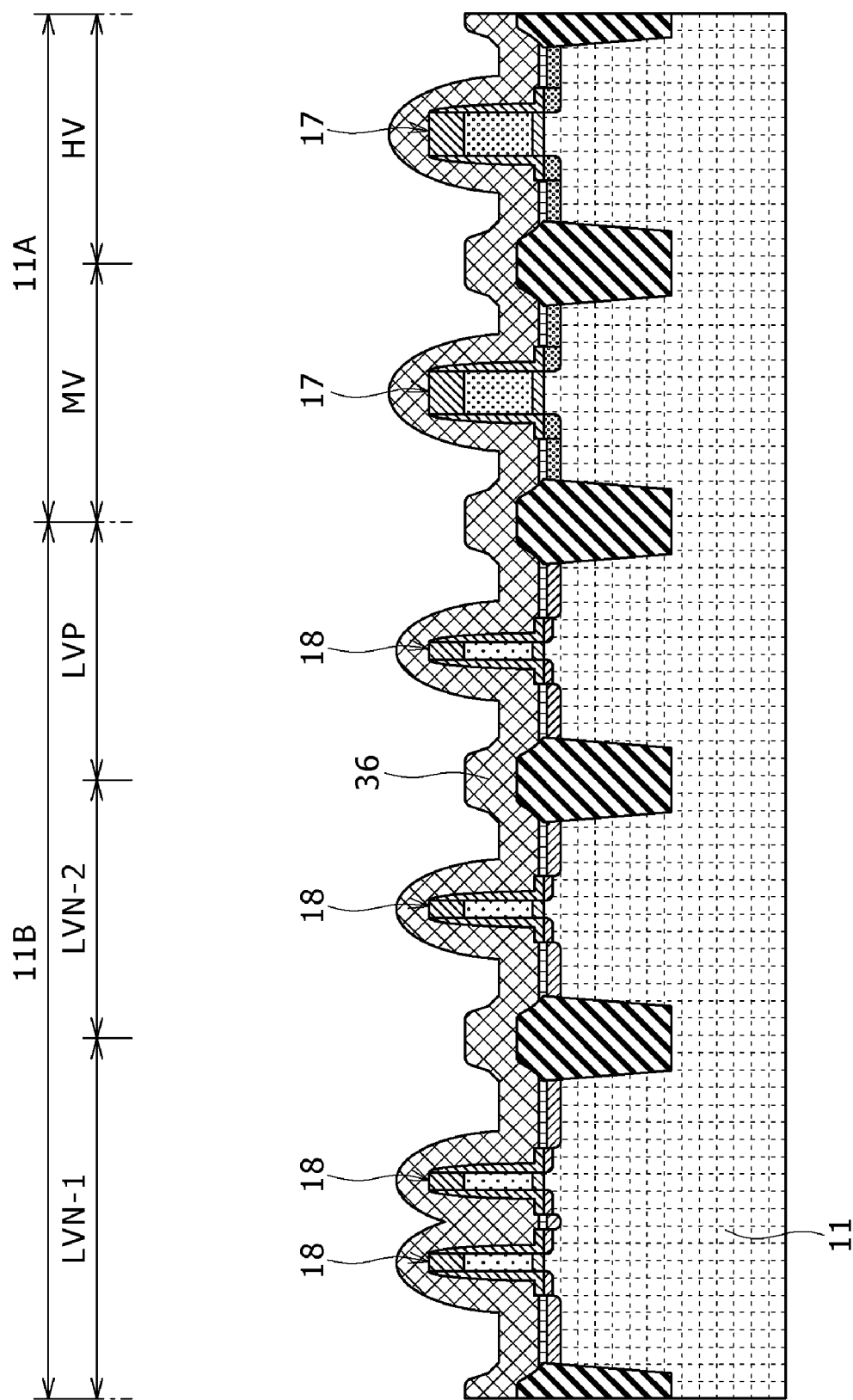

Next, as shown in FIG. 3M, an insulating film is formed so as to cover the gate portions 17, the dummy gate portions 18, and the like. Firstly, a liner film 36 is formed as the insulating film over the entire surface of the semiconductor substrate 11. This liner film 36, for example, is formed from a silicon nitride (SiN) film, and serves to apply a stress to the corresponding one(s) of the channel portions of the transistors. For example, the liner film having a tensile stress is used in the N-channel MISFET for the purpose of increasing a mobility in a channel. Also, the liner film having a compressive stress is used in the P-channel MISFET for the purpose of increasing a mobility in a channel. In addition, the liner films may be individually formed for the N-channel MISFET and the P-channel MISFET, respectively. Also, the stress of the liner film 36 can be normally determined depending on the film deposition conditions.

Figure 3N:
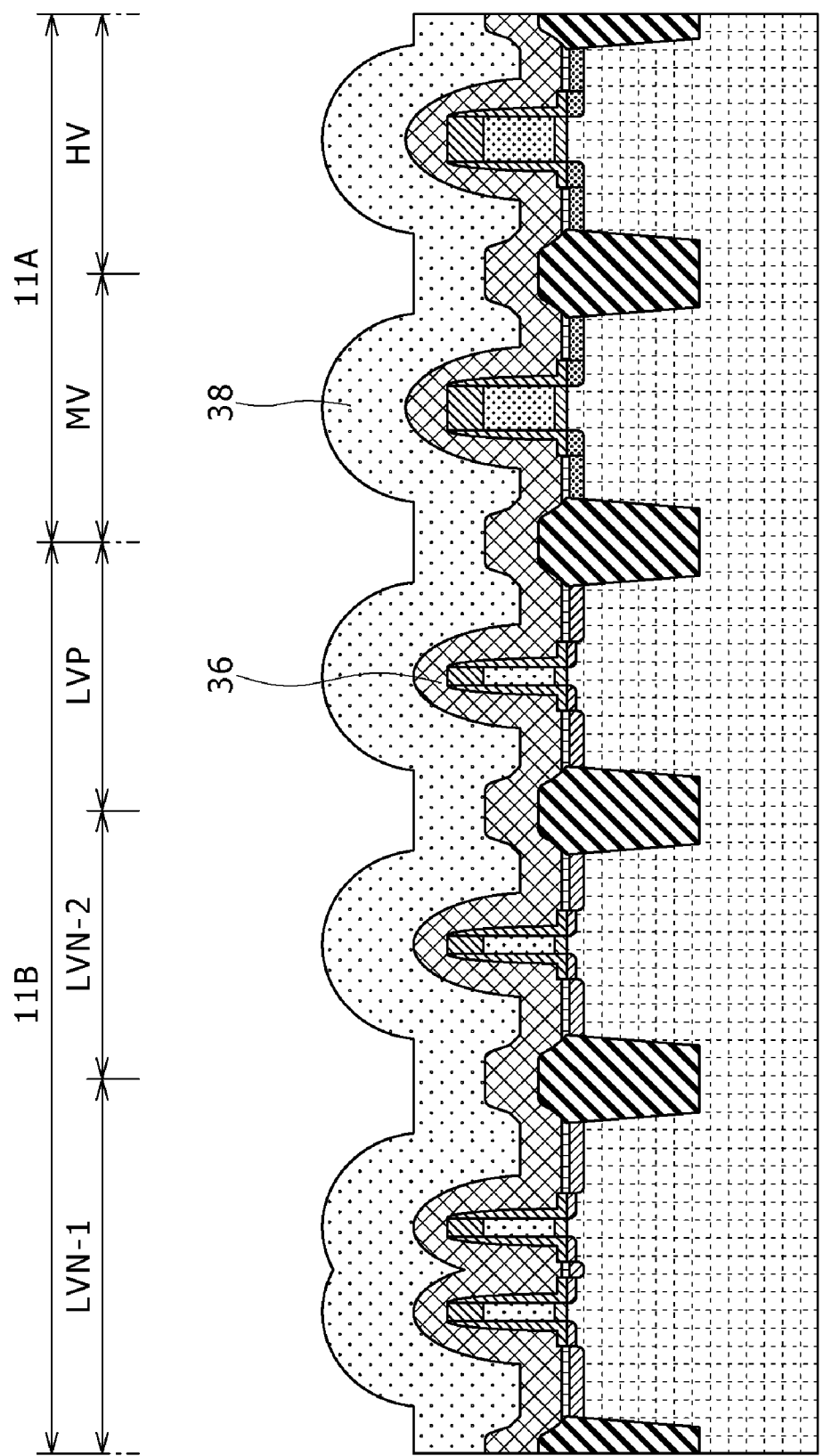
Figure 30:
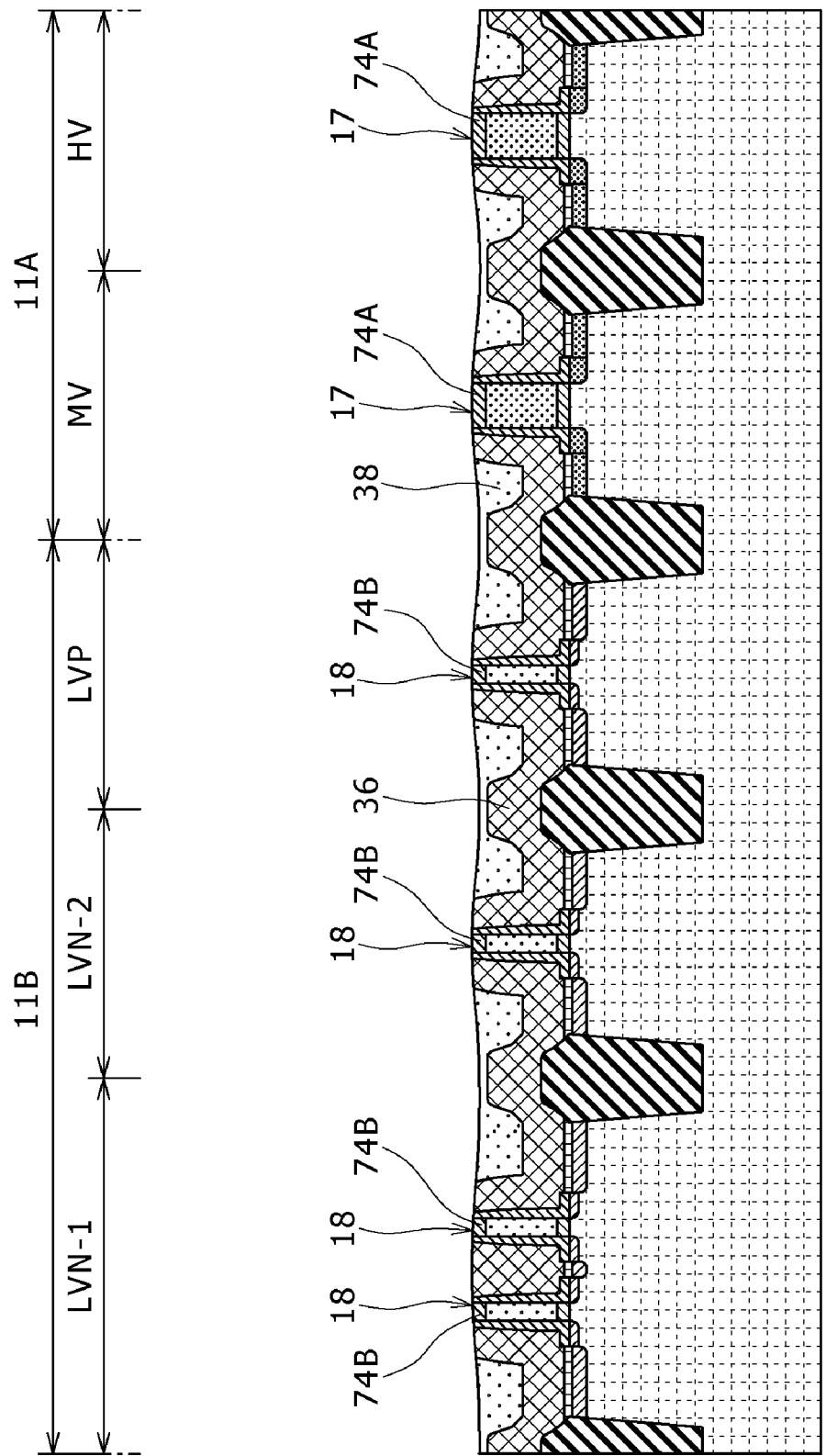

Next, as shown in FIG. 3N, the first interlayer insulating film 38 as a part of that insulating film is formed on the liner film 36. The first interlayer insulating film 38 is formed from a silicon oxide ($SiO_2$) film having a thickness of 100 to 200 nm by, for example, utilizing an HDP-CVD method.

Next, as shown in FIG. 3O, the first interlayer insulating film 38, and the liner film 36 which overlie the gate portions 17, and the dummy gate portions 18 are polished by utilizing the CMP method until the hard masks 74A, and the hard masks 74B are exposed.

Figure 3P:
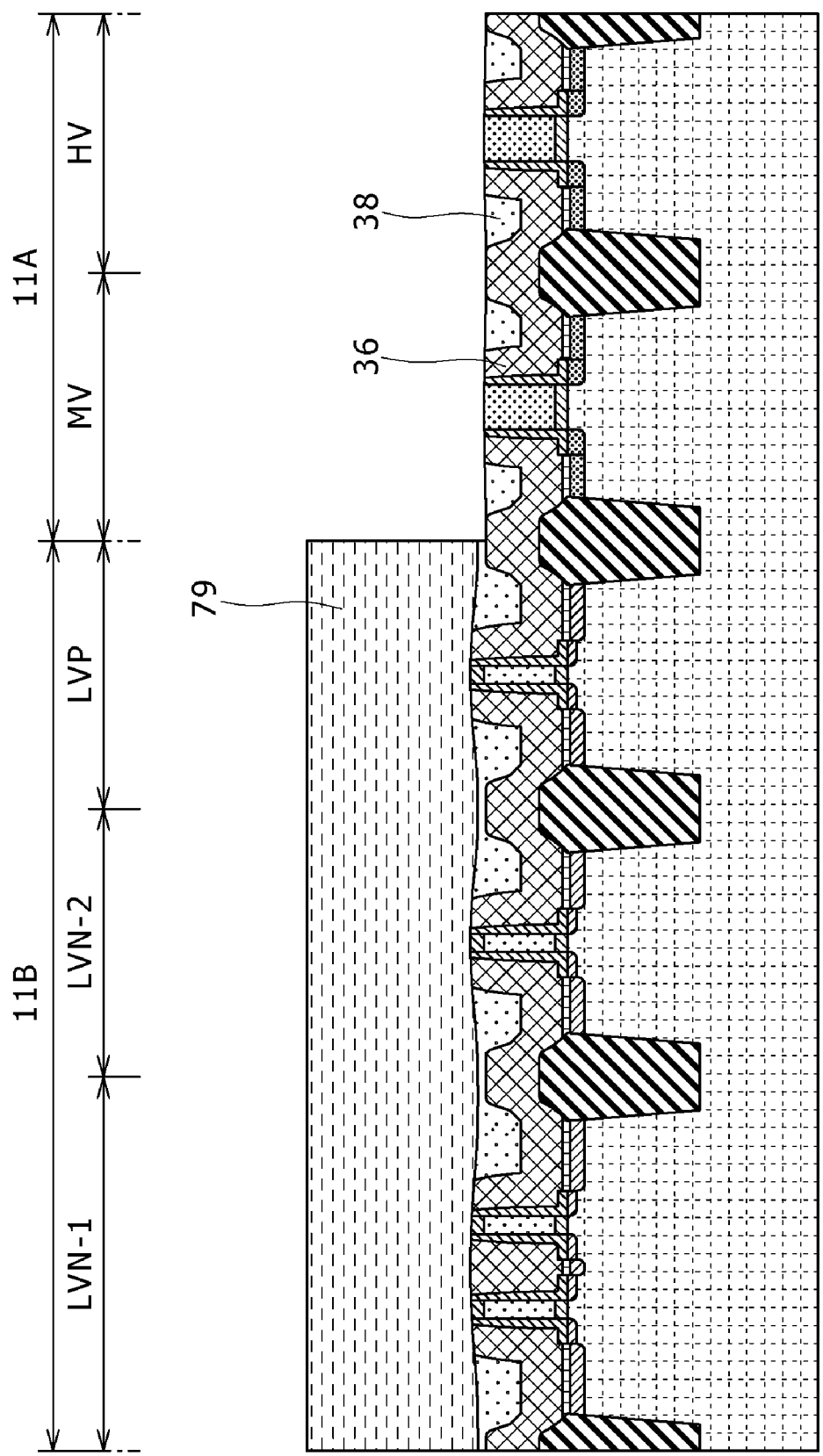

Next, as shown in FIG. 3P, an etching mask 79 is formed so as to cover the second region 11B by utilizing the resist application technique and the lithography technique. Each of the hard masks 74A (refer to FIG. 3O) formed in the first region 11A is removed by using the etching mask 79. At this time, upper portions of the first interlayer insulating film 38 and the liner film 36 are also etched away. After that, the etching mask 79 is removed away. Note that, FIG. 3P shows a state before removal of the etching mask 79.

Figure 3Q:
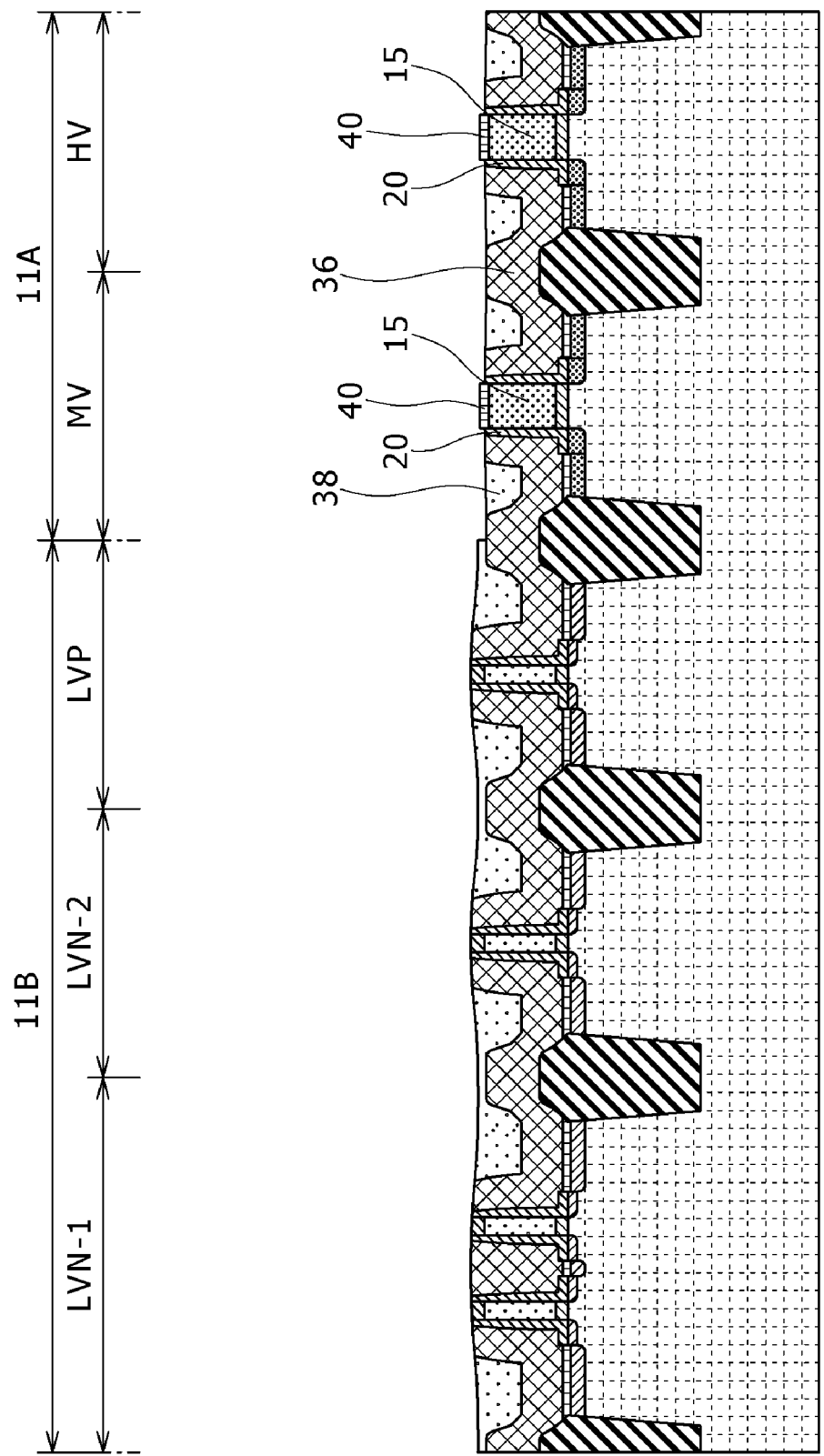

Next, as shown in FIG. 3Q, a silicide layer 40 is formed on each of the first gate electrodes 15. Firstly, a metallic layer for formation of a silicide layer 40 is formed over the entire surface. In this case, as an example, the metallic layer is made of cobalt (Co). The cobalt layer is deposited to have a thickness of, for example, 6 to 8 nm by, for example, utilizing the sputtering method, thereby forming the metallic layer. Next, the RTA is performed at a temperature of 500 to 600° C., so that the metallic layer is reacted with only silicon (Si) of each of the first gate electrodes 15, thereby forming the silicide layer 40. Since the metallic layer is made of cobalt, the silicide layer 40 is made of cobalt silicide (for example, CoSi). After that, unreacted cobalt on the insulating films (such as the sidewalls 20, the liner film 36 and the first interlayer insulating film 38) is removed by utilizing the wet etching method using a sulfuric acid ($H_2SO_4$) and hydrogen peroxide ($H_2O_2$). Subsequently, a heat treatment is performed, thereby forming a cobalt silicide ($CoSi_2$) layer having a low resistance value. This heat treatment, for example, is performed at a temperature of 650 to 850° C. for 30 seconds in the RTA. In addition, the metallic layer may also be made of nickel (Ni) or nickel platinum (NiPt) instead of being made of cobalt (Co). In this case, a nickel silicide ($NiSi_2$) layer is formed. In any case, the temperature in the RTA can be suitably set.

Figure 3R:
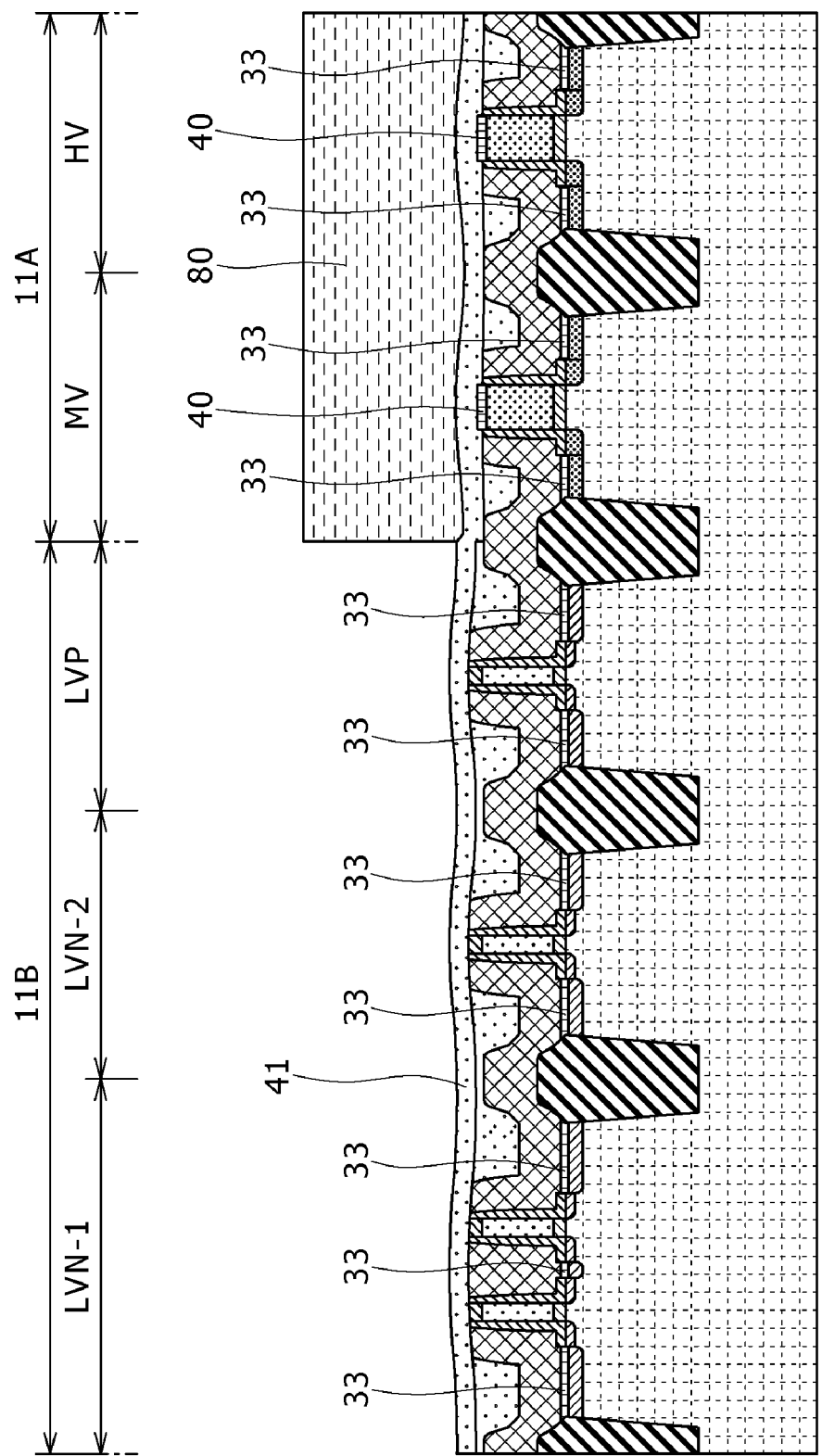

Next, as shown in FIG. 3R, a protective film 41 for protecting the silicide layer 40 is formed over the entire surface. The protective film 41 is formed from either a silicon oxide ($SiO_2$) film or a silicon nitride (SiN) film by, for example, utilizing a plasma CVD method. For example, when the protective film 41 is formed from the silicon oxide film, an example of the conditions in the CVD method is described as follows: oxygen ($O_2$) (flow rate: 600 cm$^3$/min.) and tetra ethyl silicate (TEOS) (flow rate: 800 cm$^3$/min.) are used as raw material gas, a pressure of a deposition ambient atmosphere is set at 1.09 kPa, an RF power of a CVD system is set at 700 W, and a substrate temperature is set at 400° C. Since the protective film 41 can be deposited at a temperature of 450° C. or less, the damage is prevented from being incurred on the silicide layers 33 and 40 which are previously formed.

Next, an etching mask 80 is formed so as to cover the first region 11A by utilizing the resist application technique and the lithography technique. Thus, the second region 11B is not covered with this etching mask 80.

Figure 3S:
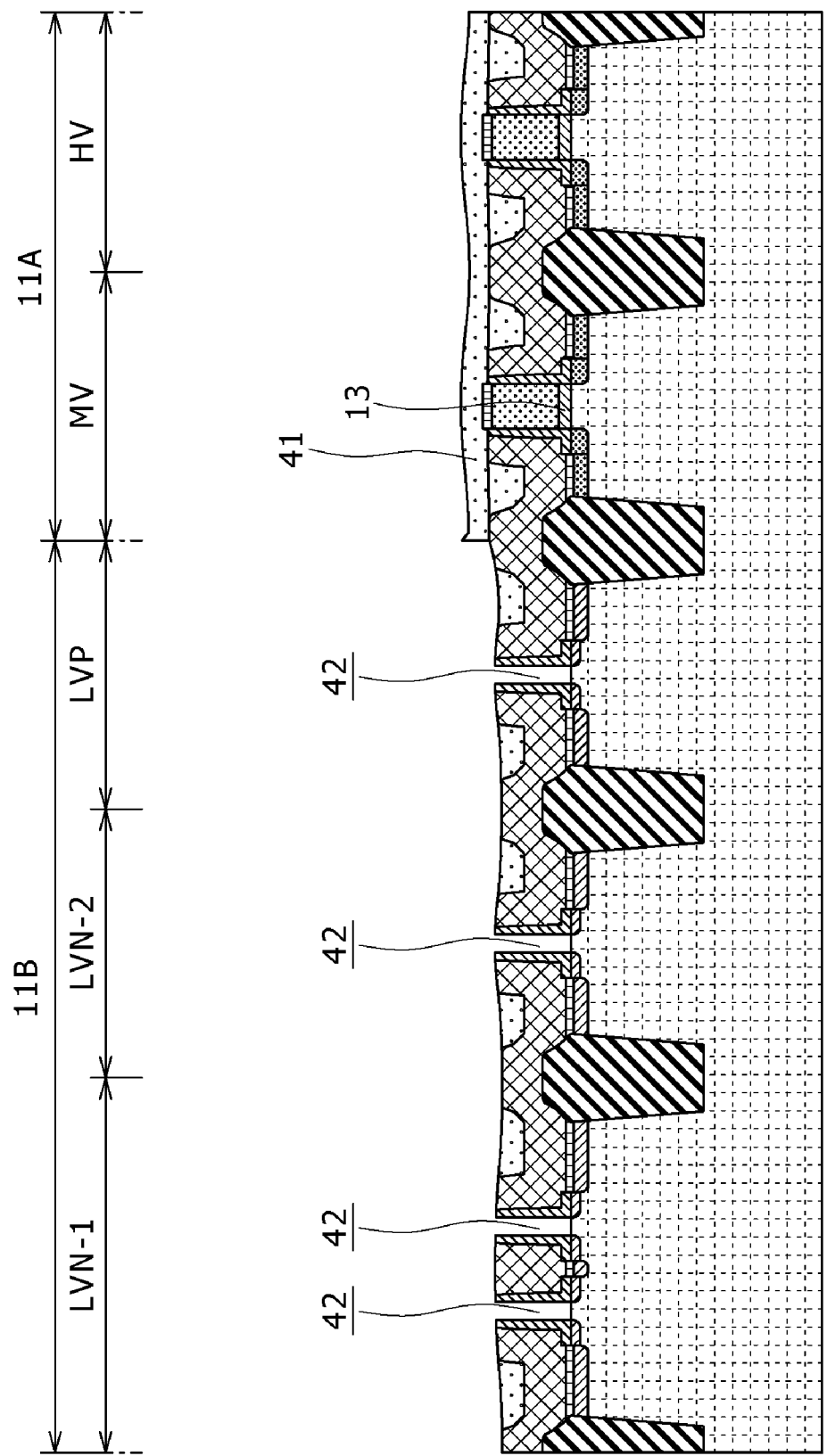

Next, as shown in FIG. 3S, a portion of the protective film 41 (refer to FIG. 3R) in the second region 11B is removed away with the etching mask 80 (refer to FIG. 3R) by utilizing the dry etching method. An example of the dry etching conditions is described as follows: octafluoro cyclobutane ($C_4F_8$), oxygen ($O_2$) and argon (Ar) are used as etching gas, flow rates of $C_4F_4$, $O_2$ and Ar are set at 9 cm$^3$/min., 5 cm$^3$/min., and 250 cm$^3$/min., respectively, a pressure of an etching ambient atmosphere is set at 4.1 Pa, a power (plasma output) of an etching system is set at 1,500 W, and a substrate temperature is set at 20° C. Subsequently, each of the hard masks 74B, and each of the dummy gate electrodes 16 (refer to FIG. 3F) are removed away by, for example, utilizing the dry etching method. Moreover, the dummy gate insulating films 14 (refer to FIG. 3F) are removed by utilizing the wet etching method using a dilute hydrofluoric acid, thereby forming the trenches 42 for gate formation, respectively. At this time, the first region 11A is covered with the protective film 41. The etching mask 80 described above is removed away before the wet etching is performed.

Figure 3T:
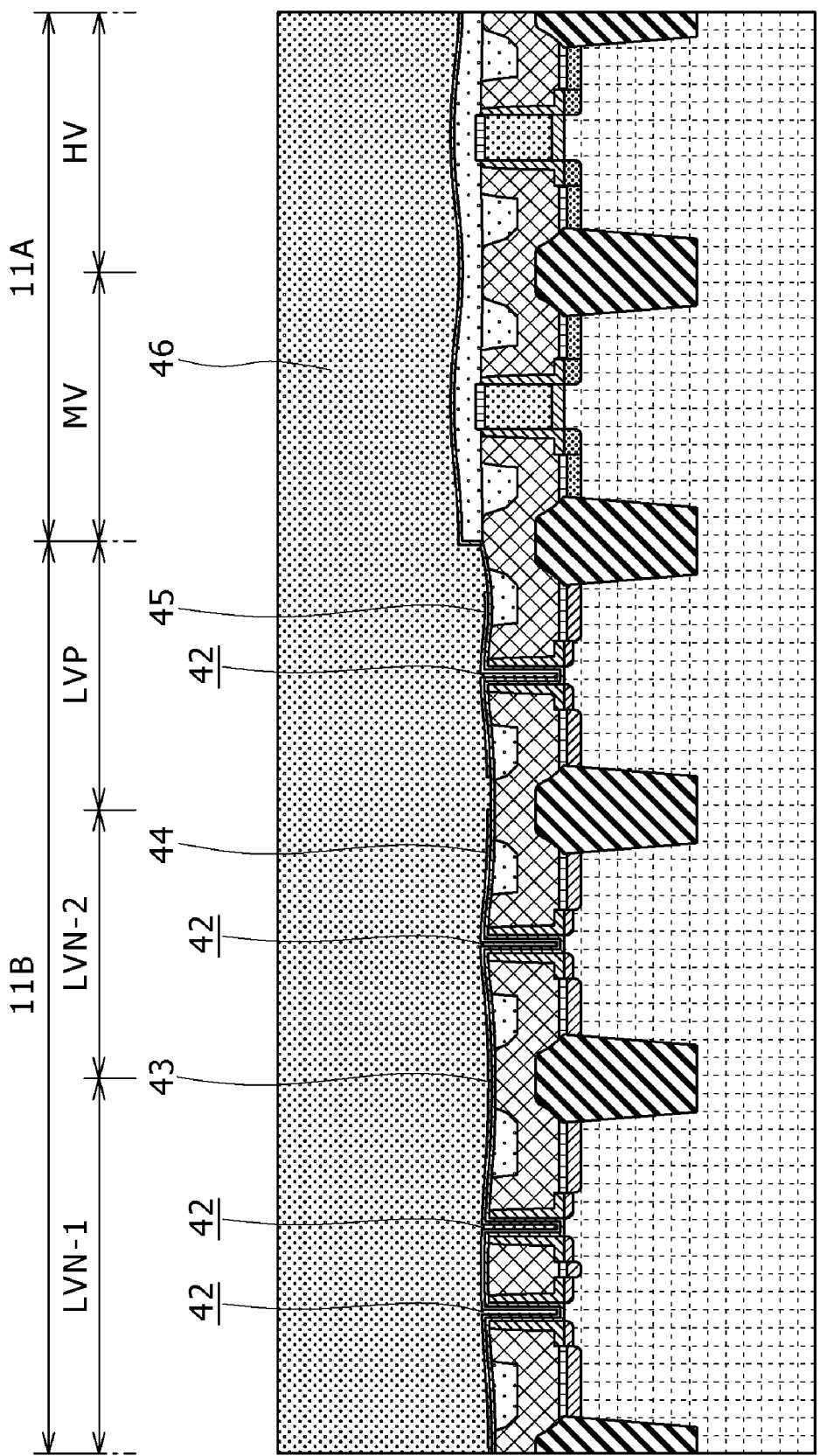

Next, as shown in FIG. 3T, a second gate insulating film 43 is formed on each of inner surfaces of the trenches 42 for gate formation. The second gate insulating film 43 is formed so that a capacity per unit area obtained from the second gate insulating film 43 is smaller than that obtained from each of the first gate insulating films 13 in the first region 11A. The second gate insulating film 43 is formed from a high-permittivity film by utilizing an atomic layer deposition (ALD) method. The high-permittivity film, for example, is made of an oxide, an oxysilicate, an oxynitride or a silicon oxynitride of hafnium, zirconium, lanthanum, yttrium, tantalum or aluminum. Specifically, the high-permittivity film, for example, is made of a hafnium oxide ($HfO_2$), a zirconium oxide ($ZrO_2$), a lanthanum oxide ($LaO_3$), a yttrium oxide ($Y_2O_3$), a tantalum oxide ($Ta_2O_5$), an aluminum oxide ($Al_2O_3$), a hafnium silicate ($HfSiO_x$), a zirconium silicate ($ZrSiO_x$), a lanthanum silicate ($LaSiO_x$), a yttrium silicate ($YSiO_x$), a tantalum silicate ($TaSiO_x$), an aluminum silicate ($AlSiO_x$), a zirconium titanate ($ZrTiO_x$), a hafnium aluminum oxide ($HfAlO_x$) or a hafnium zirconium oxide ($HfZrO_x$). Or, the high-permittivity film is made of a nitride of any of these compounds. For example, as a silicon oxynitride, there are nitrides of the metallic silicate described above such as a hafnium silicon oxynitride (HfSiON) or a zirconium silicon oxynitride (ZrSiON). A relative permittivity of the high-permittivity film fluctuates depending on a composition, a state (crystalline or amorphous), and the like. However, in general, the relative permittivity of the hafnium oxide ($HfO_2$) is in the range of 25 to 30, and the relative permittivity of the zirconium oxide ($ZrO_2$) is in the range of 20 to 25.

Next, the work function controlling films 44 and 45 for determining work functions are formed on the inner surfaces of the trenches 42 for gate formation through the second gate insulating films 43, respectively.

Firstly, a metal or metallic compound layer having a work function suitable for the N-channel MISFET is deposited by utilizing the film deposition method such as the ALD method or the CVD method. Normally, the work function controlling film has the work function of 4.6 eV or less, preferably, 4.3 eV or less in the gate electrode of the N-channel MISFET. On the other hand, the work function controlling film has the work function of 4.6 eV or more, preferably, 4.9 eV or more in the gate electrode of the P-channel MISFET. Also, a difference between these work functions is preferably equal to or larger than 0.3 eV. Specifically, although fluctuating depending on the composition, the state (crystalline or amorphous) and the like, the work function of hafnium silicide ($HfSi_x$) for the N-channel MISFET is in the range of about 4.1 to about 4.3 eV, and the work function of a titanium nitride (TiN) for the P-channel MISFET is in the range of about 4.5 to about 5.0 eV.

As an example of the material for each of the work function controlling films 44 and 45 described above, there is a metal such as titanium (Ti), vanadium (V), nickel (Ni), zirconium (Zr), a niobium (Nb), molybdenum (Mo), ruthenium (Ru), hafnium (Hf), tantalum (Ta), tungsten (W) or platinum (Pt), an alloy thereof, or a compound thereof. As the metallic compound, there is a metallic nitride, or a compound of a metal and a semiconductor. Also, with regard to the compound of a metal and a semiconductor, as an example, there is a metallic silicide.

Next, for the work function controlling film 44 suitable for the N-channel MISFET, as an example, there is a metal such as hafnium (Hf) or tantalum (Ta), an alloy thereof, or a compound thereof. Specifically, hafnium silicide ($HfSi_x$) is more preferable for the work function controlling film 44. On the other hand, for the work function controlling film 45 suitable for the P-channel MISFET, as an example, there is a metal such as titanium (Ti), molybdenum (Mo) or ruthenium (Ru), an alloy thereof, or a compound thereof. Specifically, a titanium nitride (TiN) or ruthenium (Ru) is more preferable for the work function controlling film 45.

In this embodiment, for example, a hafnium silicide (Hf-Si$_x$) layer is deposited to have a thickness of, for example, about 10 to abut 100 nm, thereby forming the work function controlling film 44. Subsequently, a resist mask (not shown) is formed so as to cover the region LVN-1 and the region LVN-2 in the second region 11B by utilizing the resist application technique and the lithography technique. A portion of the work function controlling film 44 overlying the region LVP of the second region 11B, and the first region 11A is removed by using this resist mask as an etching mask. As a result, the remaining work function controlling film 44 is left so as to overlie the region LVN-1 and the region LVN-2 in the second region 11B. After that, this resist mask is removed away.

Next, a metal or metallic compound layer having a work function suitable for the P-channel MISFET is deposited by utilizing the film deposition method such as the ALD method or the CVD method. In this embodiment, for example, a titanium nitride (TiN) layer is deposited to have a thickness of, for example, 5 to 50 nm, thereby forming the work function controlling film 45. Subsequently, a resist mask (not shown) is formed so as to cover the region LVP in the second region 11B. A portion of the work function controlling film 45 overlying the region LVN-1 and the region LVN-2 in the second region 11B, and the first region 11A is removed by using this resist mask as an etching mask. As a result, the remaining work function controlling film 45 is left so as to overlie the region LVP in the second region 11B. For example, a ruthenium (Ru) layer or the like can also be deposited for the P-channel MISFET. After that, that resist mask is removed away.

Any of the work function controlling films 44 and 45 may be formed first.

Next, a conductive film 46 is formed as a conductive material over the entire surface so as to be filled in each of the insides of the trenches 42 for gate formation. The conductive material 46, for example, is made of a metallic material having an electrical resistance value which is smaller than that of each of the work function controlling films 44 and 45. In this example, as an example, the conductive material 46 is made of tungsten (W). This tungsten film is deposited and formed by, for example, utilizing the CVD method. A thickness of this tungsten film is arbitrarily set as long as each of the trenches 42 for gate formation is fully filled with this tungsten film having the thickness concerned. Thus, the thickness of this tungsten film, for example, is set in the range of 200 to 400 nm.

Figure 3U:
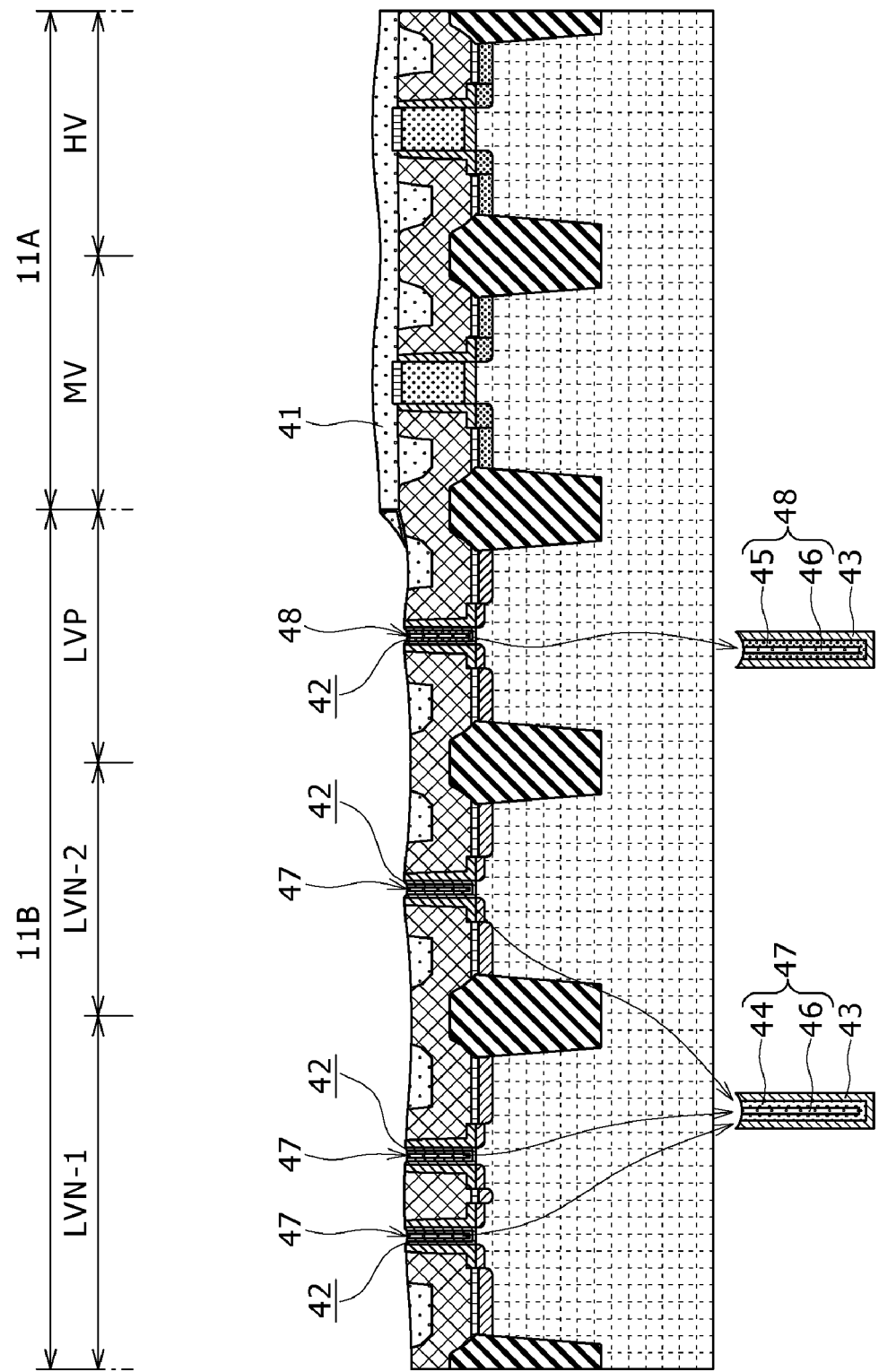

Next, as shown in FIG. 3U, the extra conductive film 46 (refer to FIG. 3T) other than the conductive film 46 filled in each of the insides of the trenches 42 for gate formation is removed away. This removal process is carried out by, for example, utilizing the CMP method. In the phase of utilizing the CMP method, the liner film 36, the first interlayer insulating film 38, the protective film 41, and the like serve as a polishing stopper. As a result, the second gate electrode 47 of each of the low-voltage transistors (N-channel MISFETs) in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) in the second region 11B is formed from the conductive film 46 and the work function controlling film 45 which are left in the corresponding one of the trenches 42 for gate formation.

Figure 3V:
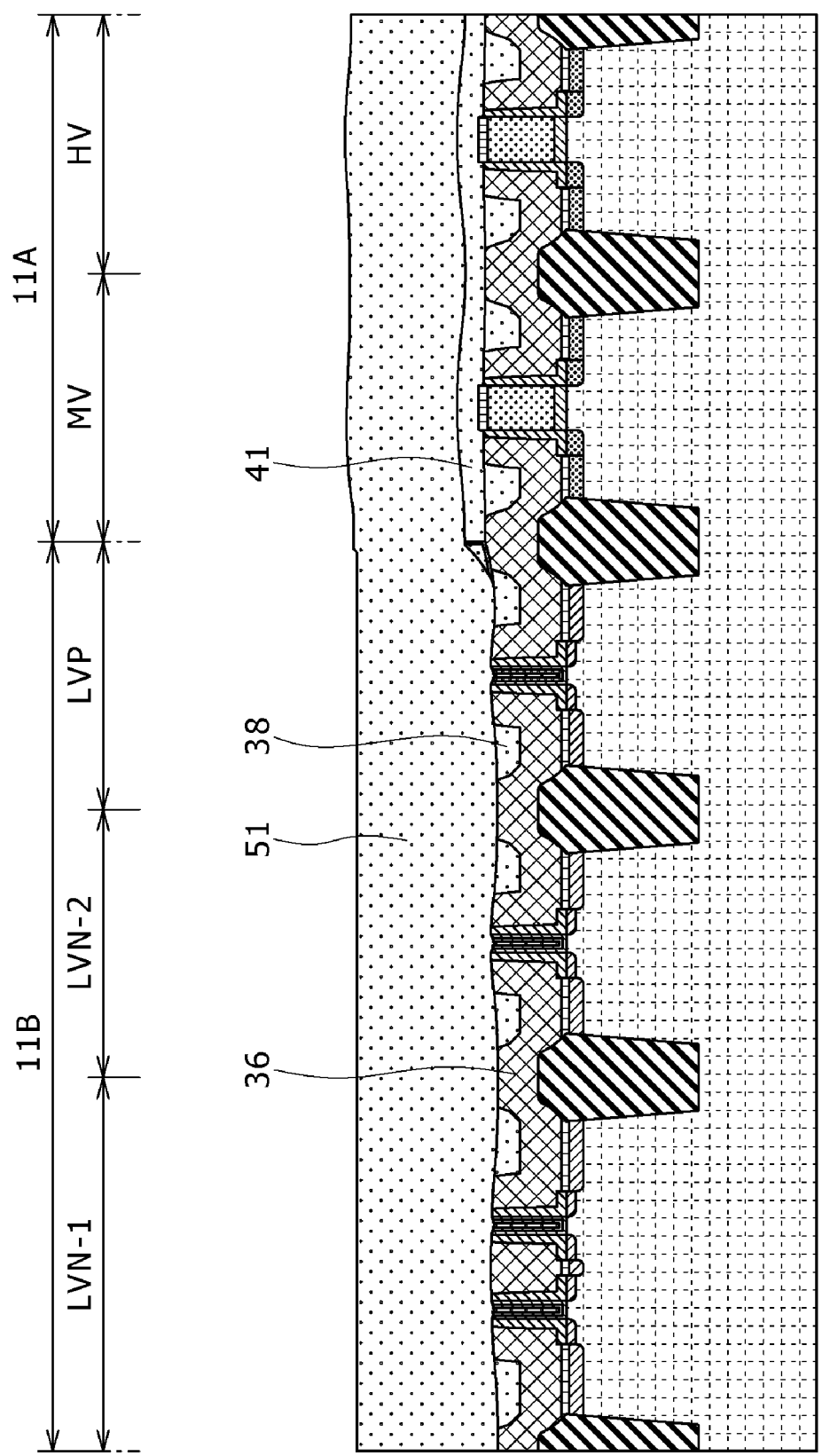

Next, as shown in FIG. 3V, the second interlayer insulating film 51 is formed over all the surfaces of the liner film 36, the first interlayer insulating film 38, and the protective film 41. The second interlayer insulating film 51, for example, is formed from a silicon oxide film. Also, the second layer insulating film 51 is formed at a film deposition temperature of 500° C. or less by, for example, utilizing the HDP-CVD method as the film deposition conditions.

Figure 3W:
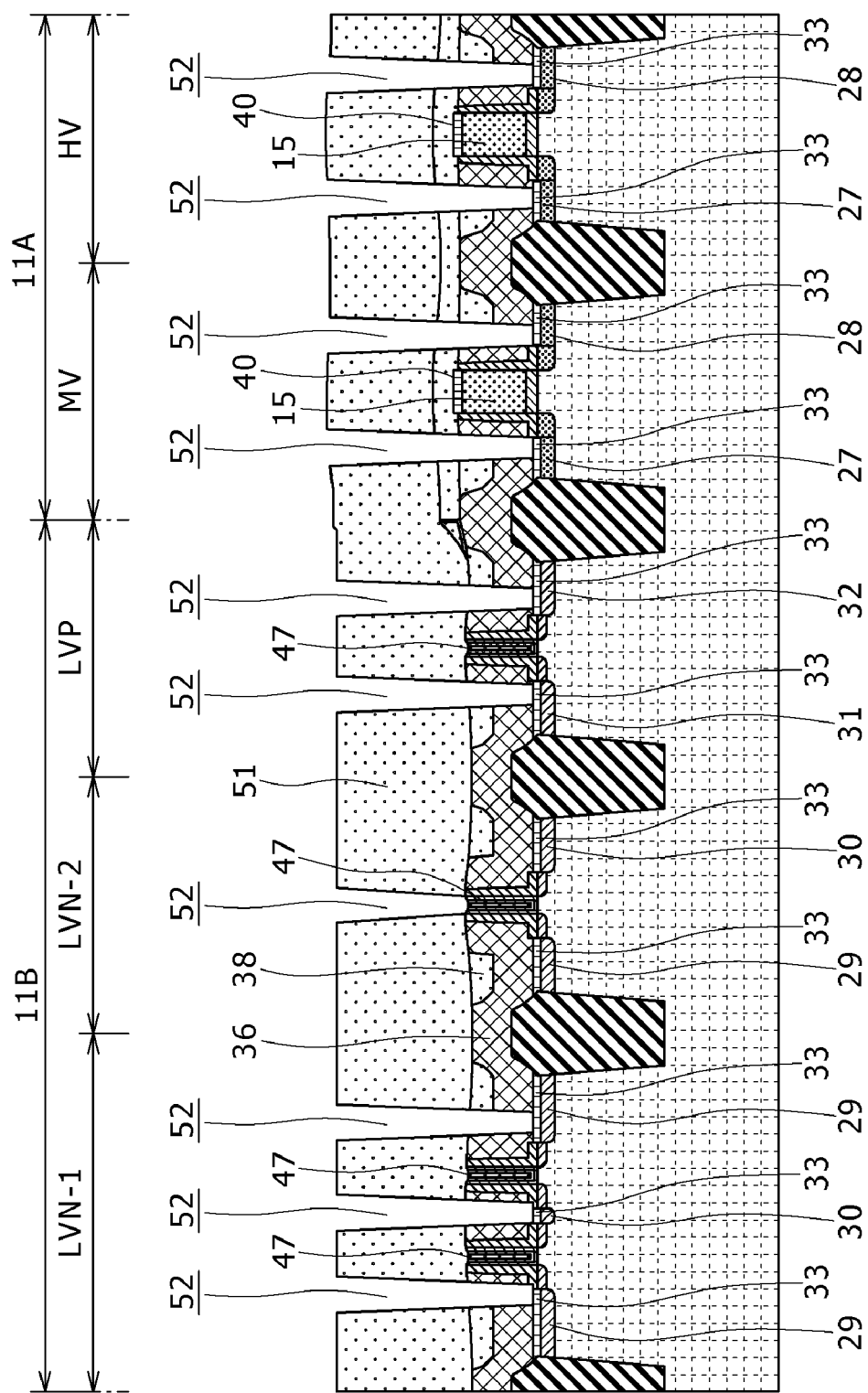

Next, as shown in FIG. 3W, a resist mask (not shown) is formed by utilizing the normal resist application and lithography techniques. The etching (for example, the dry etching) is then performed by using this resist mask as an etching mask. As a result, the connection holes 52 to the silicide layers 40 on the first gate electrodes 15, the second gate electrodes 47 and 48, and the silicide layers 33 on the source/drain regions 27 to 32 are formed so as to extend completely through the liner film 36, the first interlayer insulating film 38, the protective film 41, and the second interlayer insulating film 51. It is noted that an illustration of a part of the connection holes is omitted here for the sake of simplicity because FIG. 3W is a cross sectional view. After that, the resist mask is removed away.

Figure 3X:
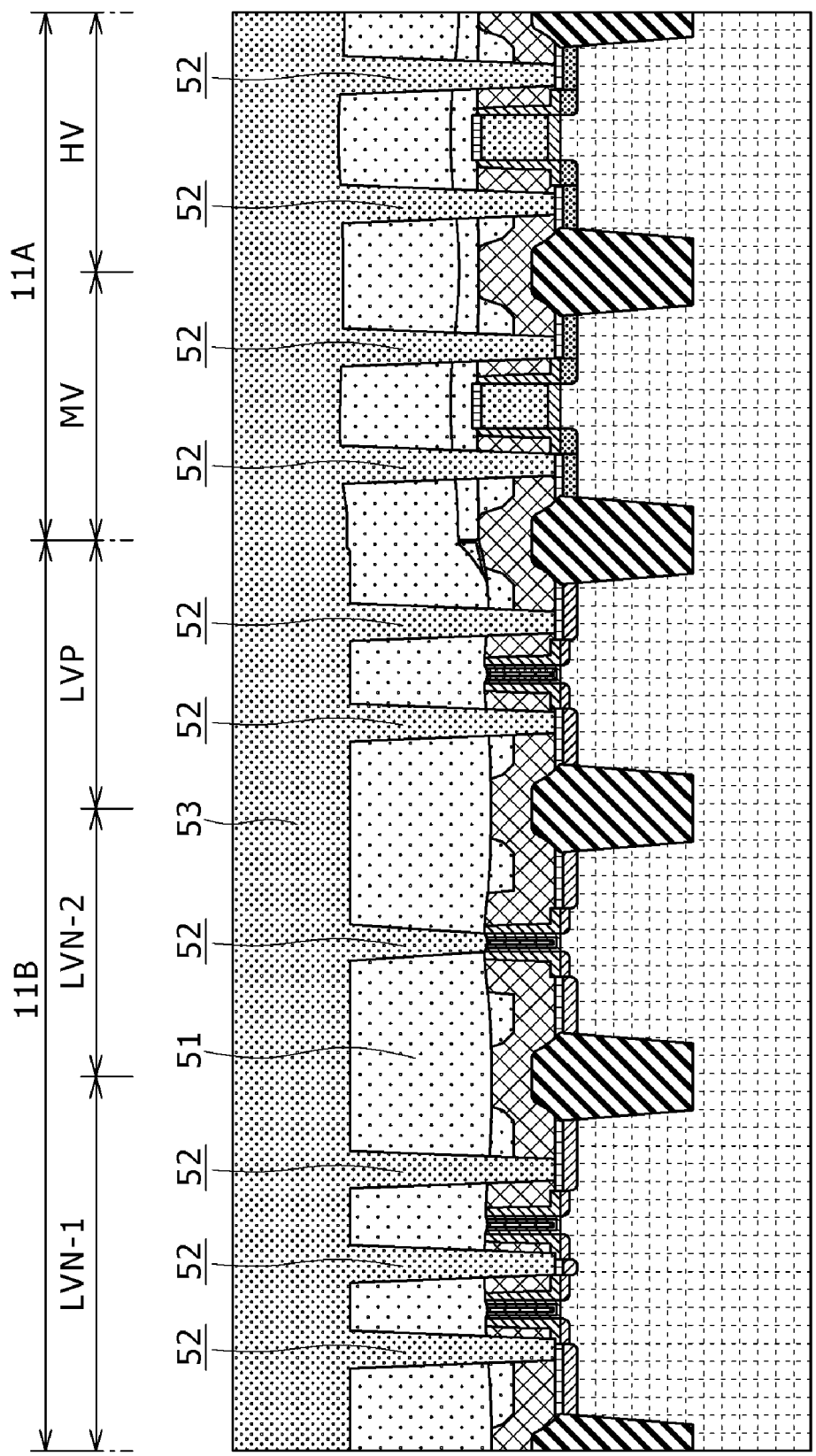

Next, as shown in FIG. 3X, a conductive film 53 is formed on the second interlayer insulating film 51 so as to be filled in each of the connection holes 52. The conductive film 53, for example, is made of tungsten (W). Also, the CVD method, for example, is used as a method of depositing the conductive film 53.

Figure 3Y:
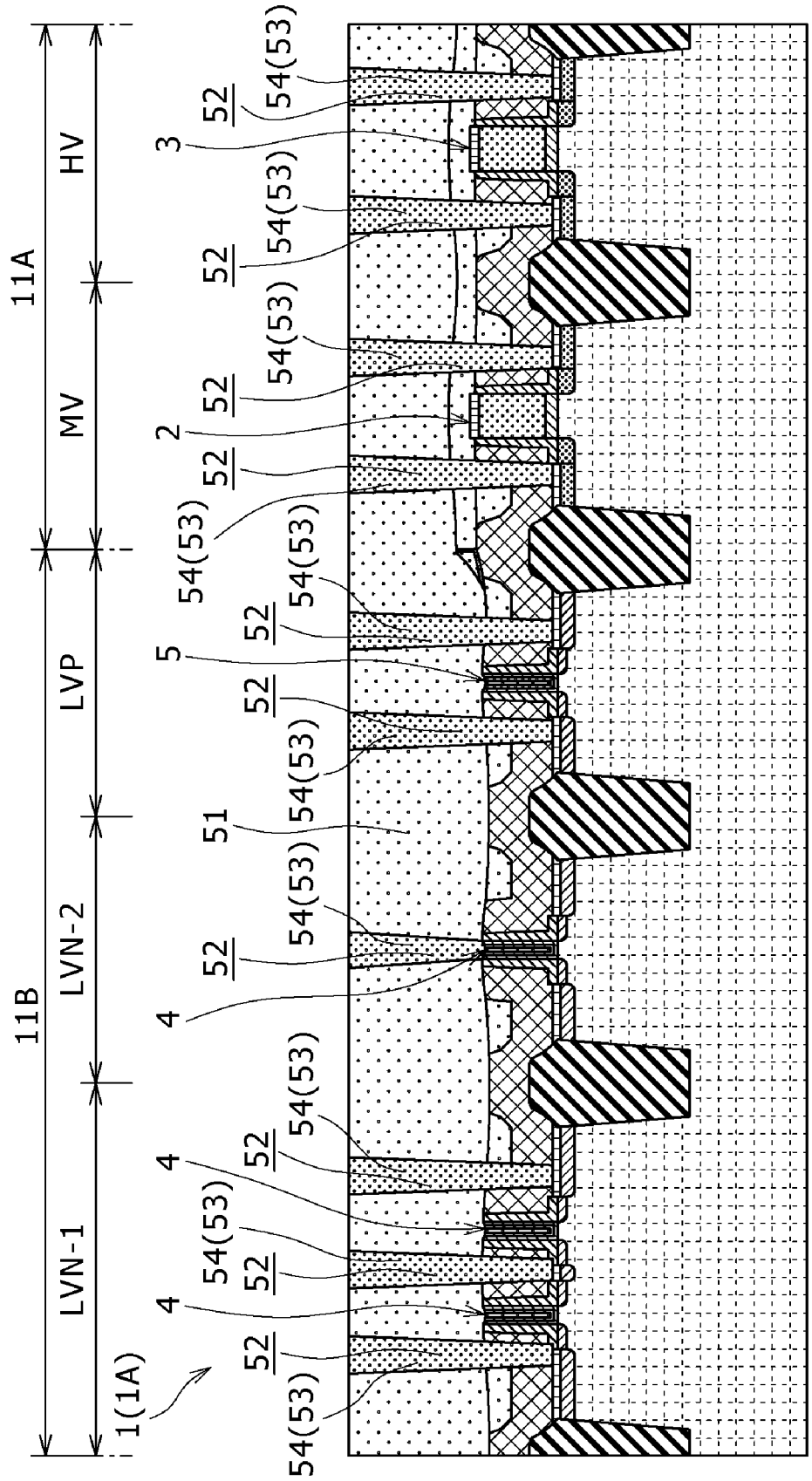

Next, as shown in FIG. 3Y, a portion of the conductive film 53 overlying the second interlayer insulating film 51 is removed away by utilizing either the CMP method or the dry etching method. As a result, each of the electrodes 54 is formed from the conductive film 53 left in each of the insides of the connection holes 52. Although not illustrated, subsequently, a wiring process is carried out.

As has been described, the middle-voltage voltage transistor (N-channel MISFET) 2 is formed in the region MV of the first region 11A, and the high-voltage voltage transistor (N-channel MISFET) 3 is formed in the region HV thereof. Also, the low-voltage transistors (N-channel MISFETs) 4 are densely formed in the region LVN-1 of the second region 11B, the low-voltage transistor (N-channel MISFET) 4 is formed in isolation in the region LVN-2 thereof, and the low-voltage transistor (P-channel MISFET) 5 is formed in the region LVP thereof. In such a manner, the semiconductor device 1(1A) is formed.

With the method of manufacturing the semiconductor device 1(1A) according to the first embodiment of the present invention, the middle-voltage transistor (N-channel MISFET) 2, and the high-voltage transistor (N-channel MISFET) 3 are formed as a first group of transistors in the region MV and the region HV, respectively, on the semiconductor substrate 11. In addition, the low-voltage transistors (N-channel MISFETs) 4, the low-voltage transistor (N-channel MISFET) 4, and the low-voltage transistor (P-channel MISFET) 5 are formed as a second group of transistors each having the lower operating voltage than that of each of the transistors in the first group in the region LAN-1, the region LVN-2, and the region LVP, respectively, on the semiconductor substrate 11. In addition thereto, the second gate electrodes 47 and 48 of the second group of transistors are formed, after the protective film 41 is formed so as to cover the silicide layer 40 formed on each of the first gate electrodes 15 of the first group of transistors. Therefore, during formation of the second gate electrodes 47 and 48 of the second group of transistors, for example, even when the polishing is performed to remove the extra portion of the metallic materials of which the second gate electrodes 47 and 48 are made, respectively, the slimming or disappearance of the silicide layer 40 formed on each of the first gate electrodes 15 is avoided owing to the presence of the protective film 41. As a result, the silicide layer 40 of the first group of transistors is protected. Therefore, an electrical resistance value of each of the first gate electrodes 15 can be reduced owing to the presence of the silicide layer 40.

Therefore, the following advantage is obtained. That is to say, the first group of transistors (the group of high-withstand voltage (high-voltage operation and middle-voltage operation)) transistors each having the first gate insulating film 13 made of a silicon oxide or a silicon oxynitride, and the first gate electrode 15 made of either polysilicon or amorphous silicon, and the second group of transistors (for example, the group of low-voltage operation transistors) having the second gate insulating films 43 formed from the high-permittivity (High-k) films, and the second gate electrodes 47 and 48 as the so-called metallic gate electrodes are formed on the same semiconductor substrate 11. As a result, it is possible to reduce the electrical resistance value of each of the first gate electrodes 15 of the first group of transistors.

Figure 4:
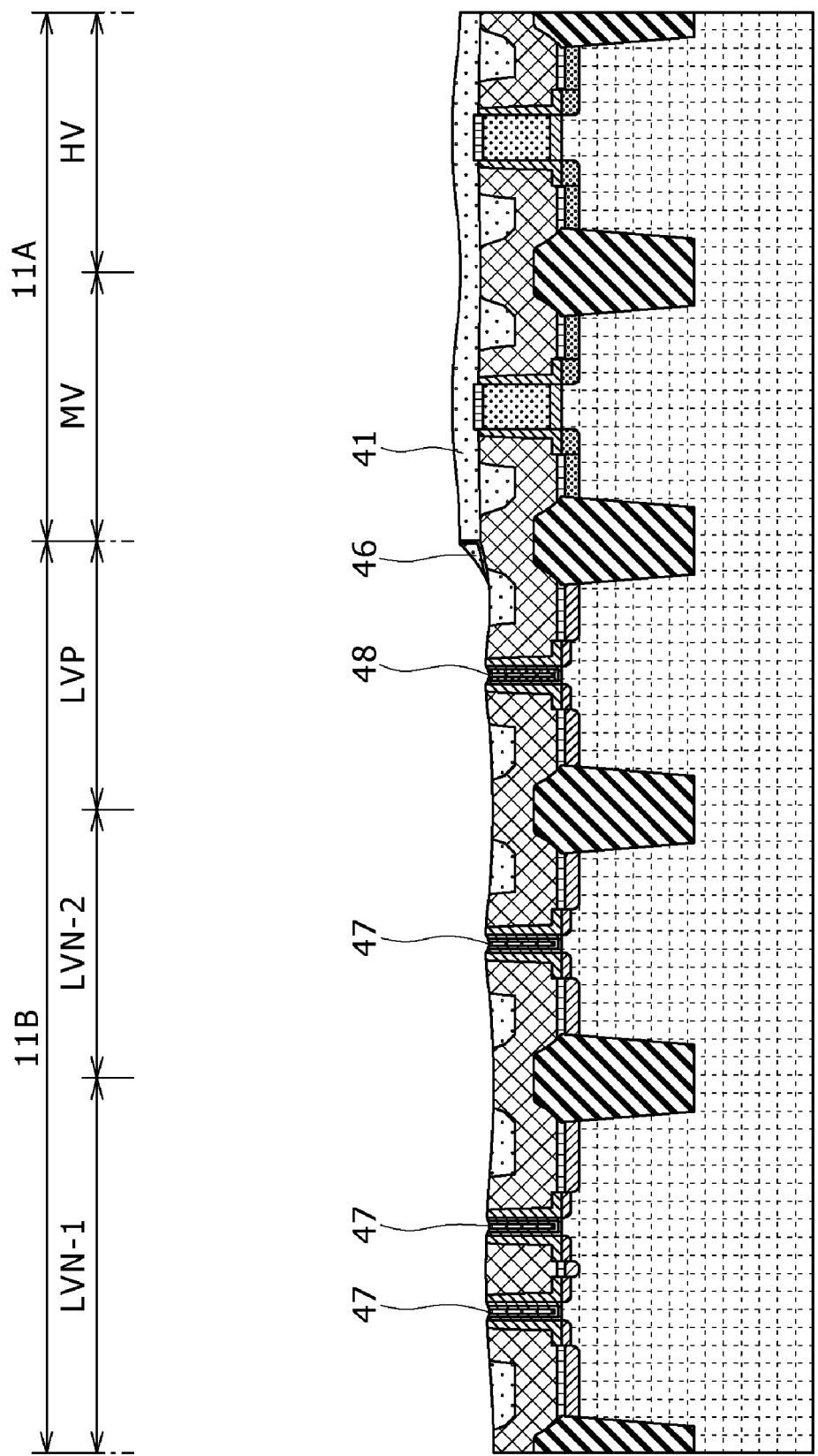
FIG. 4 is a cross sectional view of a schematic structure explaining a problem about a protective file.

With the manufacturing method of the first embodiment of the present invention, as shown in FIG. 4, a step is generated in an end portion of the protective film 41. For this reason, a part of the conductive film 46 is left in the end portion of the protective film 41 in the CMP process carried out for the conductive film 46 when the second gate electrodes 47 and 48 of the low-voltage transistors in the second region 11B are formed.

Next, a semiconductor device according to a second embodiment of the present invention in which the conductive film is prevented from being left in the end portion of the protective film in the CMP process carried out for the conductive film will be described in detail with reference to a schematically structural cross sectional view of FIG. 5.

Figure 5:
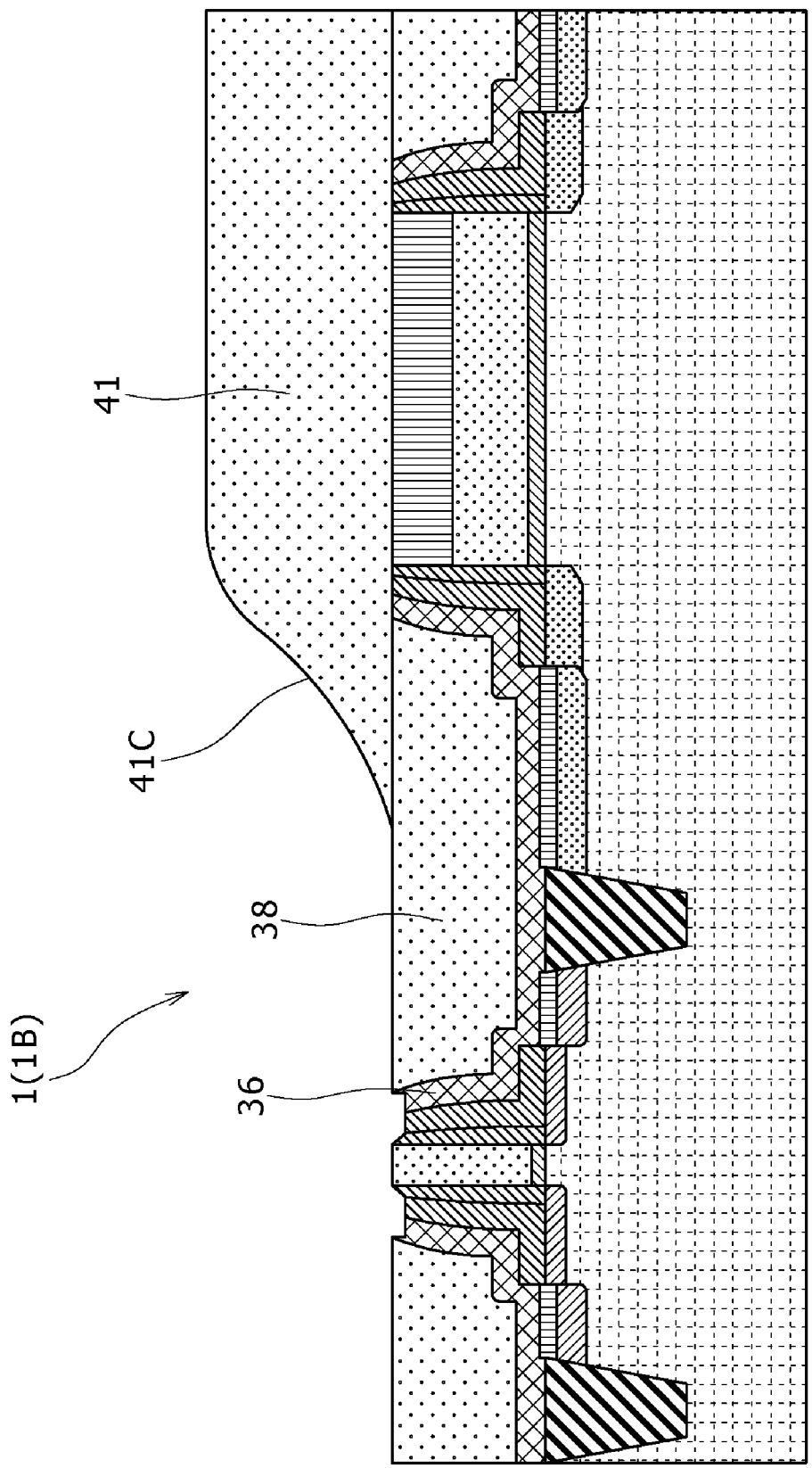
FIG. 5 is a cross sectional view showing a schematic structure of a main portion of a semiconductor device according to a second embodiment of the present invention.

As shown in FIG. 5, a semiconductor device 1(1B) of this embodiment is structured such that an end face of the protective film 41 is formed in the form of an inclined surface 41C in the semiconductor device 1(1A) described in the first embodiment. As a result, there is solved the problem about the step in the end portion of the protective film 41. In this inclined surface 41C, an inclined angle (average inclined angle) made with a surface of the base (the first interlayer insulating film 38 and the liner film 36) of the protective film 41 is preferably equal to or smaller than 70°, and is more preferably equal to or smaller than 45°. It is noted that this inclined surface 41C, for example, may be any of a surface having a gradually changing gradient, a curved surface or a flat surface. In a word, it is important that the step is removed in a portion rising from the surface of the base of the protective film 41. As a result, although not illustrated, even when the conductive material for formation of the gate electrodes is deposited to form the conductive film, and the resulting conductive film is removed by utilizing the CMP method, the conductive film is prevented from being left in the end portion of the protective film 41. Therefore, the short-circuit caused by the conductive material thus left can be prevented from occurring, and thus the reliability of the wiring can be improved.

A method of manufacturing the semiconductor device according to a second embodiment of the present invention will be described in detail with reference to cross sectional views, showing manufacturing processes, of FIGS. 6A to 6K. The manufacturing method according to the second embodiment of the present invention is an example of a method of manufacturing the semiconductor device 1(1B) described above.

As shown in FIG. 6A, the isolation regions 12 are formed in the semiconductor substrate 11 by performing the isolation process. The isolation regions 12 are formed for the purpose of isolating the region LVN-1, the region LVN-2 and the region LVP in which the low-voltage transistors (for example, the MISFETs) are formed, respectively, the region MV in which the middle-voltage transistor (for example, the MISFET) is formed, and the region HV in which the high-voltage transistor (for example, the MISFET) is formed from one another. Each of the regions MV and HV includes the region having the isolated pattern as well as the region in which the pattern density of the MISFET is dense. Also, the region HV in which the high-voltage transistor is intended to be formed, and the region MV in which the middle-voltage transistor is intended to be formed are given the generic name of the first region 11A. Also, the region LVN-1 in which the N-channel MISFETs as the low-voltage transistors are densely formed, the region LVN-2 in which the N-channel MISFET as the low-voltage transistor is formed in isolation, and the region LVP in which the P-channel MISFET as the low-voltage transistor is formed are given as the generic name of the second region 11B.

Next, the ion implantation for forming the P-type well region (not shown), the ion implantation for forming the buried layer (not shown) for blocking punch-through of the MISFET, and the ion implantation for adjusting the threshold voltage (Vth) are suitably performed for the region in which the N-channel MISFET is intended to be formed. As a result, the NMIS channel region is formed. In addition, the ion implantation for forming the N-type well region (not shown), the ion implantation for forming the buried layer (not shown) for blocking punch-through of the MISFET, and the ion implantation for adjusting the threshold voltage (Vth) are suitably performed for the region in which the P-channel MISFET is intended to be formed. As a result, a PMIS channel region is formed. At this time, the ion implantations may be carried out for the region HV having the high-voltage transistor formed therein, the region MV having the middle-voltage transistor formed therein, and the region LVN-1, the region LVN-2, and the region LVP which have the low-voltage transistors formed therein under the respective ion implantation conditions.

Figure 6B:
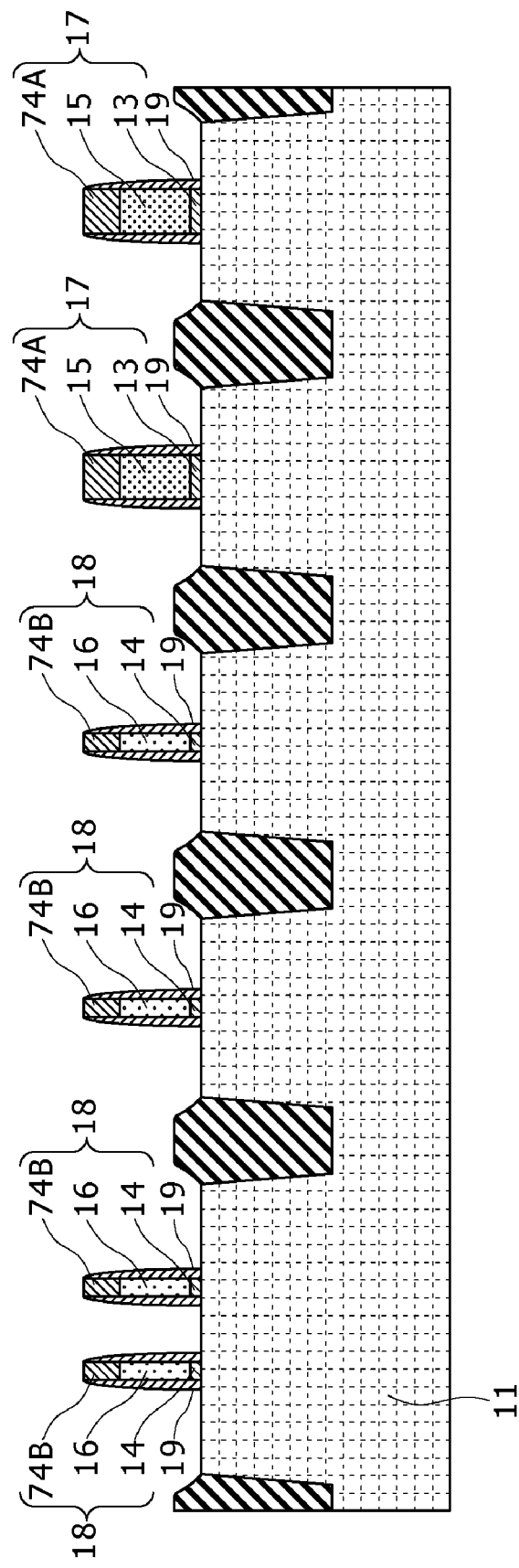

Next, as shown in FIG. 6B, by utilizing the processes in the manufacturing method described in the first embodiment with reference FIGS. 3B to 3F, the gate portions 17 are formed on the surfaces of the region HV and the region MV in the semiconductor substrate 11, respectively. Also, the dummy gate portions 18 are formed on the surfaces of the region LVN-1, the region LVN-2, and the region LVP in the semiconductor substrate 11, respectively. In this case, each of the gate portions 17 is composed of the gate insulating film 13, the first gate electrode 15, and the hard mask 74A from the lower side. Also, each of the dummy gate portions 18 is composed of the dummy gate insulating film 16, the dummy gate electrode 16, and the hard mask 74B from the lower side.

Next, offset spacers are formed. As shown in FIG. 3G, an insulating film for formation of the offset spacers is formed on the semiconductor substrate 11 by, for example, utilizing the LP-CVD method. In this case, this insulating film is formed so as to cover gate portions 17 each having the hard mask 74A, the first gate electrode 15, the gate insulating film 13, and the like, and dummy gate portions 18 each having the hard mask 74B, the dummy gate electrode 16, the dummy gate insulating film 14, and the like. This insulating film, for example, is formed from a silicon nitride film by utilizing the LP-CVD method. Next, the etch back is performed for the entire surface of the insulating film, thereby forming the offset spacers 19. The silicon nitride film deposited by utilizing the LP-CVD, for example, has a thickness of 6 to 10 nm.

Figure 6C:
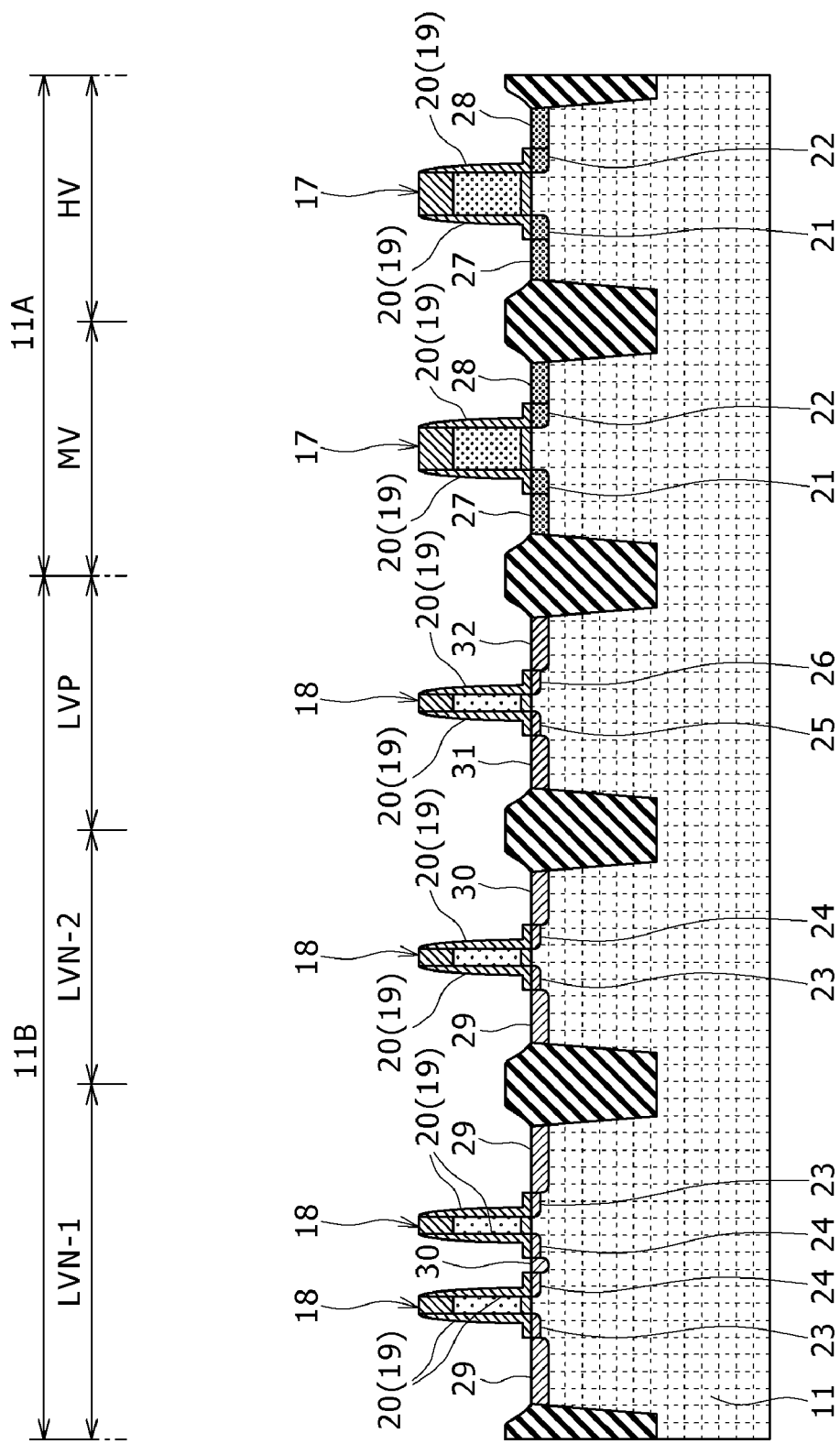

Next, as shown in FIG. 6C, by utilizing the processes in the manufacturing method described in the first embodiment with reference to FIGS. 3G to 3K, the extension regions 21 and 22 for the N-channel MISFET are formed on the surface side of the semiconductor substrate 11 and below the both sides of each of the gate portions 17 in the first region 11A, respectively. In addition, the extension regions 23 and 24 for the N-channel MISFETs, and the extension regions 25 and 26 for the P-channel MISFET are formed on the surface side of the semiconductor substrate 11 and below the both sides of the dummy gate portions 18 in the second region 11B, respectively.

Next, the sidewalls 20 are formed on the sidewalls of each of the gate portions 17 and on the sidewalls of each of the dummy gate portion 18 through corresponding ones of the offset spacers 19, respectively (refer to FIG. 6B).

Next, the source/drain regions 27 and 28 are formed on the surface side of the semiconductor substrate 11 and below the both sides of each of the gate portions 17 in the first region 11A through the corresponding ones of the extension regions 21 and 22, respectively. In addition, the source/drain regions 29 and 30 are formed on the surface side of the semiconductor substrate 11 and below the both sides of each of the dummy gate portions 18 of the region LVN-1, and the region LVN-2 in the second region 11B through the corresponding ones of the extension regions 23 and 24, respectively. Moreover, the source/drain regions 31 and 32 are formed on the surface side of the semiconductor substrate 11 and below the both sides of the dummy gate portion 18 of the region LVP in the second region 11B through the extension regions 25 and 26, respectively.

Figure 6D:
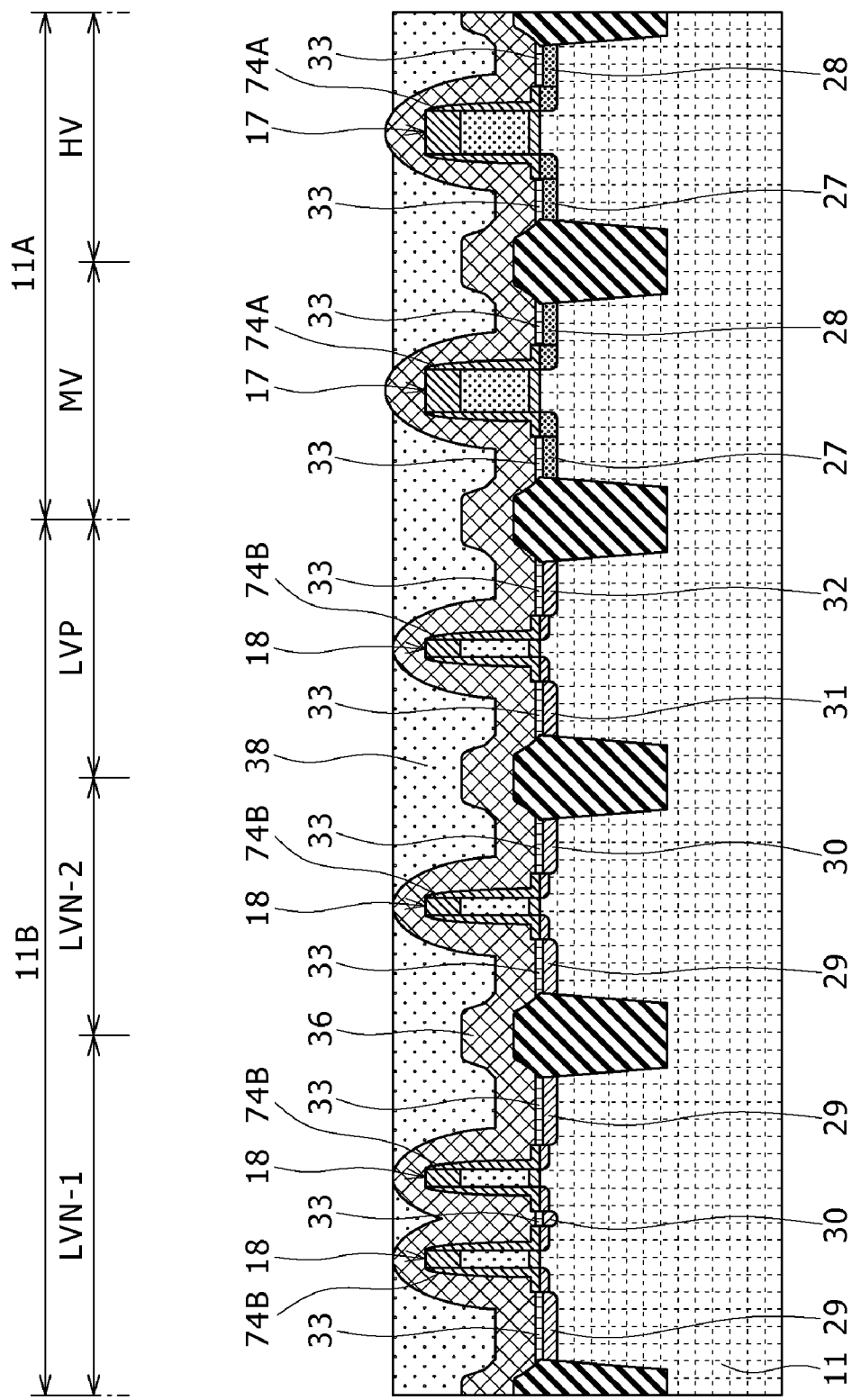

Next, as shown in FIG. 6D, the silicide layers 33 is formed on each of the source/drain regions 27 and 32 by utilizing the processes in the manufacturing method described in the first embodiment with reference to FIGS. 3L to 3O.

Next, the insulating film is formed over the entire surface of the semiconductor substrate 11 so as to cover the gate portions 17, the dummy gate portions 18, and the like. Firstly, the liner film 36 is formed as the insulating film over the entire surface of the semiconductor substrate 11. Next, the first interlayer insulating film 38 as a part of the insulating film is formed on the liner film 36. The first interlayer insulating film 38 is formed from the silicone oxide ($SiO_2$) film having a thickness of 100 to 200 nm by, for example, utilizing the HDP-CVD method.

Next, the first interlayer insulating film 38, and the liner film 36 which overlie the gate portions 17, and the dummy gate portions 18 are polished by utilizing the CMP method until the hard masks 74A, and the hard masks 74B are exposed. At this time, the lower portions of the hard masks 74A and 74B are left. It is noted that FIG. 6D shows a state of the middle of the CMP process.

Figure 6E:
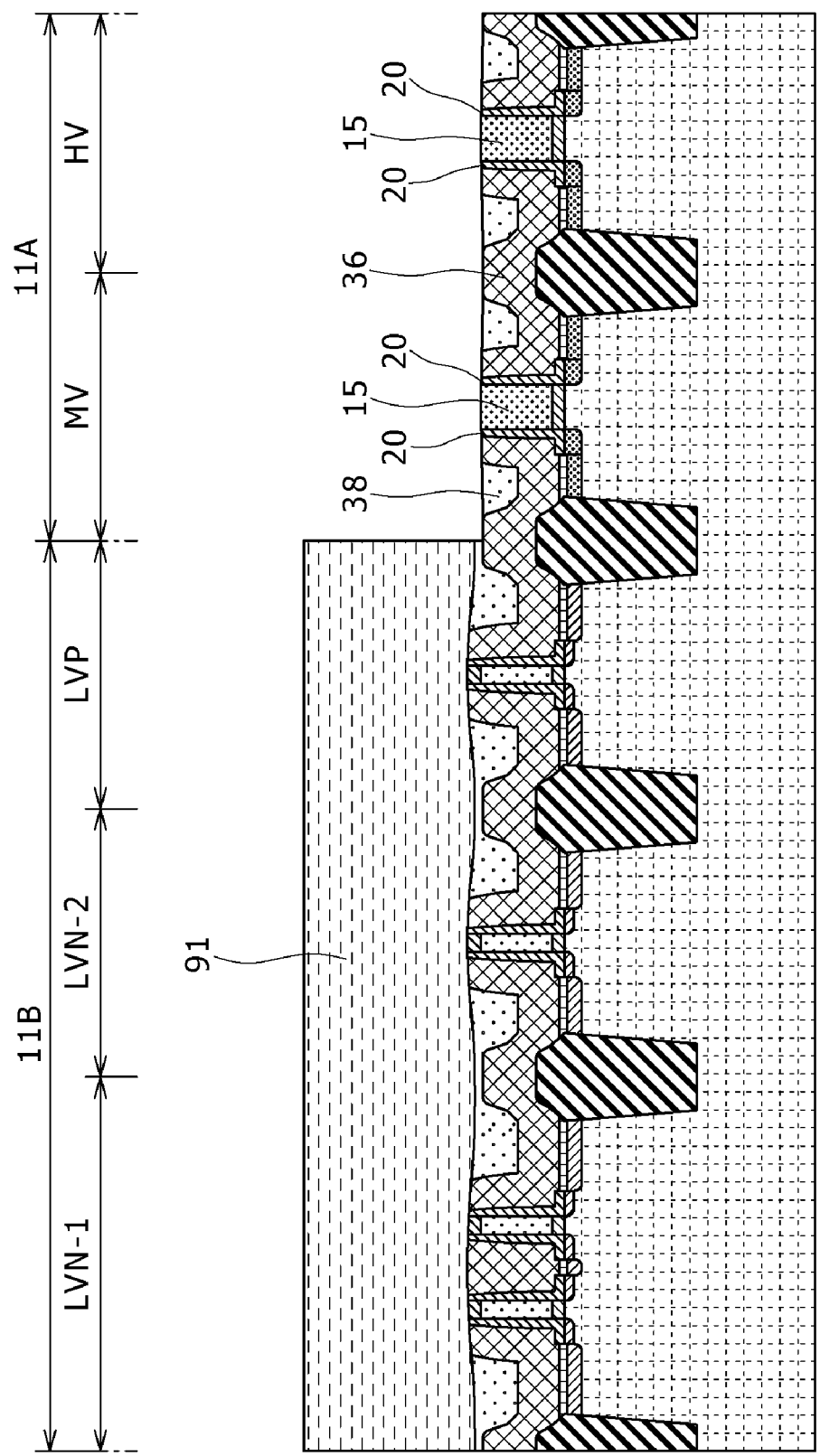

Next, as shown in FIG. 6E, the etching mask 91 is formed so as to cover the second region 11B by utilizing the resist application technique and the lithography technique. By using the etching mask 91, a portion of the hard mask 74A (refer to FIG. 6D) in the first region 11A is removed so as to expose the upper surfaces of the first gate electrodes 15, and parts of the first interlayer insulating film 38, the liner film 36 and the sidewalls 20 are removed. After that, the etching mask 91 is removed away.

Figure 6F:
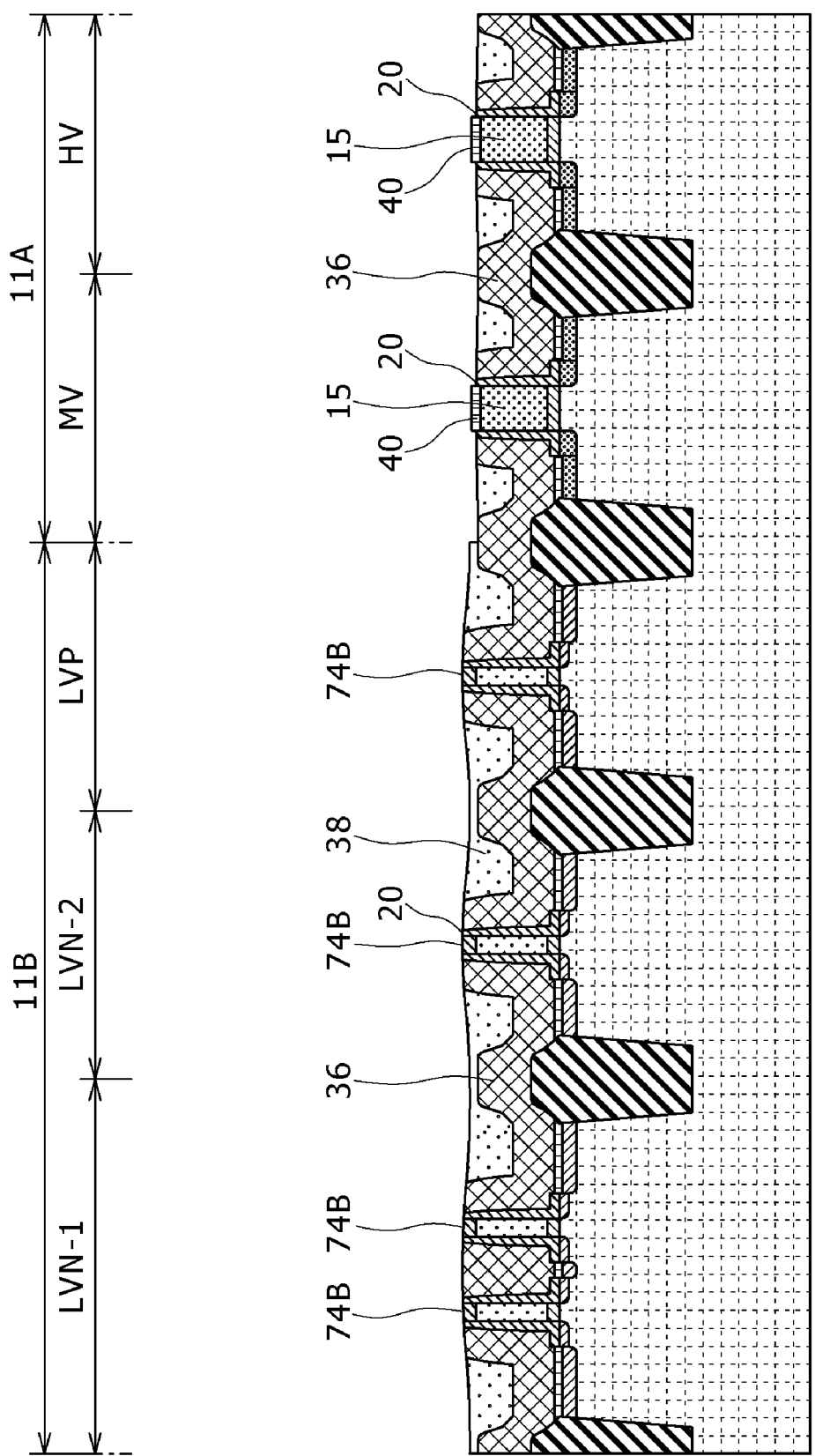

Next, as shown in FIG. 6F, silicide layer 40 is formed on each of the first gate electrodes 15. Firstly, a metallic layer for formation of a silicide layer is formed over the entire surface. In this case, as an example, the metallic layer is made of cobalt (Co). The cobalt layer is deposited to have a thickness of, for example, 6 to 8 nm by, for example, utilizing the sputtering method, thereby forming the metallic layer. Next, the RTA is performed at a temperature of 500 to 600° C., so that the metallic layer is reacted with only silicon (Si) of each of the first gate electrodes 15, thereby forming the silicide layer 40. Since the metallic layer is made of cobalt, the silicide layer 40 is made of cobalt silicide (for example, CoSi). After that, unreacted cobalt on the insulating films (such as the hard masks 74B, the sidewalls 20, the liner film 36, and the first interlayer insulating film 38) is removed by utilizing the wet etching method using a sulfuric acid ($H_2SO_4$) and hydrogen peroxide ($H_2O_2$). Subsequently, the heat treatment is performed, thereby forming the cobalt silicide ($CoSi_2$) layer having a low resistance value. The heat treatment, for example, is performed at a temperature of 650 to 850° C. for 30 seconds in the RTA. In addition, the metallic layer may also be made of either nickel (Ni) or nickel platinum (NiPt) instead of being made of cobalt (Co). In this case, the nickel silicide ($NiSi_2$) layer is formed. In any case, the temperature in the RTA can be suitably set.

Next, as shown in FIG. 6G, the protective film 41 for protecting the silicide layer 40 described above is formed by utilizing the process in the manufacturing method described above in the first embodiment with reference to FIG. 3R. The protective film 41 is formed from either a silicon oxide ($SiO_2$) film or a silicon nitride (SiN) film, by, for example, utilizing the plasma CVD method to have the thickness of 10 to 100 nm. Since the protective film 41 can be deposited at a temperature of 450° C. or less, the damage is prevented from being incurred on the silicide layers 33 and 40 which are previously formed.

Next, an etching mask 80 is formed so as to cover the first region 11A by utilizing the resist application technique and the lithography technique. Thus, the second region 11B is not covered with this etching mask 80.

Figure 6H:
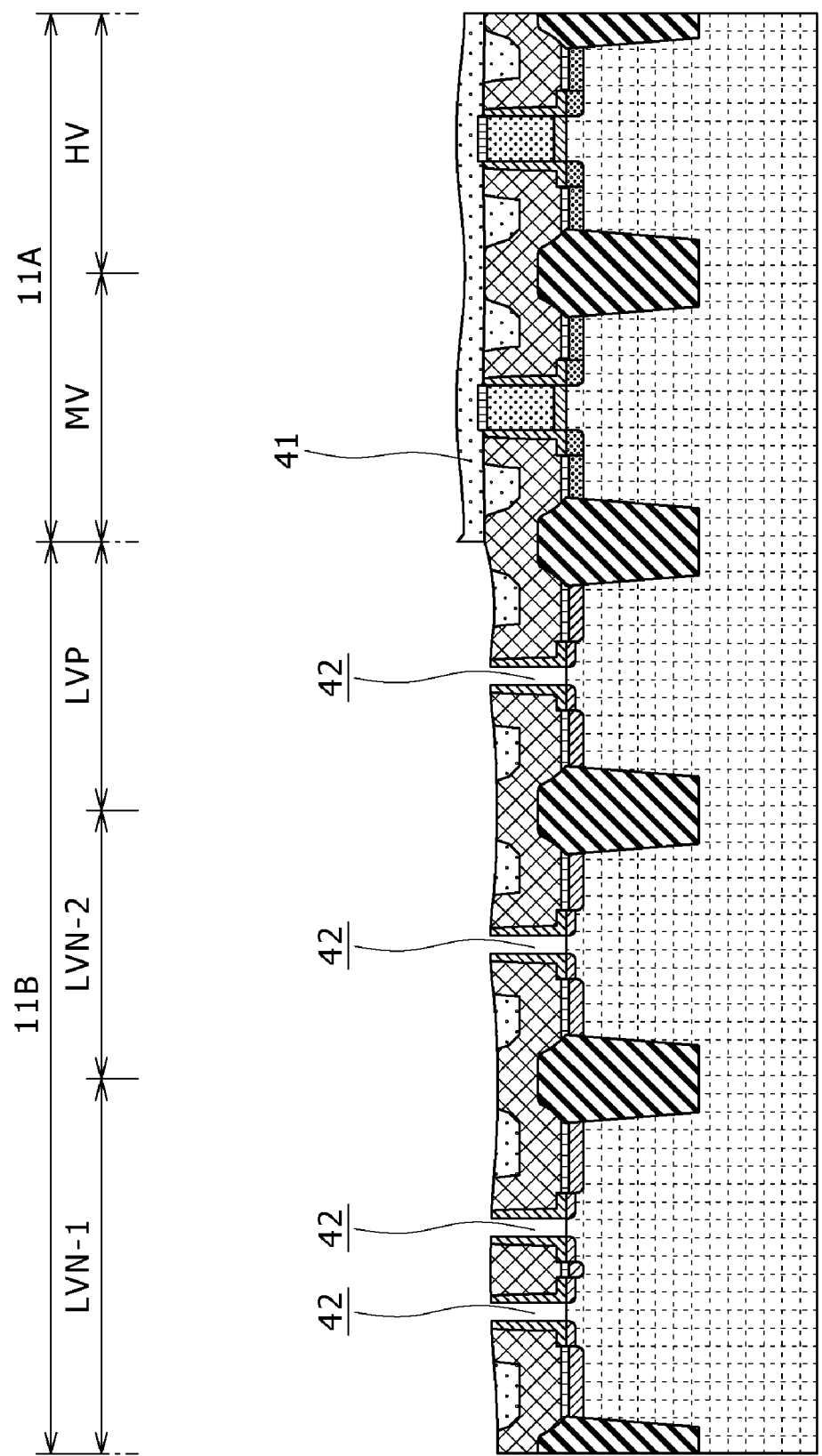

Next, as shown in FIG. 6H, by utilizing the process in the manufacturing method described in the first embodiment with reference to FIG. 3S, a portion of the protective film 41 (refer to FIG. 6G) in the second region 11B is removed with the etching mask 80 (refer to FIG. 6G) by utilizing the dry etching method. An example of the conditions in the dry etching method is described as follows: octafluoro cyclobutane ($C_4F_8$), oxygen ($O_2$) and argon (Ar) are used as etching gas, flow rates of $C_4F_4$, $O_2$ and Ar are set at 9 cm³/min., 5 cm³/min., and 250 cm³/min., respectively, a pressure of an etching ambient atmosphere is set at 4.1 Pa, a power (plasma output) of an etching system is set at 1,500 W, and a substrate temperature is set at 20° C. Subsequently, the hard masks 74B, and the dummy gate electrodes 16 (refer to FIG. 6C) are removed by, for example, utilizing the dry etching method. Moreover, the dummy gate insulating films 14 (refer to FIG. 6C) are removed by utilizing the wet etching method using a dilute hydrofluoric acid, thereby forming the trenches 42 for gate formation, respectively. At this time, the first region 11A is covered with the protective film 41. The etching mask 80 described above is removed before the wet etching is performed. In this case, an end face of the protective film 41 becomes a step because it has approximately a vertical shape.

Figure 6I:
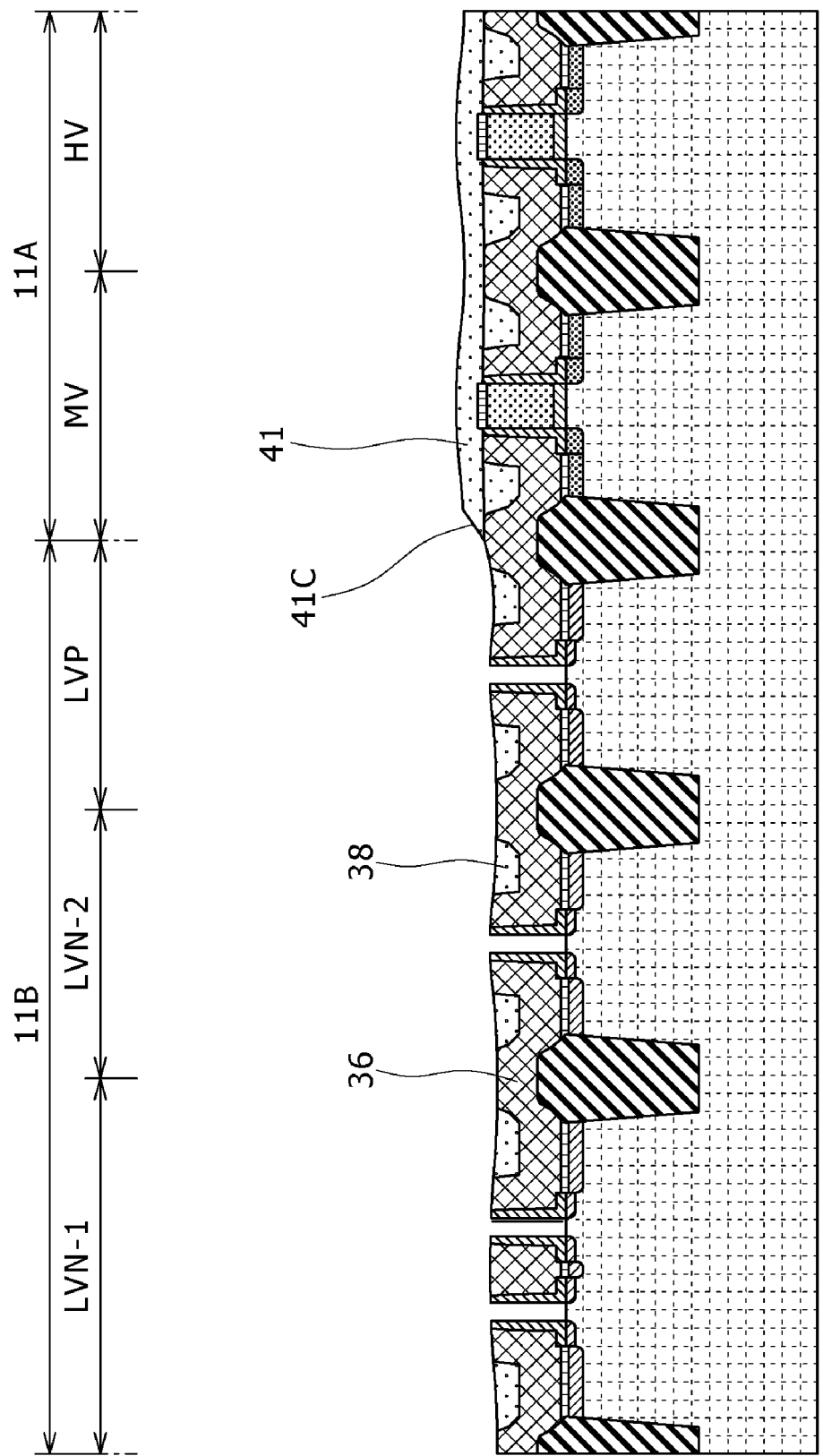

Next, as shown in FIG. 6I, the end face of the protective film 41 is formed in the form of the inclined surface 41C by, for example, utilizing the CMP method, thereby removing the step generated in the end face of the protective film 41. In this inclined surface 41C, the inclined angle (average inclined angle) made with the surface of the base (the first interlayer insulating film 38 and the liner film 36) of the protective film 41 is preferably equal to or smaller than 70°, and is more preferably equal to or smaller than 45°. It is noted that the inclined surface 41C, for example, may be any of the surface having a gradually changing gradient, the curved surface or the flat surface. In a word, it is important that the step is removed in the portion rising from the surface of the base of the protective film 41. With regard to an example of the conditions in the CMP method, a polishing pad made of an urethane foam is used as a polishing pad, a polishing pressure is set at 300 hPa, a rotating speed of a machine platen is set at 100 rpm, and a rotating speed of a polishing head is set at 107 rpm. Also, a ceria system slurry is used as a polishing slurry, a slurry flow rate is set at 200 cm$^3$/min., and a slurry temperature is set in the range of 25 to 30° C.

Next, as shown in FIG. 6J, the second gate insulating film 43 is formed on each of the inner surfaces of the trenches 42 for gate formation by utilizing the process in the manufacturing method described in the first embodiment with reference to FIG. 3T. Next, the work function controlling films 44 and 45 for determining work functions are formed on the inner surfaces of the trenches 42 for gate formation through the second gate insulating film 43.

Firstly, the metal or metallic compound layer having a work function suitable for the N-channel MISFET is deposited by utilizing the film deposition method such as the ALD method or the CVD method. In this embodiment, for example, the hafnium silicide (HfSi$_x$) layer is deposited to have a thickness of, for example, about 10 to about 100 nm, thereby forming the work function controlling film 44. Subsequently, there is removed the portion of the work function controlling film 44 overlying the region LVP in the second region 11B, and the first region 11A. As a result, the remaining work function controlling film 44 is left so as to overlie the region LVN-1 and the region LVN-2 in the second region 11B.

Next, the metal or metallic compound layer having a work function suitable for the P-channel MISFET is deposited by utilizing the film deposition method such as the ALD method or the CVD method. In this embodiment, for example, a titanium nitride (TiN) layer is deposited to have a thickness of, for example, about 5 to about 50 nm, thereby forming the work function controlling film 45. Subsequently, there is removed the portion of the work function controlling film 45 overlying the region LVN-1 and the region LVN-2 in the second region 11B, and the first region 11A. As a result, the remaining work function controlling film 45 is left so as to overlie the region LVP in the second region 11B. For example, a ruthenium (Ru) layer or the like can also be deposited for the P-channel MISFET.

Any of the work function controlling films 44 and 45 may be formed first.

Next, the conductive film 46 is formed as a conductive material over the entire surface so as to be filled in each of the insides of the trenches 42 for gate formation. The conductive material 46, for example, is made of the metallic material having an electrical resistance value which is smaller than that of each of the work function controlling films 44 and 45. In this example, as an example, the conductive material 46 is made of tungsten (W).

Figure 6K:
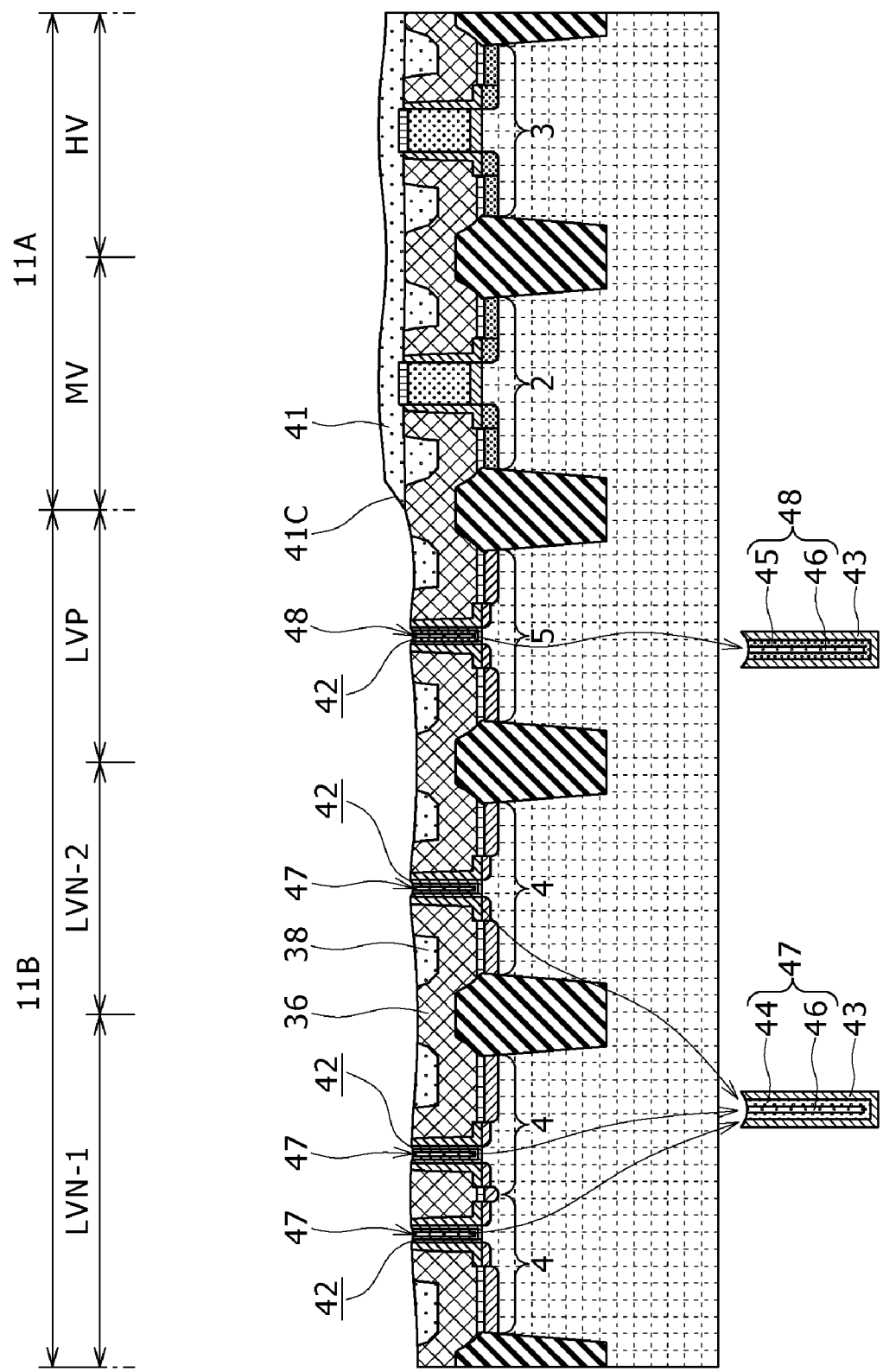

Next, as shown in FIG. 6K, by utilizing the process in the manufacturing method described in the first embodiment with reference to FIG. 3U, there is removed the extra conductive film 46 (refer to FIG. 6J) other than the conductive film 46 filled in each of the insides of the trenches 42 for gate formation. This removal process is carried out by, for example, utilizing the CMP method. In the phase of utilizing the CMP method, the liner film 36, the first interlayer insulating film 38, the protective film 41, and the like serve as the polishing stopper. As a result, the second gate electrode 47 of each of the low-voltage transistors (N-channel MISFETs) in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) in the second region 11B is formed from the conductive film 46 and the work function controlling film 45 which are left in the corresponding one of the trenches 42 for gate formation. At this time, since the end face of the protective film 41 is formed in the form of the inclined surface 41C, the conductive film 46 is prevented from being left in the inclined surface 41C.

Next, the processes in and after the process described in the first embodiment with reference to FIG. 3V are carried out.

With the method of manufacturing the semiconductor device 1(1B) according to the second embodiment of the present invention, the middle-voltage transistor (N-channel MISFET) 2, and the high-voltage transistor (N-channel MISFET) 3 are formed as a first group of transistors in the region MV and the region HV, respectively, on the semiconductor substrate 11. In addition, the low-voltage transistors (N-channel MISFETs) 4, the low-voltage transistor (N-channel MISFET) 4, and the low-voltage transistor (P-channel MISFET) 5 are formed as a second group of transistors each having the lower operating voltage than that of each of the transistors in the first group in the region MV and the region HV, respectively, on the semiconductor substrate 11. In addition thereto, the second gate electrodes 47 and 48 of the second group of transistors are formed after the protective film 41 is formed so as to cover the silicide layer 40 formed on each of the first gate electrodes 15 of the first group of transistors. Therefore, during formation of the second gate electrodes 47 and 48 of the second group of transistors, for example, even when the polishing is performed to remove the extra portion of the metallic materials of which the second gate electrodes 47 and 48 are made, respectively, the slimming or disappearance of the silicide layer 40 formed on each of the first gate electrodes 15 is avoided owing to the presence of the protective film 41. As a result, the silicide layer 40 of the first group of transistors is protected. Therefore, the electrical resistance value of each of the first gate electrodes 15 can be reduced owing to the presence of the silicide layer 40.

Therefore, the following advantage is obtained. That is to say, the first group of transistors (the group of high-withstand voltage (high-voltage operation and low-voltage operation)) transistors each having the first gate insulating film 13 made of a silicon oxide or a silicon oxynitride, and the first gate electrode 15 made of either polysilicon or amorphous silicon, and the second group of transistors (for example, the group of low-voltage operation transistors) having the second gate insulating films 43 as the high-permittivity (High-k) films, and the second gate electrodes 47 and 48 as the so-called metallic gate electrodes are formed on the same semiconductor substrate 11. As a result, it is possible to reduce the electrical resistance value of each of the first gate electrodes 15 of the first group of transistors.

Moreover, since the end face of the protective film 41 is formed in the form of the inclined surface 41C, the conductive film 46 is prevented from being left in the inclined surface 41C. Therefore, it is possible to solve the problem about the short-circuit which may occur due to the conductive film 46 left.

Next, a change of the second embodiment described above will be described in detail with reference to cross sectional views, showing manufacturing processes, of FIGS. 7A and 7B.

As shown in FIG. 7A, by utilizing the process in the manufacturing method described in the second embodiment with reference to FIG. 6G, there is formed the protective film 41 for protecting the silicide layer 40 formed on each of the first gate electrodes 15 in the first region 11A. Also, an etching mask 80 is formed on the protective film 41 in the first region 11A.

Next, as shown in FIG. 7B, a portion of the protective film 41 in the second region 11B is removed by using the etching mask 80. In this case, this portion of the protective film 41 is removed by, for example, utilizing an isotropic etching method. By utilizing the isotropic etching method, the end face of the protective film 41 is formed in the form of the inclined surface 41C. The processes after this process are the same as those in the second embodiment.

The conditions, in the isotropic dry etching method, for the protective silicon oxide film are described as follows. As an example, methane tetrafluoride ($CF_4$) gas and oxygen ($O_2$) gas are used as etching gas, a $CF_4$ flow rate is set at 50 $cm^3$/min., and an $O_2$ flow rate is set as 20 $cm^3$/min. Also, a pressure of an etching ambient atmosphere is set at 20.7 Pa, a power (plasma output) of an etching system is set at 500 W, and a substrate temperature is set at 20° C.

In this change of the second embodiment, the CMP process for forming the end face of the protective film 41 in the form of the inclined surface 41C becomes unnecessary because the end face of the protective film 41 can be formed in the form of the inclined surface 41C by utilizing the isotropic etching method. As a result, the number of processes is reduced as compared with that in the second embodiment, and becomes identical to that in the first embodiment. Moreover, it is possible to obtain the same effects as those in the second embodiment.

Next, a semiconductor device according to a third embodiment of the present invention will be described in detail hereinafter with reference to a schematically structural cross sectional view of FIGS. 8, 9A and 9B.

Figure 8:
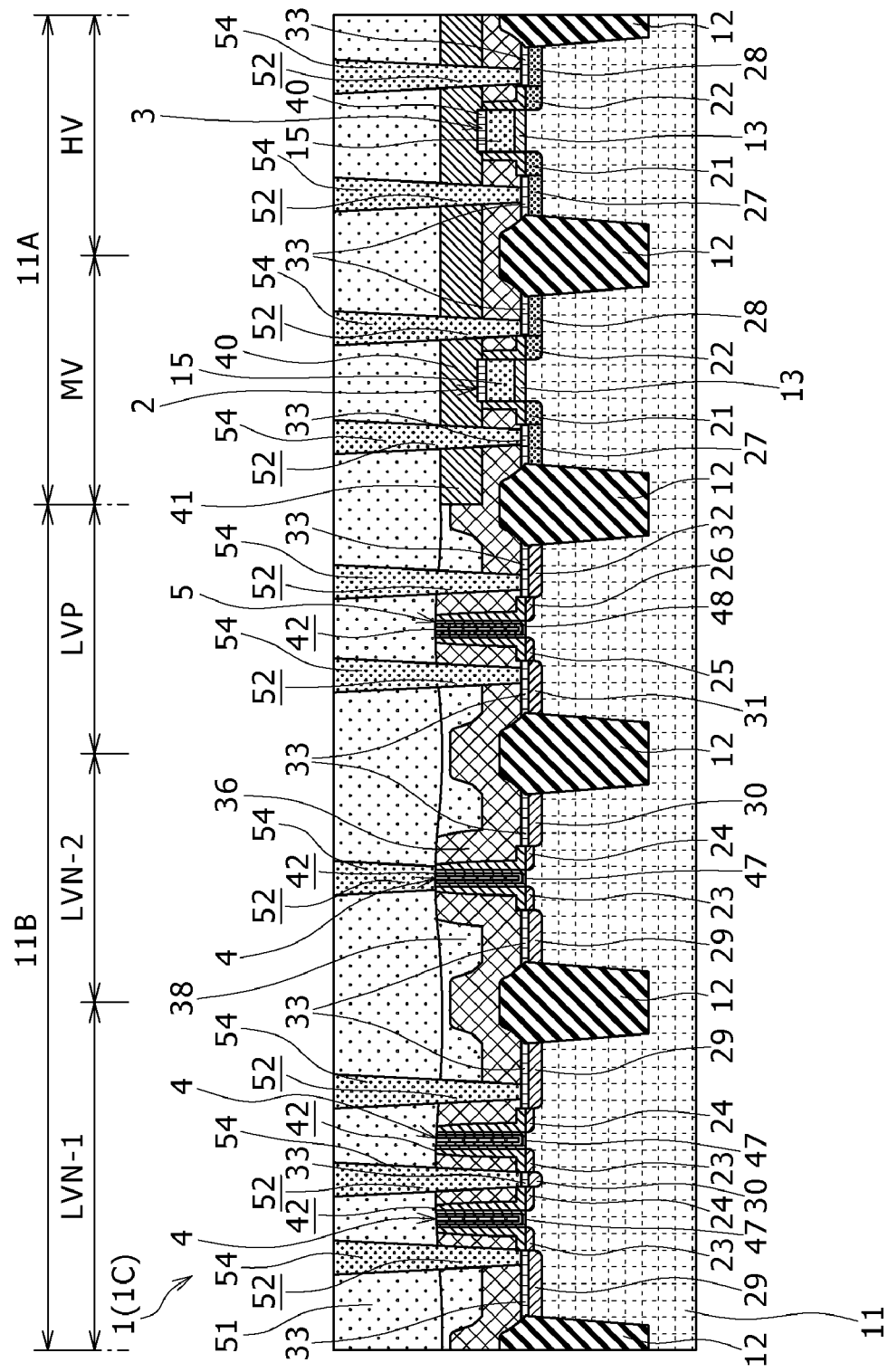
FIG. 8 is a cross sectional view schematically showing a structure of a semiconductor device according to a third embodiment of the present invention.
Figure 9A:
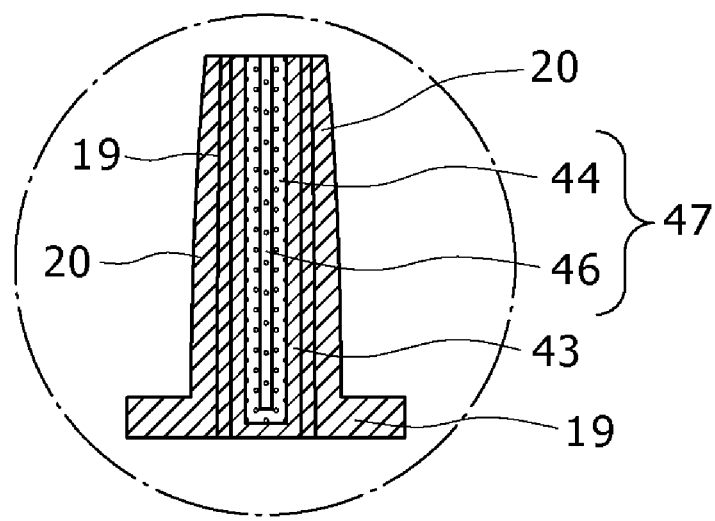
FIGS. 9A and 9B are respectively enlarged sectional views of the semiconductor device shown in FIG. 8.
Figure 9B:
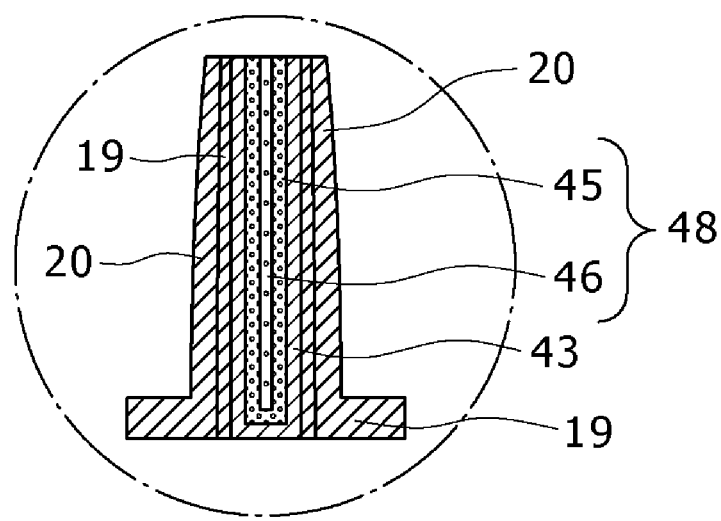

As shown in FIGS. 8, 9A and 9B, the isolation regions 12 are formed in the semiconductor substrate 11. In this case, as an example, the region LVN-1, the region LVN-2, and the region LVP having low-voltage transistors (such as MISFETs) formed therein, respectively, the region MV having a middle-voltage transistor (such as a MISFET) formed therein, and the region HV having a high-voltage transistor (such as a MISFET) formed therein are isolated by these isolation regions 12. Each of the regions MV and HV includes the region having the isolated pattern as well as the region in which a pattern density of the MISFET is dense. In addition, both the region HV as the formation region of the high-voltage transistor, and the region MV as the formation region of the middle-voltage transistor are given the generic name of the first region 11A. Also, the region LVN-1 in which the N-channel MISFETs as the low-voltage transistors are densely formed, the region LVN-2 in which the N-channel MISFET as the low-voltage transistor is formed in isolation, and the region LVP in which the P-channel MISFET as the low-voltage transistor is formed are given as the generic name of the second region 11B.

In addition, there are suitably performed the ion implantation for forming the P-type well region (not shown) in the region in which the N-channel MISFET is intended to be formed, the ion implantation for forming the buried layer (not shown) for blocking punch-through of the MISFET, and the ion implantation for adjusting the threshold voltage (Vth). As a result, the NMIS channel region is formed. In addition, there are suitably performed the ion implantation for forming the N-type well region (not shown) in the region in which the P-channel MISFET is intended to be formed, the ion implantation for forming the buried layer (not shown) for blocking punch-through of the MISFET, and the ion implantation for adjusting the threshold voltage (Vth). As a result, the PMIS channel region is formed. It is noted that the channel regions may be formed in the region HV having the high-voltage transistor formed therein, the region MV having the middle-voltage transistor formed therein, and the region LVN-1, the region LVN-2, and the region LVP having the low-voltage transistors formed therein, respectively.

The gate insulating films 13 are formed on the surfaces of the region HV and the region MV in the semiconductor substrate 11, respectively. The high-voltage transistor and the middle-voltage transistor have the thick gate insulating films, respectively, in many cases. Each of the gate insulating film 13, for example, is formed from a silicon oxide film, and is also formed to have a thickness of 2 to 4 nm. The first gate electrodes 15 are formed on the gate insulating films 13, respectively. Each of the first gate electrodes 15, for example, is made of either polysilicon or amorphous silicon, and is formed to be 20 to 50 nm lower than each of the second gates 47 and 48 formed in the second region 11B The dummy gate insulating films and the dummy gate electrodes (not shown) are temporarily formed on the region LVN-1, the region LVN-2, and the region LVP in the semiconductor substrate 11, respectively. Also, the offset spacers 19 are formed on each of the sidewalls of the dummy gate electrodes, and each of the sidewalls of the first gate electrodes 15, respectively. The thickness of each of the offset spacers 19, for example, is in the range of 6 to 10 nm.

Also, the extension regions 21 and 22 are formed on the surface side of the semiconductor substrate 11 and below the both sides of each of the first gate electrodes 15, respectively. In addition, the extension regions 23 and 24 of the N-channel MISFET are formed on the surface side of the semiconductor substrate 11 and below the both sides of each of the dummy gate electrodes of the region LVN-1 and the region LVN-2, respectively. Moreover, the extension regions 25 and 26 of the P-channel MISFET are formed on the surface side of the semiconductor substrate 11 and below the both sides of the dummy gate electrode of the region LVP, respectively.

Moreover, the sidewalls 20 are formed on the side portions of each of the first gate electrodes 15, and each of the dummy gate electrodes through the offset spacers 19, respectively.

Also, the source/drain regions 27 and 28 are formed on the surface side of the semiconductor substrate 11 and below the both sides of each of the first gate electrodes 15 through the corresponding ones of the extension regions 21 and 22, respectively. In addition, the source/drain regions 29 and 30 are formed on the surface side of the semiconductor substrate 11 and below the both sides of each of the dummy gate electrodes of the region LVN-1 and the region LVN-2 through the corresponding ones of the extension regions 23 and 24 of the N-channel MISFETs, respectively. Also, the source/drain regions 31 and 32 are formed on the surface side of the semiconductor substrate 11 and below the both sides of the dummy gate electrodes of the region LVP through the extension regions 25 and 26 of the P-channel MISFET, respectively.

The silicide layer 33 is formed on each of the source/drain regions 27 to 32. The silicide layer 33, for example, is made of cobalt silicide ($CoSi_2$), nickel silicide ($NiSi_2$), nickel platinum silicide, or the like.

Also, the insulating film is formed so as to partially cover the first gate electrodes 15, the dummy gate electrodes, and the like. The insulating film is composed of the liner film 36 formed over the entire surface of the semiconductor substrate 11, and the first interlayer insulating film 38 formed on the liner film 36.

The liner film 36, for example, is formed from a silicon nitride (SiN) film, and serves to apply a stress to corresponding one of the channel portions of the transistors. For example, the liner film having a tensile stress is used in the N-channel MISFET for the purpose of increasing the mobility in the channel. Also, the liner film having a compressive stress is used in the P-channel MISFET for the purpose of increasing the mobility in the channel. In addition, the liner films 36 may be individually formed for the N-channel MISFET and the P-channel MISFET, respectively. Also, the stress of the liner film 36 can be normally determined depending on the film deposition conditions.

The first interlayer insulating film 38, for example, is formed from a silicon oxide ($SiO_2$) film formed by utilizing the HDP-CVD method. Also, the surfaces of the first interlayer insulating film 38 and the liner film 36 in the first region 11A having the first gate electrode 15 formed therein are formed to be lower than the surfaces of the first interlayer insulating film 38 and the liner film 36 in the second region 11B so as to expose each of the upper surfaces of the first gate electrodes 15. Thus, each of the surfaces of the first interlayer insulating film 38 and the liner film 36 in the first region 11A is formed at the same level as that of each of the upper surfaces of the first gate electrodes 15, or, for example, is formed to have the height tolerance of about ±20 nm with respect to each of the upper surfaces of the first gate electrodes 15.

The silicide layer 40 is formed on each of the upper surfaces of the first gate electrodes 15. The silicide layer 40, for example, is made of cobalt silicide ($CoSi_2$), nickel silicide ($NiSi_2$), nickel platinum silicide, or the like.

The protective film 41 for protecting the silicide layer 40 is formed so as to overlie the surfaces of the first interlayer insulating film 38 and the liner film 36 in the first region 11A. The protective film 41, for example, is formed from either a silicon oxide ($SiO_2$) film or a silicon nitride (SiN) film. Also, the surface of a portion of the protective film 41 in the first region 11A is formed approximately at the same height as that of each of the surfaces of the first interlayer insulating film 38 and the liner film 36 in the second region 11B, for example, is formed to have a height tolerance of about ±20 nm with respect to each of the surfaces of the first interlayer insulating film 38 and the liner film 36 in the second region 11B. The film deposition temperature at this time is set at 450° C. or less. As a result, even when the protective film 41 is formed, the damage is prevented from being incurred on each of the silicide layers 33 and 40 which are previously formed. In addition, the surface of a portion of the protective film 41 in the first region 11A is formed approximately at the same height as that of each of the surfaces of the first interlayer insulating film 38 and the liner film 36 in the second region 11B, which results in that the wirings, the electrodes and the like can be precisely formed on the upper surfaces of the protective film 41, and the first interlayer insulating film 38 and the liner film 36.

The trenches 42 for gate formation are formed so as to extend completely through the first interlayer insulating film 38 and the liner film 36 in the second region 11B by removing the dummy gate electrodes and the dummy gate insulating films.

The second gate insulating film 43 is formed on each of the inner surfaces of the trenches 42 for gate formation. The second gate insulating film 43 is formed so that the capacity per unit area obtained based on the second gate insulating film 43 is smaller than that obtained based on each of the first gate insulating films 13 in the first region 11A. The second gate insulating film 43 is formed from a high-permittivity film. The high-permittivity film, for example, is made of an oxide, an oxysilicate, an oxynitride or a silicon oxynitride of hafnium, zirconium, lanthanum, yttrium, tantalum or aluminum. Specifically, the high-permittivity film, for example, is made of a hafnium oxide ($HfO_2$), a zirconium oxide ($ZrO_2$), a lanthanum oxide ($LaO_3$), a yttrium oxide ($Y_2O_3$), a tantalum oxide ($Ta_2O_5$), an aluminum oxide ($Al_2O_3$), a hafnium silicate ($HfSiO_x$), a zirconium silicate ($ZrSiO_x$), a lanthanum silicate ($LaSiO_x$), a yttrium silicate ($YSiO_x$), a tantalum silicide ($TaSiO_x$), an aluminum silicate ($AlSiO_x$), a zirconium titanate ($ZrTiO_x$), a hafnium aluminum oxide ($HfAlO_x$), or a hafnium zirconium oxide ($HfZrO_x$). Or, the high-permittivity film is made of a nitride of any of these compounds. For example, as a silicon oxynitride, there are nitrides of the metallic silicate described above such as a hafnium silicon oxynitride (HfSiON) or a zirconium silicon oxynitride (ZrSiON). The relative permittivity of the high-permittivity film fluctuates depending on the composition, the state (crystalline or amorphous), and the like. However, in general, the relative permittivity of the hafnium oxide ($HfO_2$) is in the range of 25 to 30, and the relative permittivity of the zirconium oxide ($ZrO_2$) is in the range of 20 to 25.

In addition, the work function controlling films 44 and 45 for determining work functions are formed on the inner surfaces of the trenches 42 for gate formation through the second gate insulating films 43, respectively. Normally, the work function controlling film has the work function of 4.6 eV or less, preferably, 4.3 eV or less in the gate electrode of the N-channel MISFET. On the other hand, the work function controlling film has the work function of 4.6 eV or more, preferably, 4.9 eV or more in the gate electrode of the P-channel MISFET. Also, a difference between these work function is preferably equal to or larger than 0.3 eV. Specifically, although fluctuating depending on the composition, the state (crystalline or amorphous) and the like, the work function of the hafnium silicide ($HfSi_x$) for the N-channel MISFET is in the range of about 4.1 to about 4.3 eV, and the work function of a titanium nitride (TiN) for the P-channel MISFET is in the range of about 4.5 to about 5.0 eV. As an example of the material for each of the work function controlling films 44 and 45 described above, there is a metal such as titanium (Ti), vanadium (V), nickel (Ni), zirconium (Zr), a niobium (Nb), molybdenum (Mo), ruthenium (Ru), hafnium (Hf), tantalum (Ta), tungsten (W) or platinum (Pt), an alloy thereof, or a compound thereof. With regard to the metallic compound thereof, there is a metallic nitride, or a compound of a metal and a semiconductor. Also, with regard to the compound of a metal and a semiconductor, as an example, there is a metallic silicide.

The work function controlling film 44 made of a metal or a metallic compound having the work function suitable for the N-channel MISFET is formed in each of the trenches 42 for gate formation in the region LVN-1, and the region LVN-2. For the material for the work function controlling film 44, as an example, there is a metal such as hafnium (Hf) or tantalum (Ta), an alloy thereof, or a compound thereof. Specifically, a hafnium silicide (HfSix) is more preferable for the work function controlling film 44.

In addition, the work function controlling film 45 made of either a metal or a metallic compound having the work function suitable for the P-channel MISFET is formed in each of the trenches 42 for gate formation in the region LVP. For the material for the work function controlling film 45, as an example, there is a metal such as titanium (Ti), molybdenum (Mo) or ruthenium (Ru), an alloy thereof, or a compound thereof. Specifically, a titanium nitride (TiN) or ruthenium (Ru) is more preferable for the work function controlling film 45.

Moreover, the conductive film 46 is formed as a conductive material so as to be filled in each of the insides of the trenches 42 for gate formation. The metallic material having an electrical resistance value lower than that of each of the work function controlling films 44 and 45, for example, is used for the conductive film 46. In this embodiment, tungsten (W) is used as an example of the metallic material.

As described above, the second gate electrode 47 of each of the low-voltage transistors (N-channel MISFETs) in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) in the second region 11B is formed from the conductive film 46 and the work function controlling film 45 which are left in the corresponding one of the trenches 42 for gate formation.

The second interlayer insulating film 51 is formed over all the surfaces of the liner film 36, the first interlayer insulating film 38, and the protective film 41. The second interlayer insulating film 51, for example, is formed from a silicon oxide film.

The connection holes 52 to the first gate electrodes 15, the second gate electrodes 47 and 48, and the source/drain regions 27 to 32 of the transistors are formed so as to extend completely through the liner film 36, the first interlayer insulating film 38, the protective film 41, and the second interlayer film 51. Also, the electrodes 54 each being made from the conductive film are formed so as to be filled in the connection holes 52, respectively.

As has been described, the middle-voltage voltage transistor (N-channel MISFET) 2 is formed in the region MV of the first region 11A, and the high-voltage voltage transistor (N-channel MISFET) 3 is formed in the region HV thereof. Also, the low-voltage transistors (N-channel MISFETs) 4 are densely formed in the region LVN-1 of the second region 11B, the low-voltage transistor (N-channel MISFET) 4 is formed in isolation in the region LVN-2 thereof, and the low-voltage transistor (P-channel MISFET) 5 is formed in the region LVP thereof. In such a manner, the semiconductor device 1(1C) is formed.

In the semiconductor device 1(1C), described above, according to the first embodiment of the present invention, the middle-voltage transistor (N-channel MISFET) 2, and the high-voltage transistor (N-channel MISFET) 3 are formed as a first group of transistors in the region MV and the region HV, respectively, on the semiconductor substrate 11. In addition, the low-voltage transistors (N-channel MISFETs) 4, the low-voltage transistor (N-channel MISFET) 4, and the low-voltage transistor (P-channel MISFET) 5 are formed as a second group of transistors each having the lower operating voltage than that of each of the transistors in the first group in the region MV and the region HV, respectively, on the semiconductor substrate 11. In addition thereto, the protective film 41 is formed so as to cover the silicide layer 40 formed on each of the first gate electrodes 15 of the first group of transistors. Therefore, during formation of the second gate electrodes 47 and 48 of the second group of transistors, for example, even when the polishing is performed to remove the extra portions of the metallic materials of which the second gate electrodes 47 and 48 are made, respectively, the slimming or disappearance of the silicide layer 40 formed on each of the first gate electrodes 15 is avoided owing to the presence of the protective film 41. As a result, the silicide layer 40 of the first group of transistors is protected. Therefore, the electrical resistance value of each of the first gate electrodes 15 can be reduced owing to the presence of the silicide layer 40.

In addition, the surface of the first interlayer insulating film 38 covering the second group of transistors, and the surface of the protective film 41 can be formed at the same height, or approximately at the same height to have the flat surface-like shape for example. As a result, it is possible to solve the problem that the conductive film (not shown) which is used in formation of the second gate electrodes (not shown) is partially left in the stepped portion of the protective film 41.

A method of manufacturing the semiconductor device according to a third embodiment of the present invention will be described in detail with reference to cross sectional views, showing manufacturing processes, of FIGS. 10A to 10J. The manufacturing method according to the third embodiment of the present invention is an example of a method of manufacturing the semiconductor device 1(1C) described above.

As shown in FIG. 10A, by utilizing the processes in the manufacturing method described in the first embodiment with reference FIGS. 3B to 3O, the gate portions 17 are formed on the surfaces of the region HV and the region MV in the semiconductor substrate 11, respectively. Also, the dummy gate portions 18 are formed on the surfaces of the region LVN-1, the region LVN-2, and the region LVP in the semiconductor substrate 11, respectively. In this case, each of the gate portions 17 is composed of the gate insulating film 13, the first gate electrode 15, and the hard mask 74A from the lower side. Also, each of the dummy gate portions 18 is composed of the dummy gate insulating film 16, the dummy gate electrode 16, and the hard mask 74B from the lower side.

Next, the offset spacers (not shown) are formed on the both sidewalls of each of the gate portions 17, and the both sidewalls of each of the dummy gate portions 18, respectively. Here, each of the gate portions 17 is composed of the hard mask 74A, the first gate electrode 15, the gate insulating film 13, and the like. Also, each of the dummy gate portions 18 is composed of the hard mask 74B, the dummy gate electrodes 16, the dummy gate insulating film 14, and the like. Next, the extension regions 21 and 22 for the N-channel MISFET are formed on the surface side of the semiconductor substrate 11 and below the both sides of each of the gate portions 17 in the first region 11A, respectively. In addition, the extension regions 23 and 24 for the N-channel MISFETs, and the extension regions 25 and 26 for the P-channel MISFET are formed on the surface side of the semiconductor substrate 11 and below the both sides of the dummy gate portions 18 in the second region 11B, respectively.

Next, the sidewalls 20 are formed on the sidewalls of each of the gate portions 17 and on the sidewalls of each of the dummy gate portions 18 through the corresponding ones of the offset spacers (not shown). Next, the source/drain regions 27 and 28 are formed on the surface side of the semiconductor substrate 11 and below the both sides of each of the gate portions 17 in the first region 11A through the corresponding ones of the extension regions 21 and 22, respectively. In addition, the source/drain regions 29 and 30 are formed on the surface side of the semiconductor substrate 11 and below the both sides of each of the dummy gate portions 18 of the region LVN-1, and the region LVN-2 in the second region 11B through the corresponding ones of the extension regions 23 and 24, respectively. Moreover, the source/drain regions 31 and 32 are formed on the surface side of the semiconductor substrate 11 and below the both sides of the dummy gate portion 18 of the region LVP in the second region 11B through the extension regions 25 and 26, respectively. Also, the silicide layer 33 is formed on each of the source/drain regions 27 to 32.

Next, the insulating film is formed over the entire surface of the semiconductor substrate 11 so as to cover the gate portions 17, the dummy gate portions 18, and the like. Firstly, the liner film 36 is formed as the insulating film over the entire surface of the semiconductor substrate 11. Next, the first interlayer insulating film 38 as a part of the insulating film is formed on the liner film 36. Next, the first interlayer insulating film 38, and the liner film 36 which overlie the gate portions 17 and the dummy gate portions 18 are polished by utilizing the CMP method until the hard masks 74A and the hard masks 74B are exposed. At this time, the lower portions of the hard masks 74A and 74B are left.

Next, as shown in FIG. 10B, by utilizing the process in the manufacturing method described in the first embodiment with reference to FIG. 3P, the etching mask 79 is formed so as to cover the second region 11B by utilizing the resist application technique and the lithography technique. By using the etching mask 79, a portion of the hard mask 74A (refer to FIG. 10A) in the first region 11A is removed so as to expose the upper surfaces of the first gate electrodes 15, and parts of the first interlayer insulating film 38, the liner film 36 and the sidewalls 20 are removed.

Figure 10C:
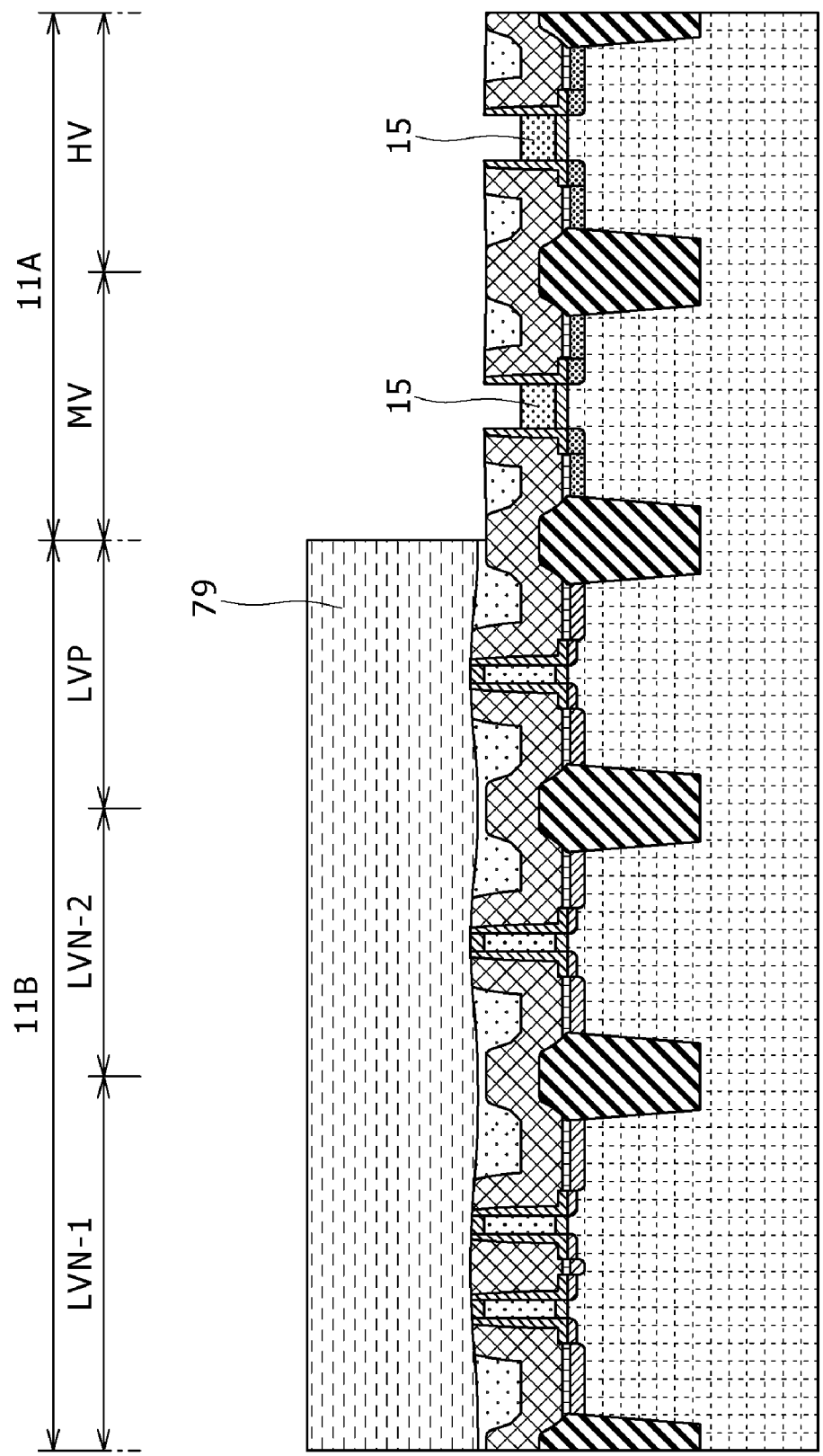

Subsequently, as shown in FIG. 10C, by utilizing the dry etching method using the etching mask 79, the upper portions of the first gate electrodes 15 are removed, thereby reducing the height of each of the first gate electrodes 15 by, for example, 20 to 50 nm.

Figure 10D:
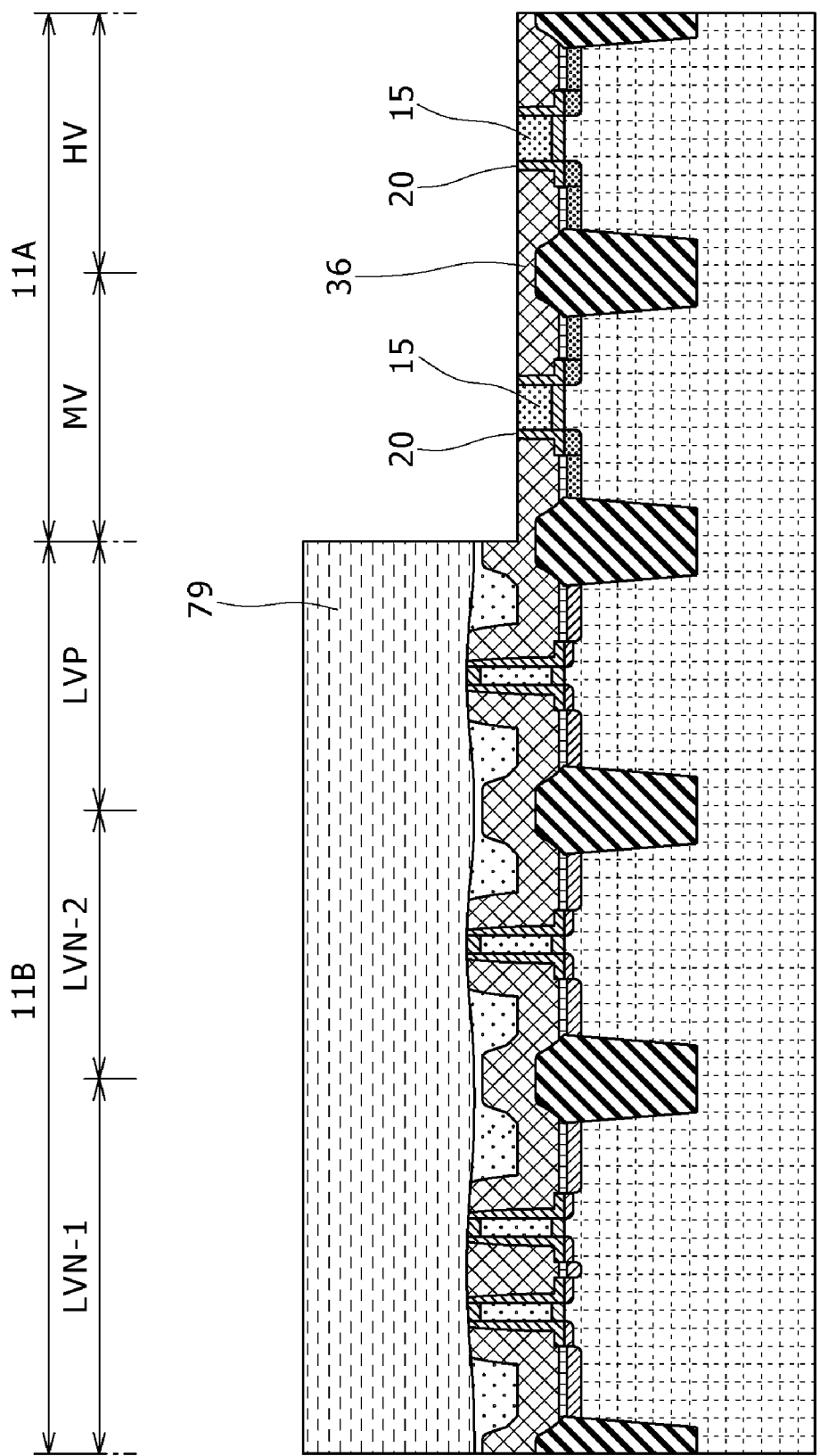

Moreover, as shown in FIG. 10D, by utilizing the dry etching method using the etching mask 79, the first interlayer insulating films 38 (refer to FIG. 10C), the liner film 36, and the sidewalls 20 are partially removed to a level which is approximately identical to the height of each of the first gate electrodes 15 (for example, its height tolerance is ±20 nm). After that, the etching mask 79 is removed away.

Figure 10E:
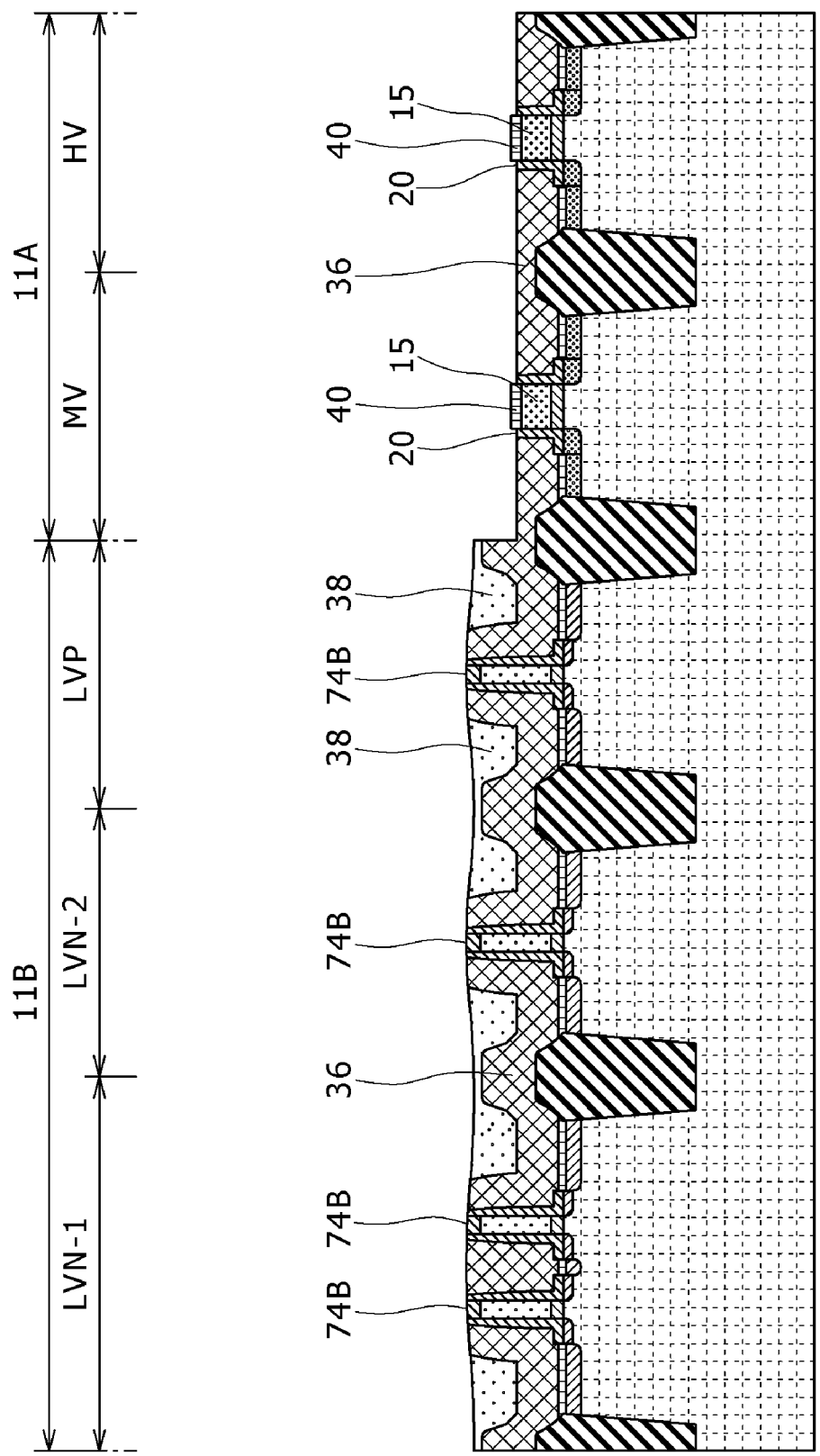

Next, as shown in FIG. 10E, by utilizing the process in the manufacturing method described in the first embodiment with reference to FIG. 3Q, the silicide layer 40 is formed on each of the first gate electrodes 15. Firstly, a metallic layer for formation of the silicide layer is formed over the entire surface. In this case, as an example, the metallic layer is made of cobalt (Co). The cobalt layer is deposited to have a thickness of, for example, 6 to 8 nm by, for example, utilizing the sputtering method, thereby forming the metallic layer. Next, the RTA is performed at a temperature of 500 to 600° C., so that the metallic layer is reacted with only silicon (Si) of each of the first gate electrodes 15, thereby forming the silicide layer 40. Since the metallic layer is made of cobalt, the silicide layer 40 is made of cobalt silicide (for example, CoSi). After that, unreacted cobalt on the insulating films (such as the hard masks 74B, the sidewalls 20, the liner film 36, and the first interlayer insulating film 38) is removed by utilizing the wet etching method using a sulfuric acid ($H_2SO_4$) and hydrogen peroxide ($H_2O_2$). Subsequently, the heat treatment is performed, thereby forming the cobalt silicide ($CoSi_2$) layer having a low resistance value. The heat treatment, for example, is performed at a temperature of 650 to 850° C. for 30 seconds in the RTA. In addition, the metallic layer may also be made of nickel (Ni) or nickel platinum (NiPt) instead of being made of cobalt (Co). In this case, a nickel silicide ($NiSi_2$) layer is formed. In any case, the temperature in the RTA can be suitably set.

Figure 10F:
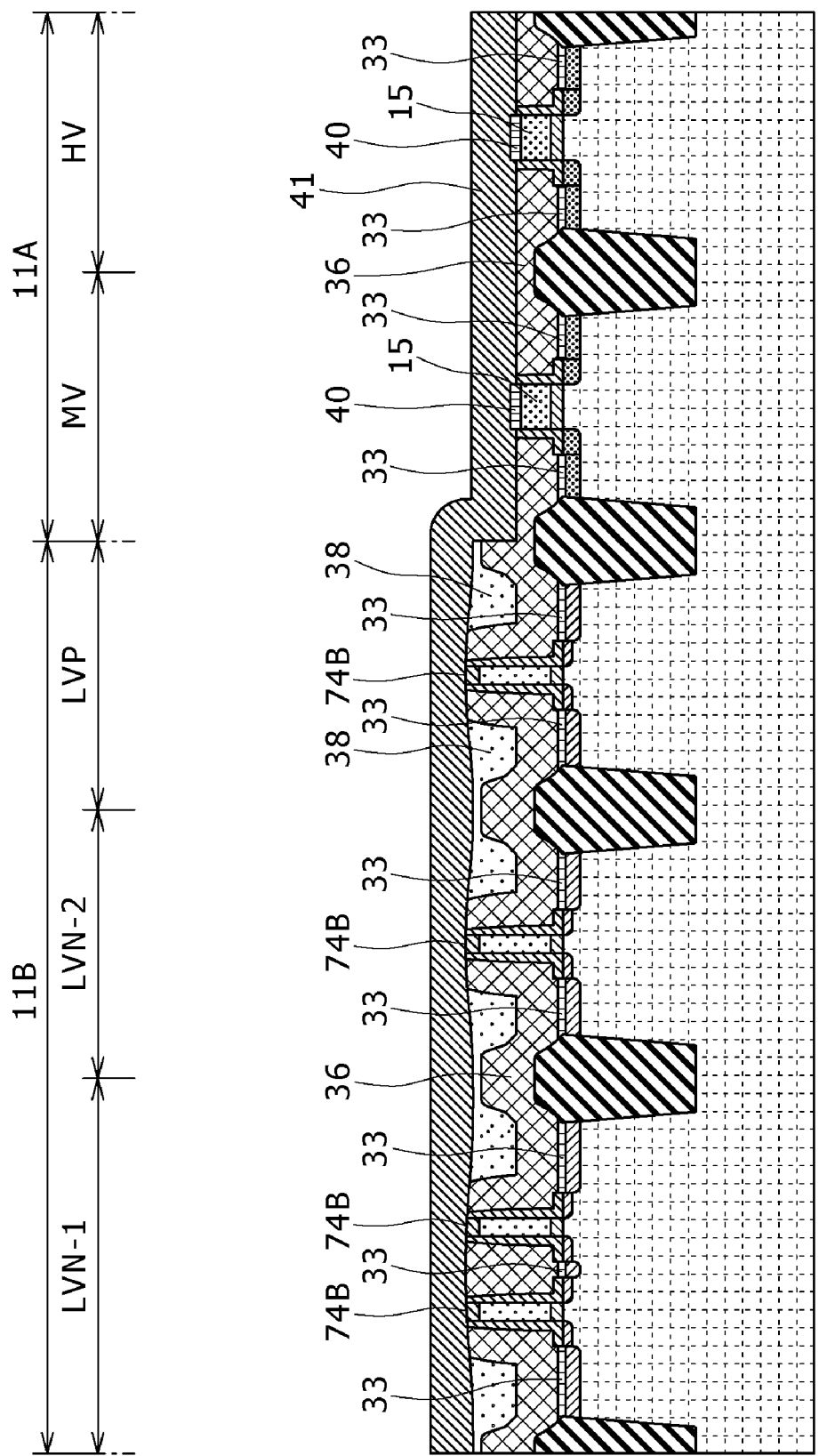

Next, as shown in FIG. 10F, the protective film 41 for protecting the silicide layer 40 described above is formed over the entire surface. The protective film 41 is formed from either a silicon oxide ($SiO_2$) film or a silicon nitride (SiN) film, by, for example, utilizing a plasma CVD method. For example, when the protective film 41 is formed from the silicon oxide film, an example of the CVD conditions is described as follows: oxygen ($O_2$) (flow rate: 600 cm³/min.) and tetra ethyl silicate (TEOS) (flow rate: 800 cm³/min.) are used as the raw material gas, the pressure of a deposition ambient atmosphere is set at 1.09 kPa, the RF power of a CVD system is set at 700 W, and a substrate temperature is set at 400° C. Since the protective film 41 described above can be deposited at a temperature of 450° C. or less, the damage is prevented from being incurred on the silicide layers 33 and 40 which are previously formed. In addition, the thickness of the protective film 41 is set so that the height of a portion thereof in the first region 11A becomes identical to that of a portion of the first interlayer insulating film 38 in the second region 11B or becomes approximately identical to that of this portion, and the silicide layer 40 can be protected. In order to attain this, a digging amount of each first gate electrode 15 is determined in consideration of the height of the silicide layer 40, and the thickness of the protective film 41. In such a manner, the surface of the portion of the protective film 41 in the first region 11A is formed approximately at the same height as that of each of the surfaces of the first interlayer insulating film 38 and the liner film 36 in the second region 11B, or is formed in a state close thereto, which results in that the wirings, the electrodes and the like can be precisely formed on the upper surfaces of the protective film 41, and the first interlayer insulating film 38 and the liner film 36.

Figure 10G:
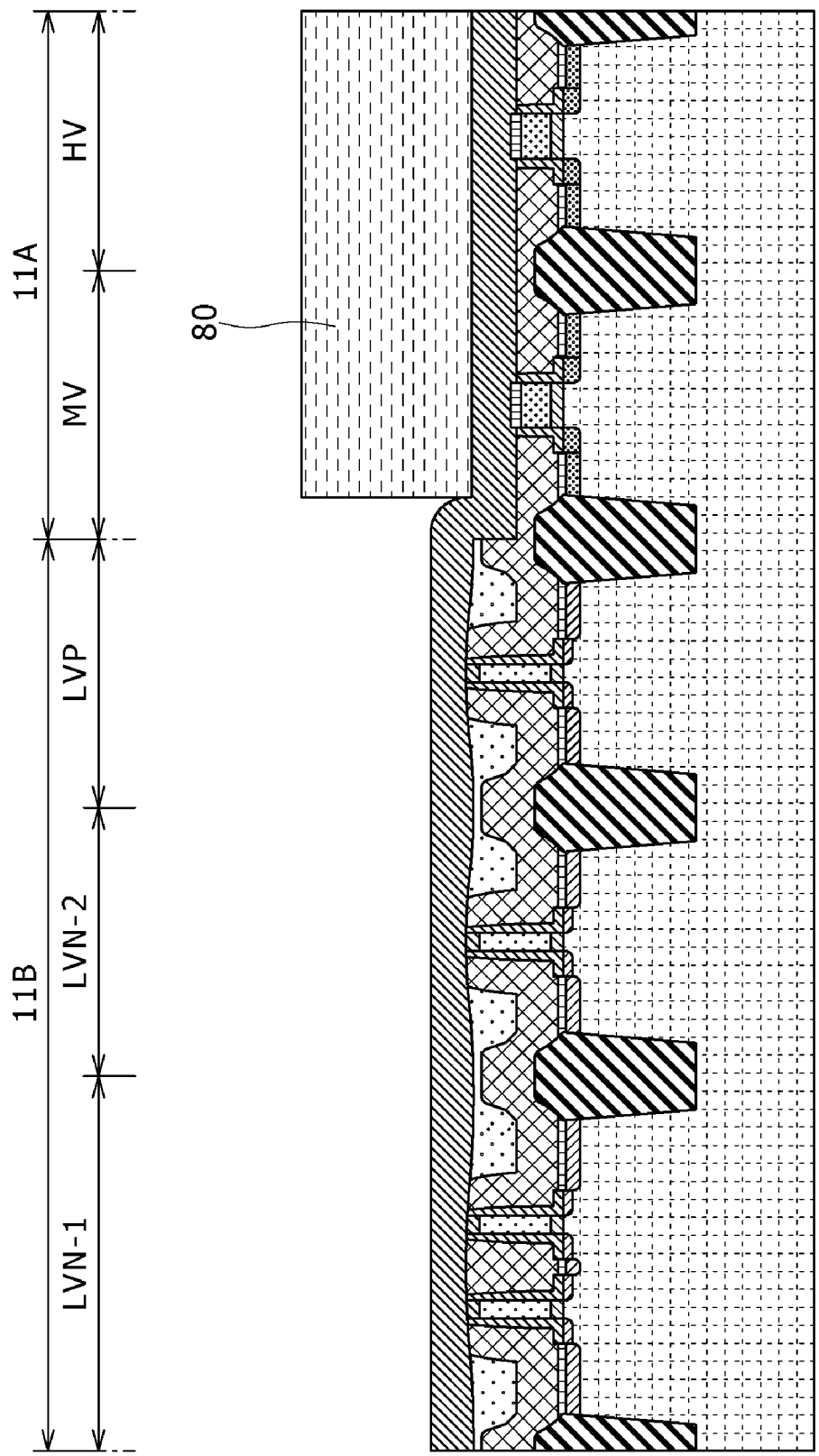

Next, as shown in FIG. 10G, an etching mask 80 is formed so as to cover the first region 11A by utilizing the resist application technique and the lithography technique. Thus, the second region 11B is not covered with this etching mask 80.

Figure 10H:
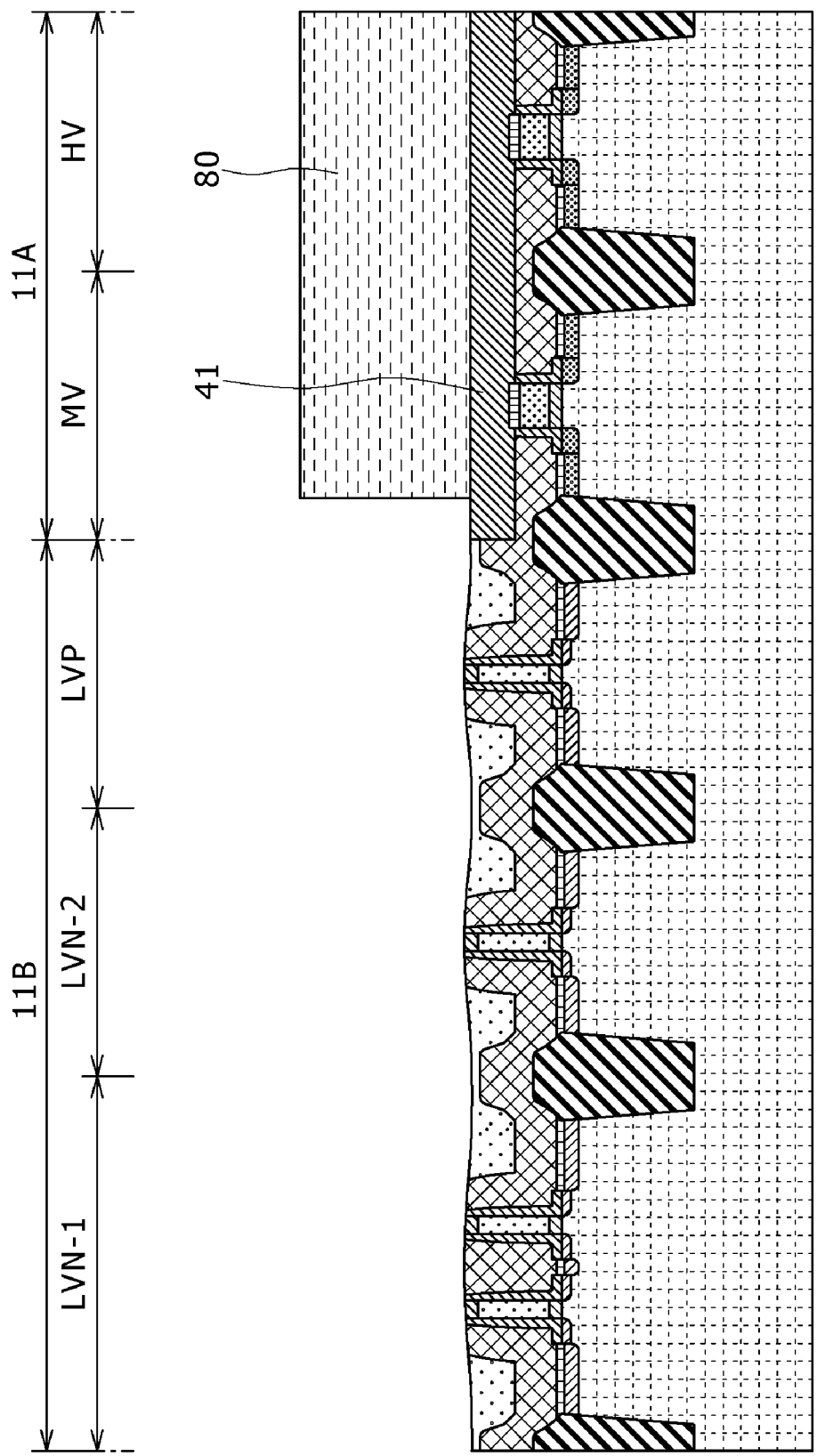

Next, as shown in FIG. 10H, a portion of the protective film 41 in the second region 11B is removed with the etching mask 80 by utilizing the dry etching method to leave the remaining protective film 41 in the first region 11A. An example of the conditions in the dry etching method is described as follows: octafluoro cyclobutane ($C_4F_8$), oxygen ($O_2$) and argon (Ar) are used as the etching gas, flow rates of $C_4F_8$, $O_2$ and Ar are set at 9 cm³/min., 5 cm³/min., and 250 cm³/min., respectively, a pressure of an etching ambient atmosphere is set at 4.1 Pa, a power (plasma output) of an etching system is set at 1,500 W, and a substrate temperature is set at 20° C.

Figure 10I:
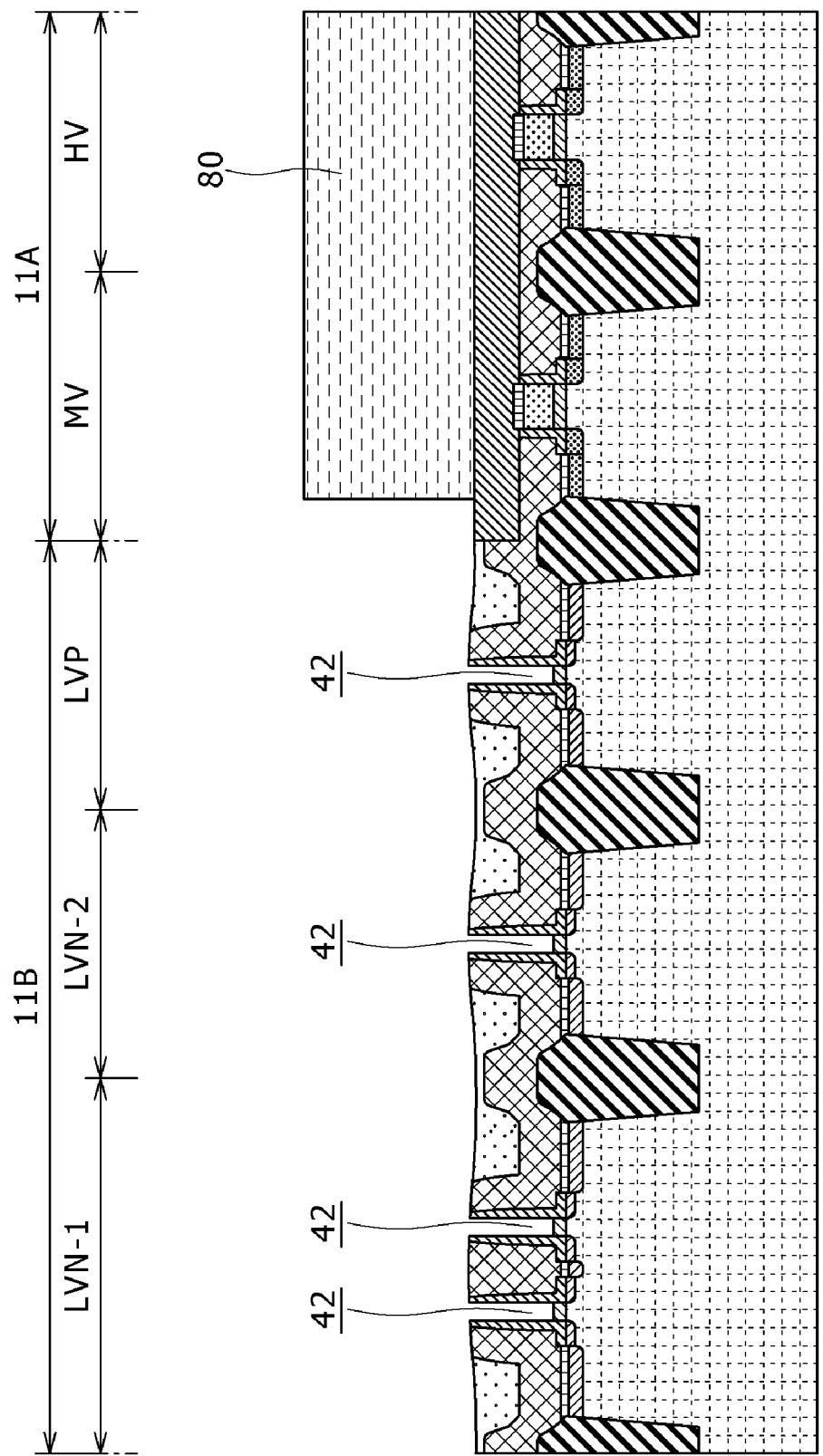

Subsequently, as shown in FIG. 10I, the hard masks 74B, and the dummy gate electrodes 16 (refer to FIG. 10A) are removed by, for example, utilizing the dry etching method. Moreover, the dummy gate insulating films 14 (refer to FIG. 10A) are removed by utilizing the wet etching method using a dilute hydrofluoric acid, thereby forming the trenches 42 for gate formation, respectively. After that, the etching mask 80 is removed away.

Figure 10J:
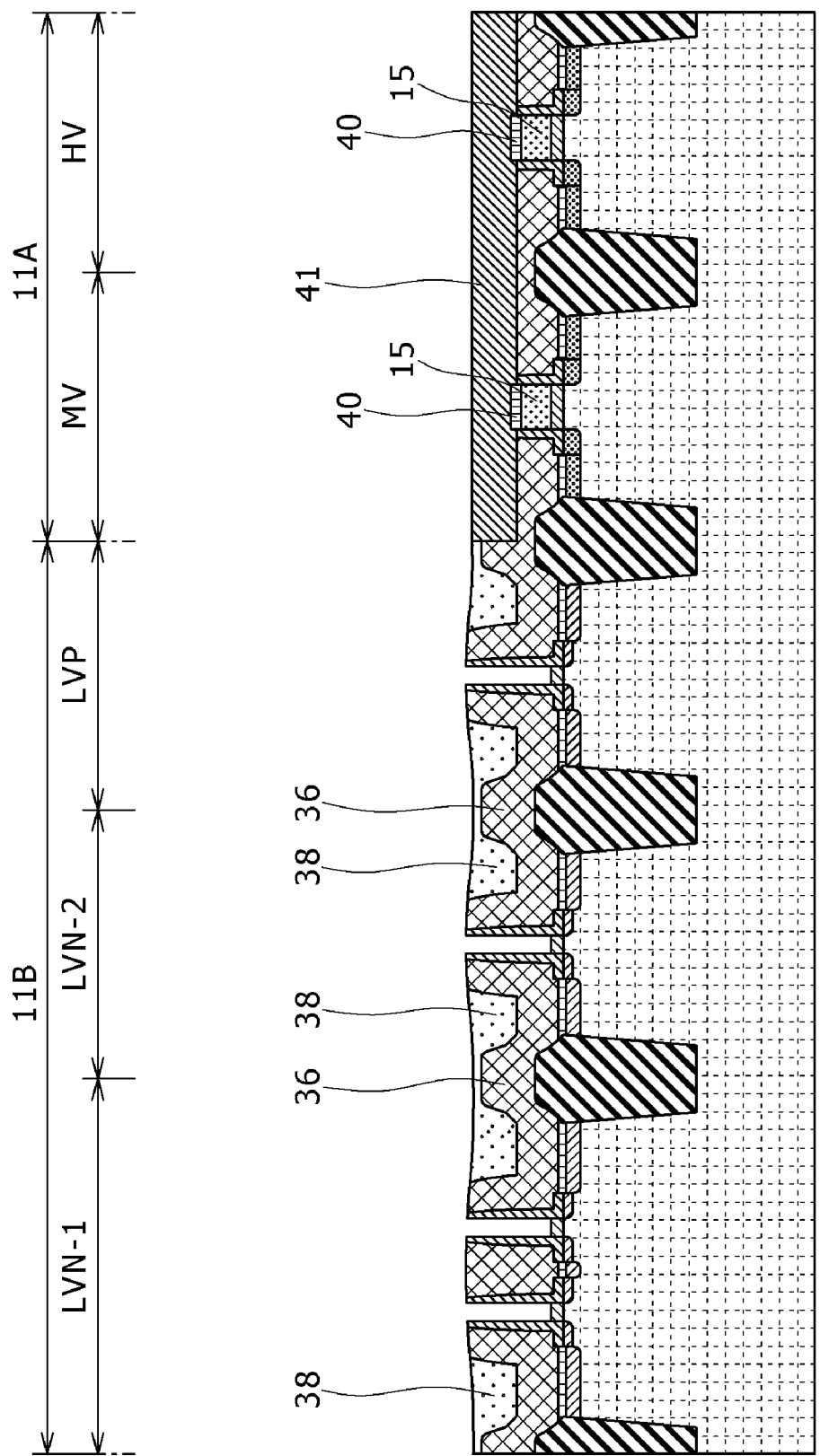

As a result, as shown in FIG. 10J, the surfaces of the protective film 41 in the first region 11A, and the first interlayer insulating film 38, the liner film 36, the protective film 41 and the like in the second region 11B are approximately planarized. Also, the silicide layer 40 formed on each of the first gate electrodes 15 is covered with the protective film 41. Since the processes after this process are the same as those described in the first embodiment with reference to FIGS. 3T to 3Y, its description is omitted here for the sake of simplicity.

In the method of manufacturing the semiconductor device 1(1C) according to the third embodiment of the present invention, there are obtained the same operation and effects as those of the first embodiment described above. Moreover, before formation of the protective film 41, the upper portion of the first interlayer insulating film 38, the upper portions of the first gate electrodes 15, and the like in the first group of transistors are removed, so that each of the first gate electrodes 15 in the first group of transistors becomes lower in height than each of the second gate electrodes (not shown) in the second group of transistors. As a result, even when the silicide layer 40 is formed on each of the first gate electrodes 15 in the first group of transistors, it is formed to be lower in height than each of the second gate electrodes (not shown) in the second group of transistors. Thus, the surface of the first interlayer insulating film 38 covering the second group of transistors, and the surface of the protective film 41 are formed to have the flat surface-like shape in forming the protective film 41, the silicide layer 40 formed on each of the first gate electrodes 15 in the first group of transistors is protected because it is covered with the protective film 41.

In addition, the surface of the first interlayer insulating film 38 covering the second group of transistors, and the surface of the protective film 41 can be formed at the same height, or approximately at the same height to have the flat surface-like shape for example. As a result, it is possible to solve the problem that the conductive film (not shown) which is used in formation of the second gate electrodes (not shown) is partially left in the stepped portion of the protective film 41.

Next, a semiconductor device according to a fourth embodiment of the present invention will be described in detail hereinafter with reference to a schematically structural cross sectional view of FIGS. 11, 12A and 12B.

Figure 11:
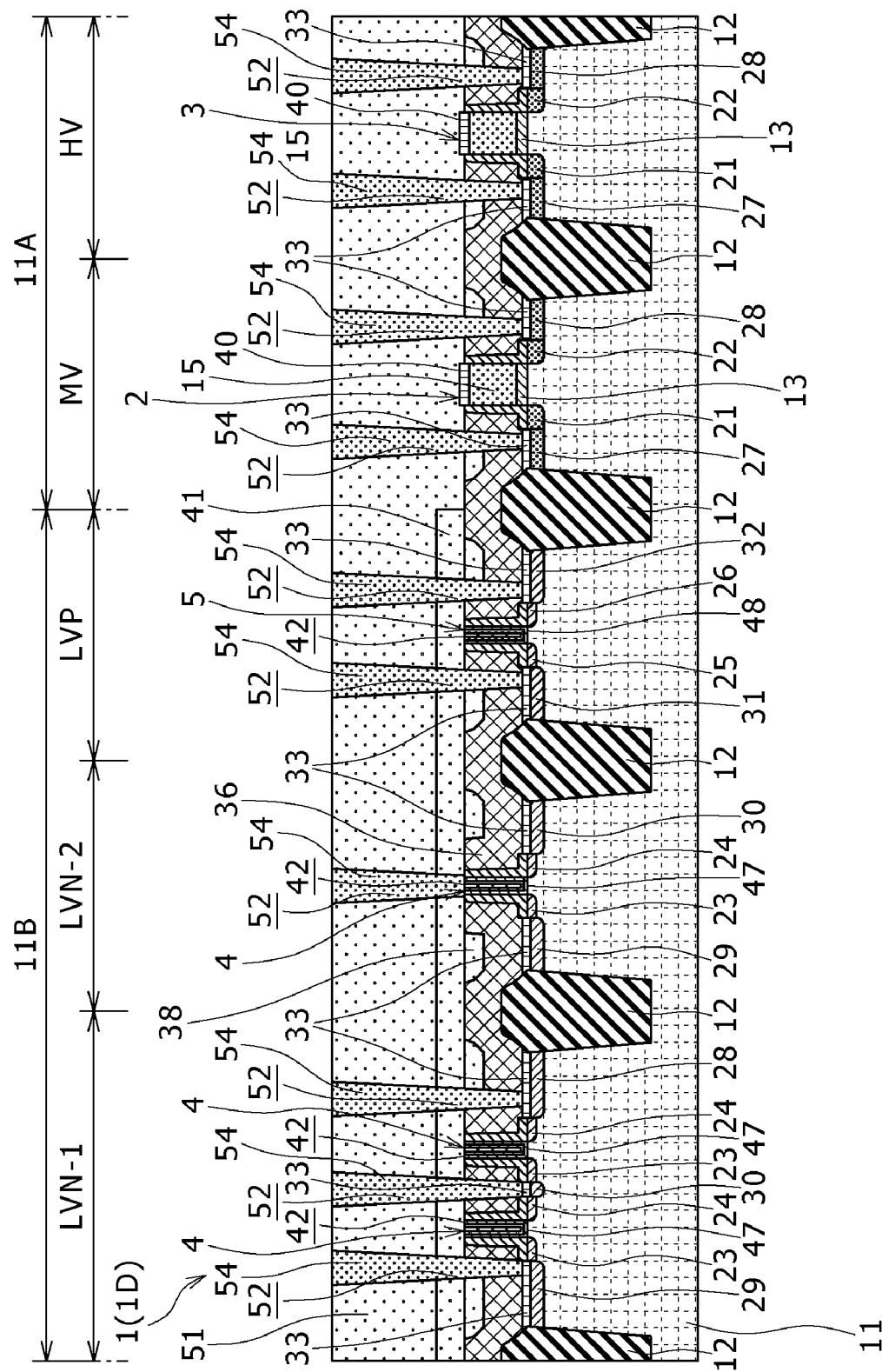
FIG. 11 is a cross sectional view schematically showing a structure of a semiconductor device according to a fourth embodiment of the present invention.
Figure 12A:
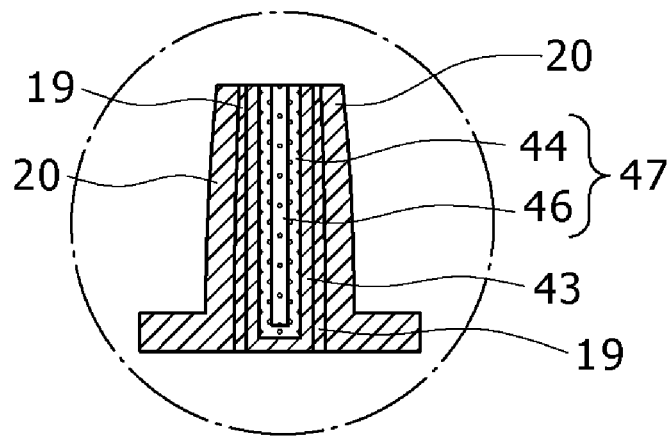
FIGS. 12A and 12B are respectively enlarged sectional views of the semiconductor device shown in FIG. 11.
Figure 12B:
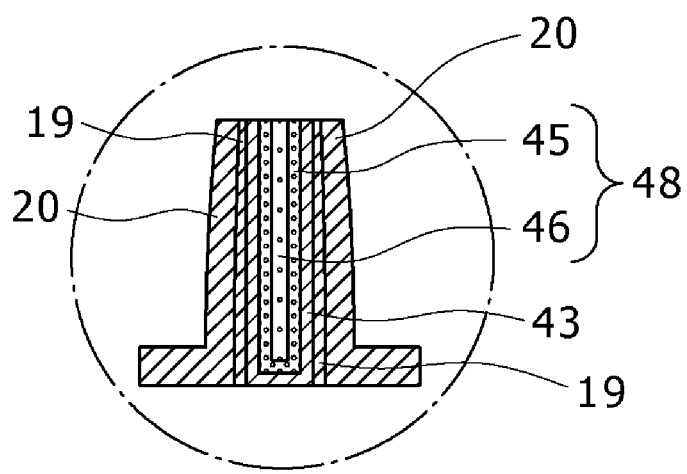

As shown in FIGS. 11, 12A and 12B, the isolation regions 12 are formed in the semiconductor substrate 11. In this case, as an example, the region LVN-1, the region LVN-2, and the region LVP having low-voltage transistors (such as MISFETs) formed therein, respectively, the region MV having a middle-voltage transistor (such as a MISFET) formed therein, and the region HV having a high-voltage transistor (such as a MISFET) formed therein are isolated by these isolation regions 12. Each of the regions MV and HV includes the region having the isolated pattern as well as the region in which a pattern density of the MISFET is dense. In addition, both the region HV as the formation region of the high-voltage transistor, and the region MV as the formation region of the middle-voltage transistor are given the generic name of the first region 11A. Also, the region LVN-1 in which the N-channel MISFETs as the low-voltage transistors are densely formed, the region LVN-2 in which the N-channel MISFET as the low-voltage transistor is formed in isolation, and the region LVP in which the P-channel MISFET as the low-voltage transistor is formed are given as the generic name of the second region 11B.

In addition, the ion implantation for forming a P-type well region (not shown), the ion implantation for forming the buried layer (not shown) for blocking punch-through of the MISFET, and the ion implantation for adjusting the threshold voltage (Vth) are suitably performed for the region in which an N-channel MISFET is intended to be formed. As a result, the NMIS channel region is formed. In addition, the ion implantation for forming an N-type well region (not shown), the ion implantation for forming the buried layer (not shown) for blocking punch-through of the MISFET, and the ion implantation for adjusting the threshold voltage (Vth) are suitably performed for the region in which the P-channel MISFET is intended to be formed. As a result, the PMIS channel region is formed. It is noted that the channel regions may be formed in the region HV having the high-voltage transistor formed therein, the region MV having the middle-voltage transistor formed therein, and the region LVN-1, the region LVN-2, and the region LVP which have the respective low-voltage transistors formed therein, respectively.

The gate insulating films 13 are formed on the surfaces of the region HV and the region MV in the semiconductor substrate 11, respectively. The high-voltage transistor and the middle-voltage transistor have the thick gate insulating films, respectively, in many cases. Each of the gate insulating film 13, for example, is formed from a silicon oxide film, and is also formed to have a thickness of 2 to 4 nm. The first gate electrodes 15 are formed on the gate insulating films 13, respectively. Each of the first gate electrodes 15, for example, is made of either polysilicon or amorphous silicon, and has a thickness of 100 to 150 nm.

The dummy gate insulating films and the dummy gate electrodes (not shown) are temporarily formed on the region LVN-1, the region LVN-2, and the region LVP in the semiconductor substrate 11, respectively. Also, the offset spacers 19 are formed on each of the sidewalls of the dummy gate electrodes, and each of the sidewalls of the first gate electrodes 15, respectively. The thickness of each of the offset spacers 19, for example, is in the range of 6 to 10 nm.

Also, the extension regions 21 and 22 of the N-channel MISFET are formed on the surface side of the semiconductor substrate 11 and below the both sides of each of the first gate electrodes 15, respectively. In addition, the extension regions 23 and 24 of the N-channel MISFET are formed on the surface side of the semiconductor substrate 11 and below the both sides of each of the dummy gate electrodes of the region LVN-1 and the region LVN-2, respectively. Moreover, the extension regions 25 and 26 of the P-channel MISFET are formed on the surface side of the semiconductor substrate 11 and below both sides of the dummy gate electrode of the region LVP, respectively.

Moreover, the sidewalls 20 are formed on the side portions of each of the first gate electrodes 15, and each of the dummy gate electrodes through the offset spacers 19, respectively.

Also, the source/drain regions 27 and 28 are formed on the surface side of the semiconductor substrate 11 and below the both sides of each of the first gate electrodes 15 through the corresponding ones of the extension regions 21 and 22, respectively. In addition, the source/drain regions 29 and 30 are formed on the surface side of the semiconductor substrate 11 and below the both sides of each of the dummy gate electrodes of the region LVN-1 and the region LVN-2 through the corresponding ones of the extension regions 23 and 24 of the N-channel MISFETs, respectively. Also, the source/drain regions 31 and 32 are formed on the surface side of the semiconductor substrate 11 and below the both sides of the dummy gate electrode of the region LVP through the extension regions 25 and 26 of the P-channel MISFET, respectively.

The silicide layer 33 is formed on each of the source/drain regions 27 to 32. The silicide layer 33, for example, is made of cobalt silicide ($CoSi_2$), nickel silicide ($NiSi_2$), nickel platinum silicide, or the like.

Also, the insulating film is formed so as to partially cover the first gate electrodes 15, the dummy gate electrodes, and the like. The insulating film is composed of the liner film 36 formed over the entire surface of the semiconductor substrate 11, and the first interlayer insulating film 38 formed on the liner film 36.

The liner film 36, for example, is formed from a silicon nitride (SiN) film, and serves to apply a stress to corresponding one of the channel portions of the transistors. For example, the liner film having a tensile stress is used in the N-channel MISFET for the purpose of increasing the mobility in the channel. Also, the liner film having a compressive stress is used in the P-channel MISFET for the purpose of increasing the mobility in the channel. In addition, the liner films 36 may be individually formed for the N-channel MISFET and the P-channel MISFET, respectively. Also, the stress applied by the liner film 36 can be normally determined depending on the film deposition conditions.

The first interlayer insulating film 38, for example, is formed from a silicon oxide ($SiO_2$) film formed by utilizing the HDP-CVD method. Also, the surfaces of the first interlayer insulating film 38 and the liner film 36 are planarized so as to expose the upper surfaces of the first gate electrodes 15 and the dummy gate electrodes (not shown).

The trenches 42 for gate formation are formed so as to extend completely through the first interlayer insulating film 38 and the liner film 36 in the second region 11B by removing the dummy gate electrodes and the dummy gate insulating films.

The second gate insulating film 43 is formed on each of the inner surfaces of the trenches 42 for gate formation. The second gate insulating film 43 is formed so that the capacity per unit area obtained based on the second gate insulating film 43 is smaller than that obtained based on each of the first gate insulating films 13 in the first region 11A. The second gate insulating film 43 is formed from a high-permittivity film. The high-permittivity film, for example, is made of an oxide, an oxysilicate, an oxynitride or a silicon oxynitride of hafnium, zirconium, lanthanum, yttrium, tantalum or aluminum. Specifically, the high-permittivity film, for example, is made of a hafnium oxide ($HfO_3$), a zirconium oxide ($ZrO_2$), a lanthanum oxide ($LaO_2$), a yttrium oxide ($Y_2O_3$), a tantalum oxide ($Ta_2O_5$), an aluminum oxide ($Al_2O_3$), a hafnium silicate ($HfSiO_x$), a zirconium silicate ($ZrSiO_x$), a lanthanum silicate ($LaSiO_x$), a yttrium silicate ($YSiO_x$), a tantalum silicate ($TaSiO_x$), an aluminum silicate ($AlSiO_x$), a zirconium titanate ($ZrTiO_x$), a hafnium aluminum oxide ($HfAlO_x$), or a hafnium zirconium oxide ($HfZrO_x$). Or, the high-permittivity film is made of a nitride of any of these compounds. For example, as a silicon oxynitride, there are nitrides of the metallic silicate described above such as a hafnium silicon oxynitride (HfSiON) or a zirconium silicon oxynitride (ZrSiON). A relative permittivity of the high-permittivity film fluctuates depending on a composition, a state (crystalline or amorphous), and the like. However, in general, the relative permittivity of the hafnium oxide ($HfO_2$) is in the range of 25 to 30, and the relative permittivity of the zirconium oxide ($ZrO_2$) is in the range of 20 to 25.

In addition, the work function controlling films 44 and 45 for determining work functions are formed on the inner surfaces of the trenches 42 for gate formation through the second gate insulating films 43, respectively. Normally, the work function controlling film has the work function of 4.6 eV or less, preferably, 4.3 eV or less in the gate electrode of the N-channel MISFET. On the other hand, the work function controlling film has the work function of 4.6 eV or more, preferably, 4.9 eV or more in the gate electrode of the P-channel MISFET. Also, a difference between these work functions is preferably equal to or larger than 0.3 eV. Specifically, although fluctuating depending on the composition, the state (crystalline or amorphous) and the like, the work function of the hafnium silicide ($HfSi_x$) for the N-channel MISFET is in the range of about 4.1 to about 4.3 eV, and the work function of a titanium nitride (TiN) for the P-channel MISFET is in the range of about 4.5 to about 5.0 eV. As an example of the material for each of the work function controlling films 44 and 45, there is a metal such as titanium (Ti), vanadium (V), nickel (Ni), zirconium (Zr), a niobium (Nb), molybdenum (Mo), ruthenium (Ru), hafnium (Hf), tantalum (Ta), tungsten (W) or platinum (Pt), an alloy thereof, or a compound thereof. As the metallic compound, there is a metallic nitride, or a compound of a metal and a semiconductor. Also, with regard to the compound of a metal and a semiconductor, as an example, there is a metallic silicide.

The work function controlling film 44 made of either a metal or a metallic compound having the work function suitable for the N-channel MISFET is formed in each of the trenches 42 for gate formation in the region LVN-1, and the region LVN-2. For the material for the work function controlling film 44, as an example, there is a metal such as hafnium (Hf) or tantalum (Ta), an alloy thereof, or a compound thereof. Specifically, a hafnium silicide ($HfSi_x$) is more preferable for the work function controlling film 44.

In addition, the work function controlling film 45 made of a metal or a metallic compound having the work function suitable for the P-channel MISFET is formed in the trench 42 for gate formation in the region LVP. For the material for the work function controlling film 45, as an example, there is a metal such as titanium (Ti), molybdenum (Mo) or ruthenium (Ru), an alloy thereof, or a compound thereof. Specifically, a titanium nitride (TiN) or ruthenium (Ru) is more preferable for the work function controlling film 45.

Moreover, the conductive film 46 is formed as a conductive material so as to be filled in each of the insides of the trenches 42 for gate formation. For example, the metallic material having an electrical resistance value lower than that of each of the work function controlling films 44 and 45 is used for the conductive film 46. In this embodiment, tungsten (W) is used as an example of the metallic material.

As described above, the second gate electrode 47 of each of the low-voltage transistors (N-channel MISFETs) in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) in the second region 11B is formed from the conductive film 46 and the work function controlling film 45 which are left in the corresponding one of the trenches 42 for gate formation.

The protective film 49 for protecting the second gate electrodes 47 and the second gate electrode 48 is formed so as to cover the first interlayer insulating film 38 and the liner film 36 in the second region 11B. The protective film 49 is formed from either a silicon oxide ($SiO_2$) film or a silicon nitride (SiN) film by, for example, utilizing the plasma CVD method. The film deposition temperature at that time is set at 450° C. or less. As a result, the damage is prevented from being incurred on the silicide layer 33 which is previously formed.

The silicide layer 40 is formed on each of the upper surfaces of the first gate electrodes 15. The silicide layer 40, for example, is made of cobalt silicide ($CoSi_2$), nickel silicide ($NiSi_2$), nickel platinum silicide or the like.

The second interlayer insulating film 51 is formed over all the surfaces of the liner film 36, the first interlayer insulating film 38, the silicide layer 40, the protective film 49, and the like. The second interlayer insulating film 51, for example, is formed from the silicon oxide film.

The connection holes 52 to the first gate electrodes 15, the second gate electrodes 47 and 48, and the source/drain regions 27 to 32 of the transistors are formed so as to extend completely through the liner film 36, the first interlayer insulating film 38, the protective film 41, and the second interlayer insulating film 51. Also, the electrodes 54 each being made from the conductive film are formed so as to be filled in the connection holes 52, respectively.

As has been described, the middle-voltage voltage transistor (N-channel MISFET) 2 is formed in the region MV of the first region 11A, and the high-voltage voltage transistor (N-channel MISFET) 3 is formed in the region HV thereof. Also, the low-voltage transistors (N-channel MISFETs) 4 are densely formed in the region LVN-1 of the second region 11B, the low-voltage transistor (N-channel MISFET) 4 is formed in isolation in the region LVN-2 thereof, and the low-voltage transistor (P-channel MISFET) 5 is formed in the region LVP thereof. In such a manner, the semiconductor device 1(1D) is formed.

In the semiconductor device 1(1D), described above, according to the first embodiment of the present invention, the middle-voltage transistor (N-channel MISFET) 2, and the high-voltage transistor (N-channel MISFET) 3 are formed as a first group of transistors in the region MV and the region HV, respectively, in the semiconductor substrate 11. In addition, the low-voltage transistors (N-channel MISFETs) 4, the low-voltage transistor (N-channel MISFET) 4, and the low-voltage transistor (P-channel MISFET) 5 are formed as a second group of transistors each having the lower operating voltage than that of each of the transistors in the first group in the region MV and the region HV, respectively, in the semiconductor substrate 11. In addition thereto, the protective film 49 is formed so as to cover the second gate electrodes 47 and 48 of the second group of transistors. Hence, the silicide layer 40 is formed on each of the first gate electrodes of the first group of transistors after formation of the protective film 49, which makes it possible to protect the second gate electrodes 47 and 48 of the second group of transistors when the silicide layer 40 is formed. That is to say, when the unreacted metallic film formed for silicidization is removed away, each of the second gate electrodes 47 and 48 is prevented from being etched and removed away. The electrical resistance value of each of the first gate electrodes 15 is reduced since the silicide layer 40 is formed on each of the first gate electrodes 15 in such a manner.

Therefore, the following advantage is obtained. That is to say, the first group of transistors (the group of high-withstand voltage (high-voltage operation and middle-voltage operation)) transistors each having the first gate insulating film 13 made of either a silicon oxide or a silicon oxynitride, and the first gate electrode 15 made of either polysilicon or amorphous silicon, and the second group of transistors (for example, the group of low-voltage operation transistors) having the second gate insulating films 43 as the high-permittivity (High-k) films, and the second gate electrodes 47 and 48 as the so-called metallic gate electrodes are formed on the same semiconductor substrate 11. As a result, it is possible to reduce the electrical resistance value of each of the first gate electrodes 15 of the first group of transistors.

A method of manufacturing the semiconductor device according to a fourth embodiment of the present invention will be described in detail with reference to cross sectional views, showing manufacturing processes, of FIGS. 13A to 13L. The manufacturing method according to the fourth embodiment of the present invention is an example of a method of manufacturing the semiconductor device 1(1D) described above.

Figure 13A:
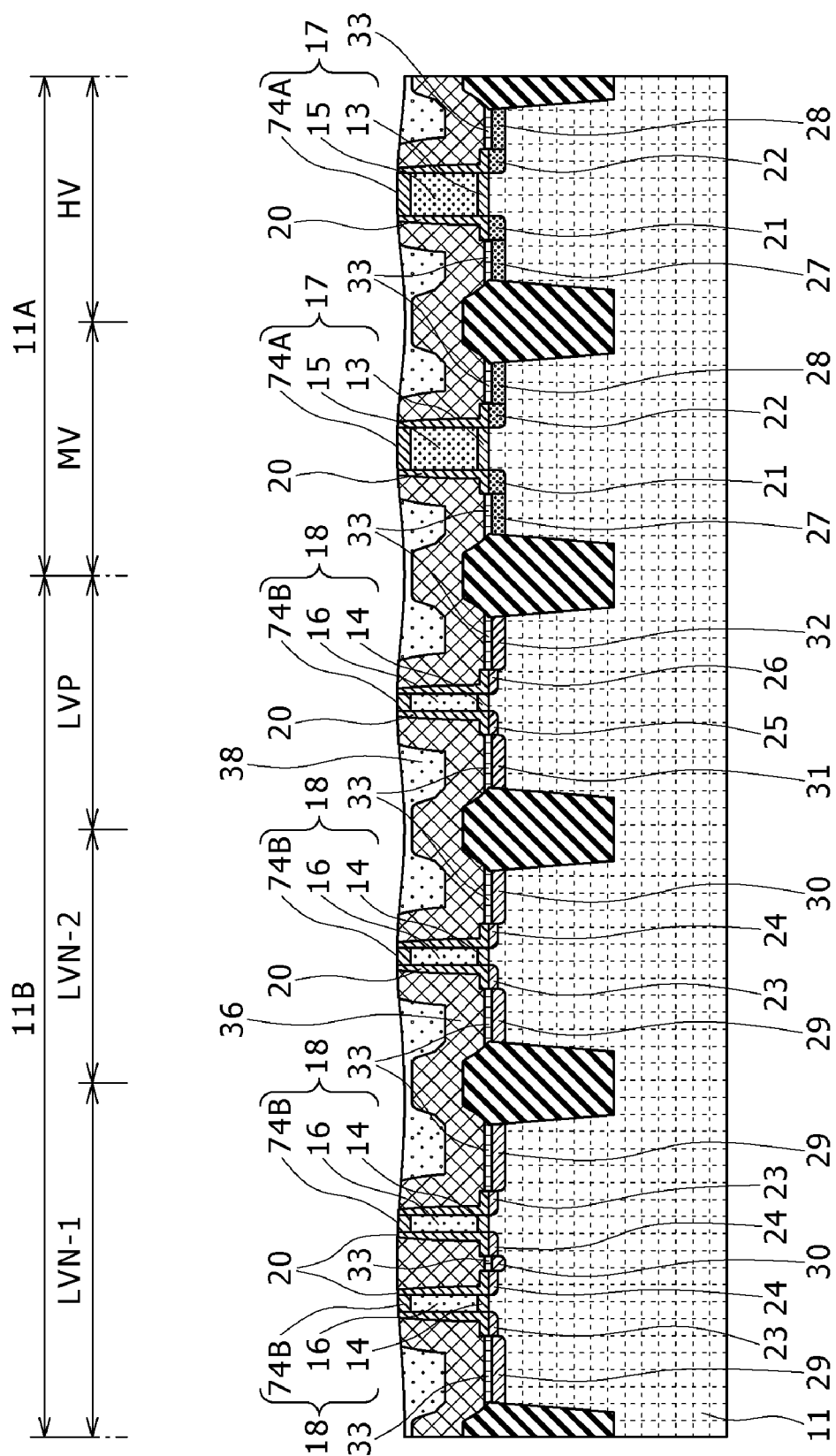

As shown in FIG. 13A, by utilizing the processes in the manufacturing method described in the first embodiment with reference to FIGS. 3B to 3O, the gate portions 17 are formed on the surfaces of the region HV and the region MV in the semiconductor substrate 11, respectively. Also, the dummy gate portions 18 are formed on the surfaces of the region LVN-1, the region LVN-2, and the region LVP in the semiconductor substrate 11, respectively. In this case, each of the gate portions 17 is composed of the gate insulating film 13, the first gate electrode 15, and the hard mask 74A from the lower side. Also, each of the dummy gate portions 18 is composed of the dummy gate insulating film 16, the dummy gate electrode 16, and the hard mask 74B from the lower side.

Next, the offset spacers (not shown) are formed on the both sidewalls of each of the gate portions 17, and the both sidewalls of each of the dummy gate portions 18, respectively. Here, each of the gate portions 17 is composed of the hard mask 74A, the first gate electrode 15, the gate insulating film 13, and the like. Also, each of the dummy gate portions 18 is composed of the hard mask 74B, the dummy gate electrodes 16, the dummy gate insulating film 14, and the like. Next, the extension regions 21 and 22 for the N-channel MISFET are formed on the surface side of the semiconductor substrate 11 and below the both sides of each of the gate portions 17 in the first region 11A, respectively. In addition, the extension regions 23 and 24 for the N-channel MISFETs, and the extension regions 25 and 26 for the P-channel MISFET are formed on the surface side of the semiconductor substrate 11 and below the both sides of the dummy gate portions 18 in the second region 11B, respectively.

Next, the sidewalls 20 are formed on the sidewalls of each of the gate portions 17 and on the sidewalls of each of the dummy gate portions 18 through the corresponding ones of the offset spacers (not shown). Next, the source/drain regions 27 and 28 are formed on the surface side of the semiconductor substrate 11 and below the both sides of each of the gate portions 17 in the first region 11A through the corresponding ones of the extension regions 21 and 22, respectively. In addition, the source/drain regions 29 and 30 are formed on the surface side of the semiconductor substrate 11 and below the both sides of each of the dummy gate portions 18 of the region LVN-1, and the region LVN-2 in the second region 11B through the corresponding ones of the extension regions 23 and 24, respectively. Moreover, the source/drain regions 31 and 32 are formed on the surface side of the semiconductor substrate 11 and below the both sides of the dummy gate portion 18 of the region LVP in the second region 11B through the extension regions 25 and 26, respectively. Also, the silicide layers 33 are formed on each of the source/drain regions 27 to 32.

Next, the insulating film is formed over the entire surface of the semiconductor substrate 11 so as to cover the gate portions 17, the dummy gate portions 18, and the like. Firstly, the liner film 36 is formed as the insulating film over the entire surface of the semiconductor substrate 11. Next, the first interlayer insulating film 38 as a part of the insulating film is formed on the liner film 36. Next, the first interlayer insulating film 38, and the liner film 36 which overlie the gate portions 17 and the dummy gate portions 18 are polished by utilizing the CMP method until the hard masks 74A, and the hard masks 74B are exposed. At this time, the lower portions of the hard masks 74A and 74B are left.

Figure 13B:
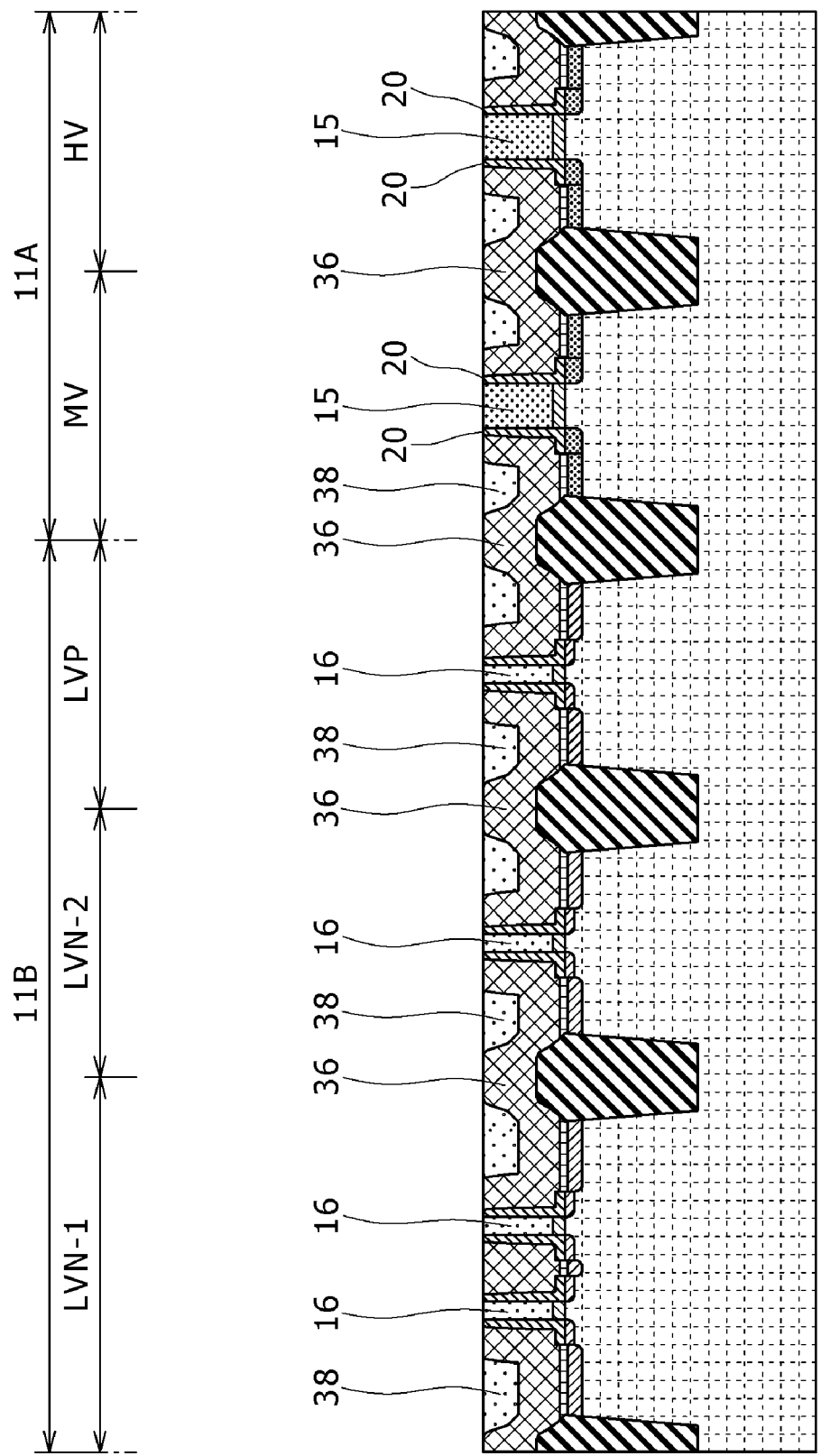

Next, as shown in FIG. 13B, by utilizing either the dry etching method or the CMP method, there are removed the hard mask 74A (refer to FIG. 13A) on each of the first gate electrodes 15 in the first region 11A, and the hard mask 74B (refer to FIG. 13A) on each of the dummy gate electrodes 16 in the second region 11B. When the hard masks 74A and 74B are removed by, for example, utilizing the CMP method, the surfaces of the first gate electrodes 15, the dummy gate electrodes 16, the first interlayer insulating film 38, the liner film 36, the sidewalls 20, and the like are planarized to have approximately the flat surface-like shape.

Figure 13C:
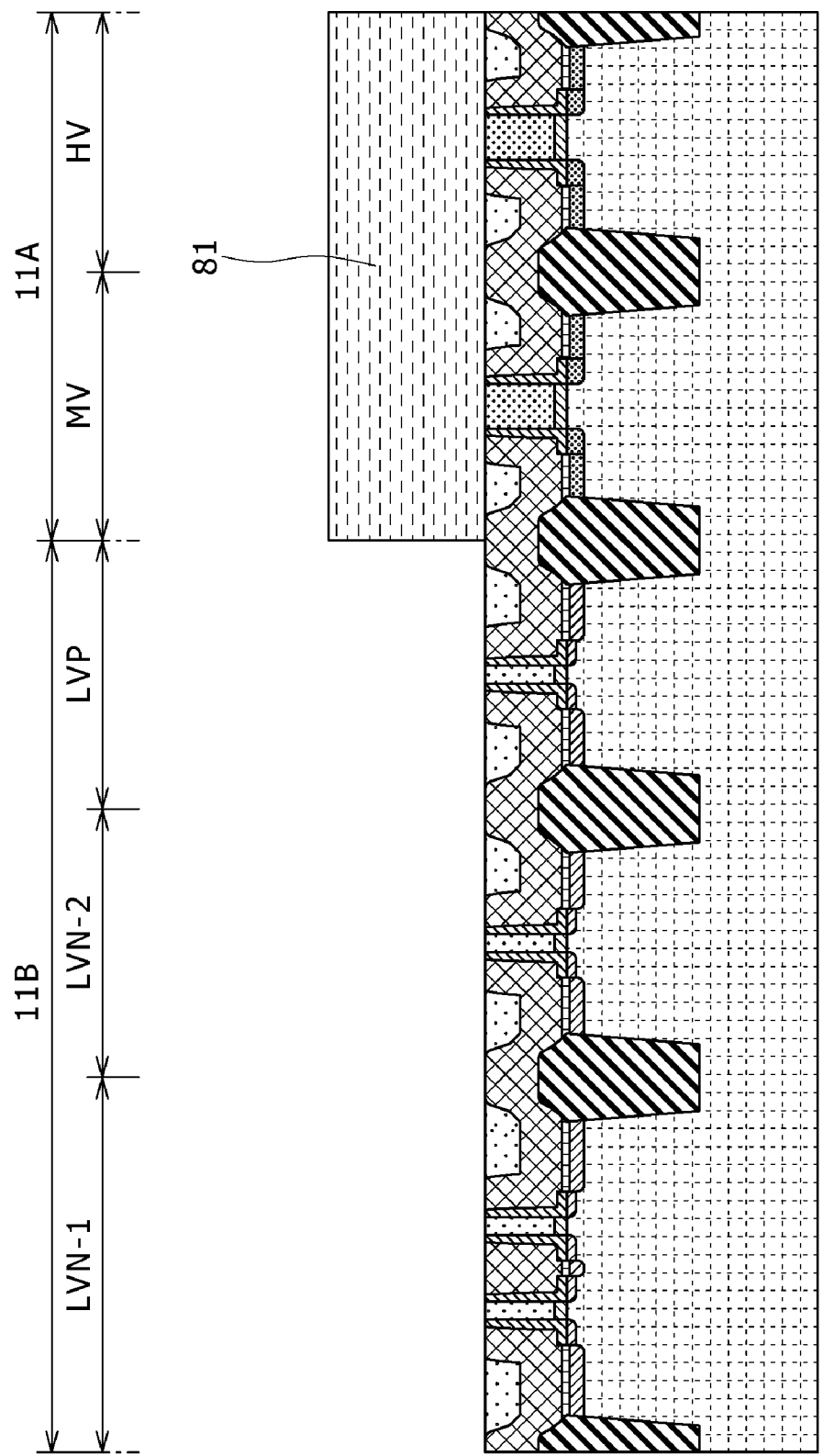

Next, as shown in FIG. 13C, the etching mask 81 is formed so as to cover the first region 11A by utilizing the resist application technique and the lithography technique. Thus, the second region 11B is not covered with the etching mask 81.

Figure 13D:
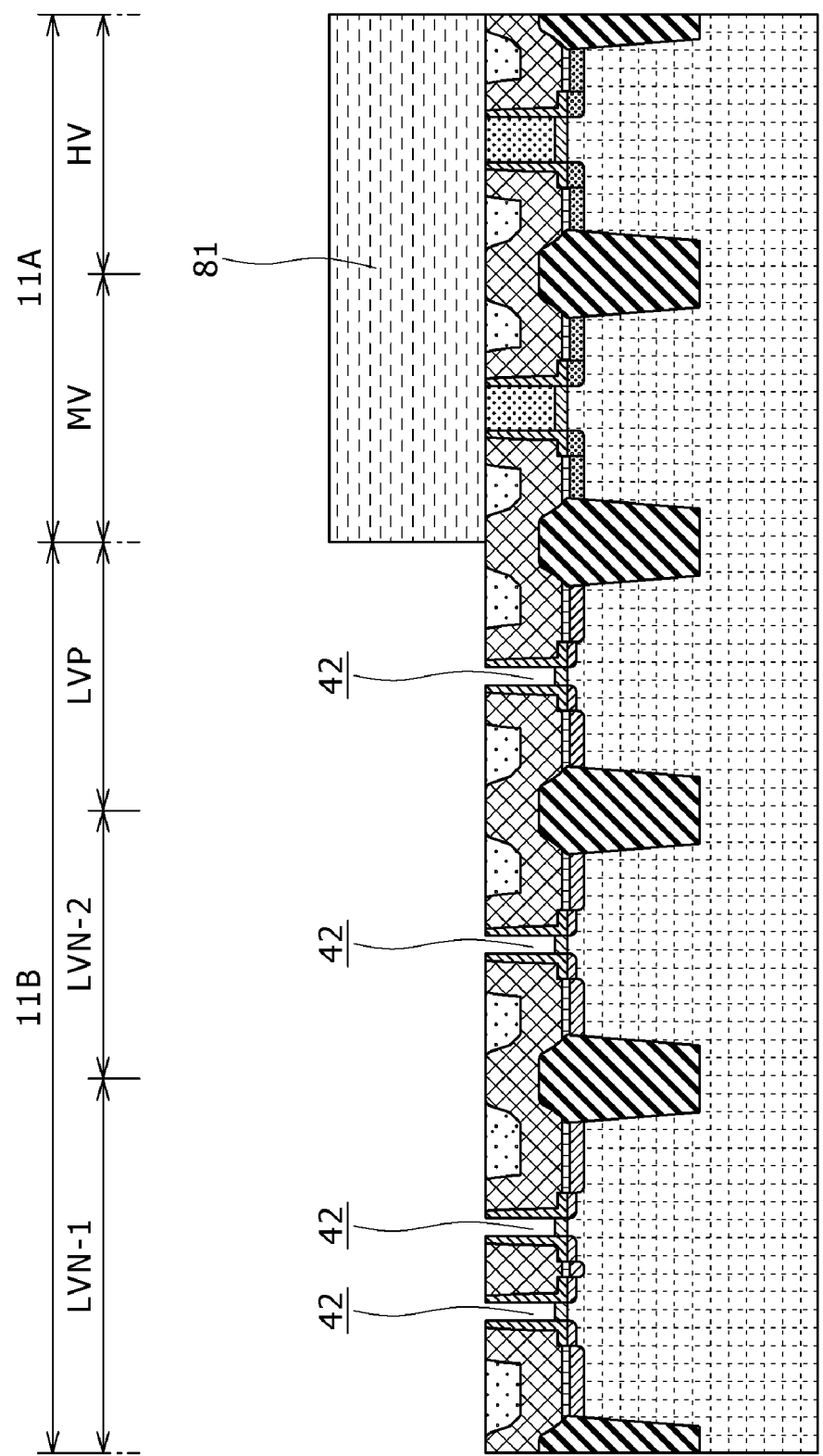

Next, as shown in FIG. 13D, the dummy gate electrodes 16 (refer to FIG. 13A) are removed with the etching mask 81 by, for example, utilizing the dry etching method, thereby forming the trenches 42 for gate formation, respectively. After that, the etching mask 81 is removed away.

However, as shown in FIG. 13E, the dummy gate insulating films 14 (refer to FIG. 13A) are removed by utilizing the wet etching method using a dilute hydrofluoric acid, thereby completing the trenches 42 for gate formation, respectively. At this time, the upper portion of the first interlayer insulating film 38 is also etched away.

Figure 13F:
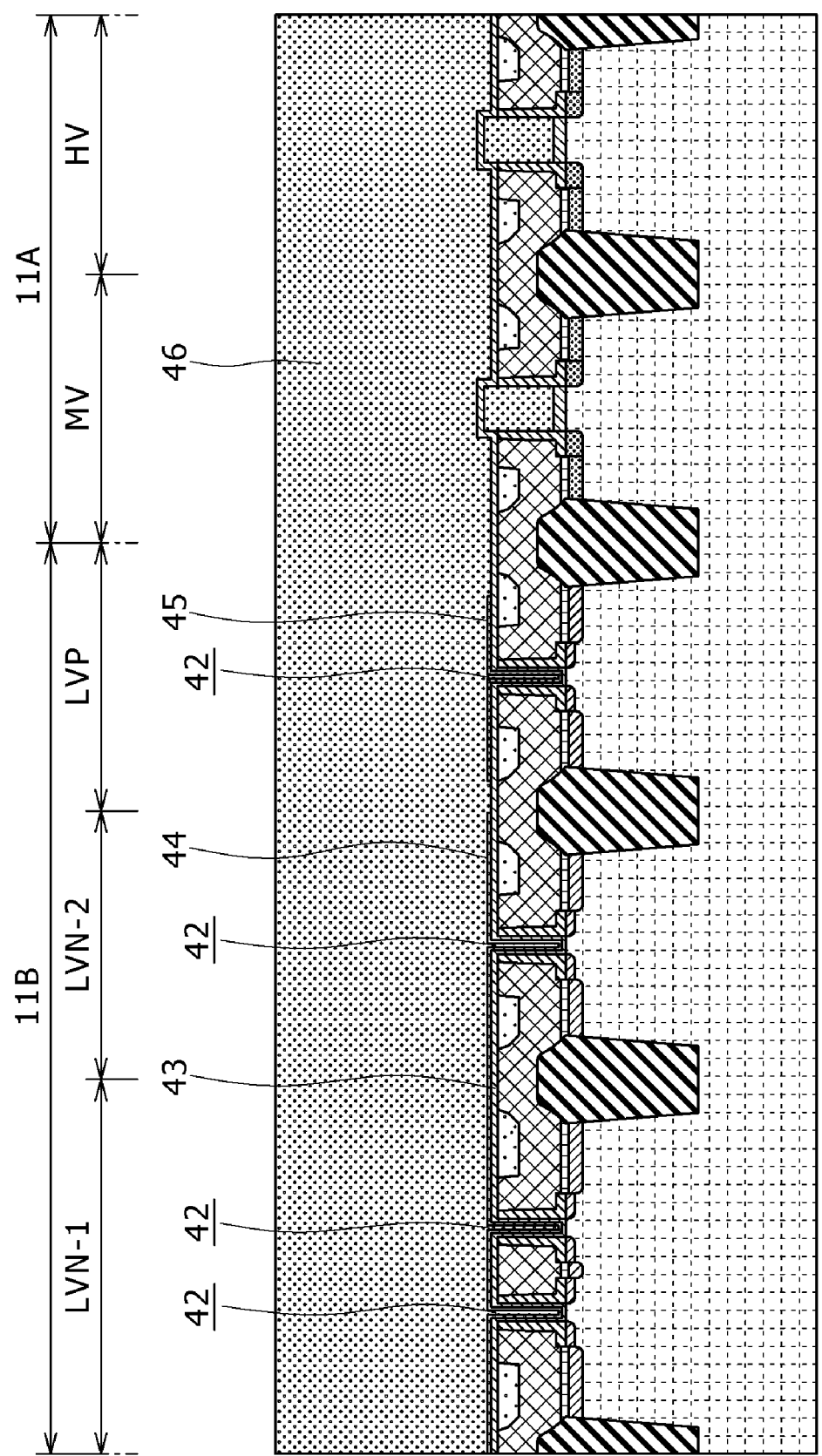

Next, as shown in FIG. 13F, by utilizing the process in the manufacturing method described in the first embodiments with reference to FIG. 3T, the second gate insulating film 43 is formed on each of the inner surfaces of the trenches 42 for gate formation. The second gate insulating film 43 is formed so that the capacity per unit area obtained based on the second gate insulating film 43 is smaller than that obtained based on each of the first gate insulating films 13 in the first region 11A. Next, the work function controlling films 44 and 45 for determining work functions are formed on the inner surfaces of the trenches 42 for gate formation through the second gate insulating films 43, respectively.

Firstly, the metal or metallic compound layer having a work function suitable for the N-channel MISFET is deposited by utilizing the film deposition method such as the ALD method or the CVD method. In this embodiment, for example, the hafnium silicide (HfSi$_x$) layer is deposited to have a thickness of, for example, about 10 to about 100 nm, thereby forming the work function controlling film 44. Subsequently, there is removed the portion of the work function controlling film 44 overlying the region LVP in the second region 11B, and the first region 11A. As a result, the remaining work function controlling film 44 is left so as to overlie the region LVN-1 and the region LVN-2 in the second region 11B.

Next, the metal or metallic compound layer having a work function suitable for the P-channel MISFET is deposited by utilizing the film deposition method such as the ALD method or the CVD method. In this embodiment, for example, a titanium nitride (TiN) layer is deposited to have a thickness of, for example, about 5 to about 50 nm, thereby forming the work function controlling film 45. Subsequently, there is removed the portion of the work function controlling film 45 overlying the region LVN-1 and the region LVN-2 in the second region 11B, and the first region 11A. As a result, the remaining work function controlling film 45 is left so as to overlie the region LVP in the second region 11B. For example, a ruthenium (Ru) layer or the like can also be deposited for the P-channel MISFET.

Any of the work function controlling films 44 and 45 may be formed first.

Next, the conductive film 46 is formed as a conductive material over the entire surface so as to be filled in each of the insides of the trenches 42 for gate formation. The conductive material 46, for example, is made of the metallic material having an electrical resistance value which is smaller than that of each of the work function controlling films 44 and 45. In this example, as an example, the conductive material 46 is made of tungsten (W).

Next, as shown in FIG. 13G, by utilizing the process in the manufacturing method described in the first embodiment with reference to FIG. 3U, there is removed the extra conductive film 46 (refer to FIG. 13F) other than the conductive film 46 filled in each of the insides of the trenches 42 for gate formation. This removal process is carried out by, for example, utilizing the CMP method. In the phase of utilizing the CMP method, the liner film 36, the first interlayer insulating film 38, and the like serve as the polishing stopper. As a result, the second gate electrode 47 of each of the low-voltage transistors (N-channel MISFETs) in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) in the second region 11B is formed from the conductive film 46 and the work function controlling film 45 which are left in the corresponding one of the trenches 42 for gate formation.

Figure 13H:
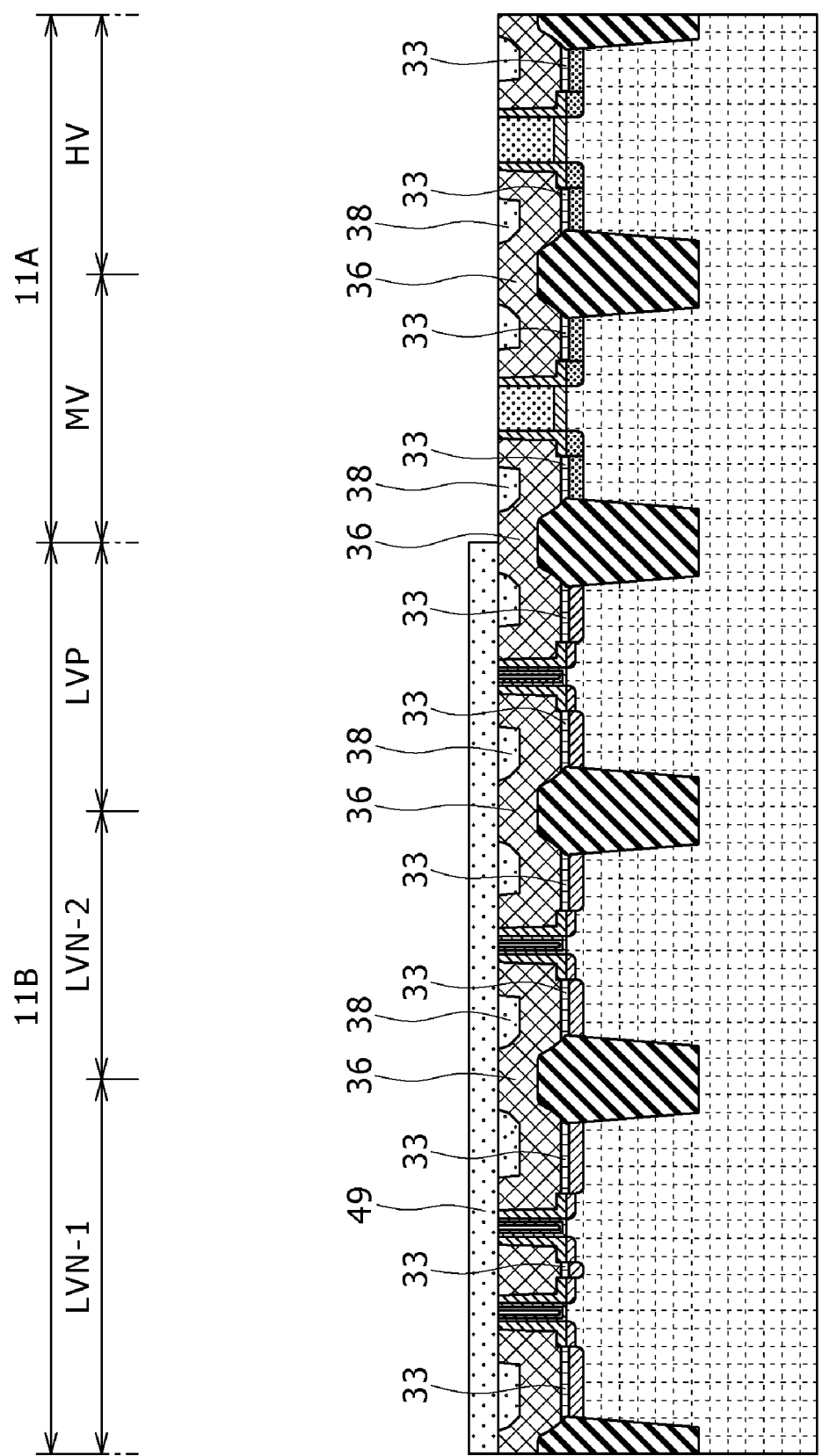

Next, as shown in FIG. 13H, the protective film 49 is formed over all the surfaces of the first interlayer insulating film 38, the liner film 36 and the like. The protective film 49 is formed from either a silicon oxide (SiO$_2$) film or a silicon nitride (SiN) film, by, for example, utilizing the plasma CVD method. For example, when the protective film 49 is formed from the silicon oxide film, an example of the conditions in the CVD method is described as follows: oxygen (O$_2$) (flow rate: 600 cm$^3$/min.) and tetra ethyl silicate (TEOS) (flow rate: 800 cm$^3$/min.) are used as the raw material gas, a pressure of a deposition ambient atmosphere is set at 1.09 kPa, an RF power of a CVD system is set at 700 W, and a substrate temperature is set at 400° C. Since the protective film 49 can be deposited at a temperature of 450° C. or less, the damage is prevented from being incurred on the silicide layers 33 which are previously formed.

Next, the etching mask (not shown) is formed by utilizing the resist application technique and the lithography technique. Thereafter, the portion of the protective film 49 in the first region 11A is removed with the etching mask by utilizing the dry etching method, and thus the remaining protective film 49 is left so as to cover the second region 11B.

Figure 13I:
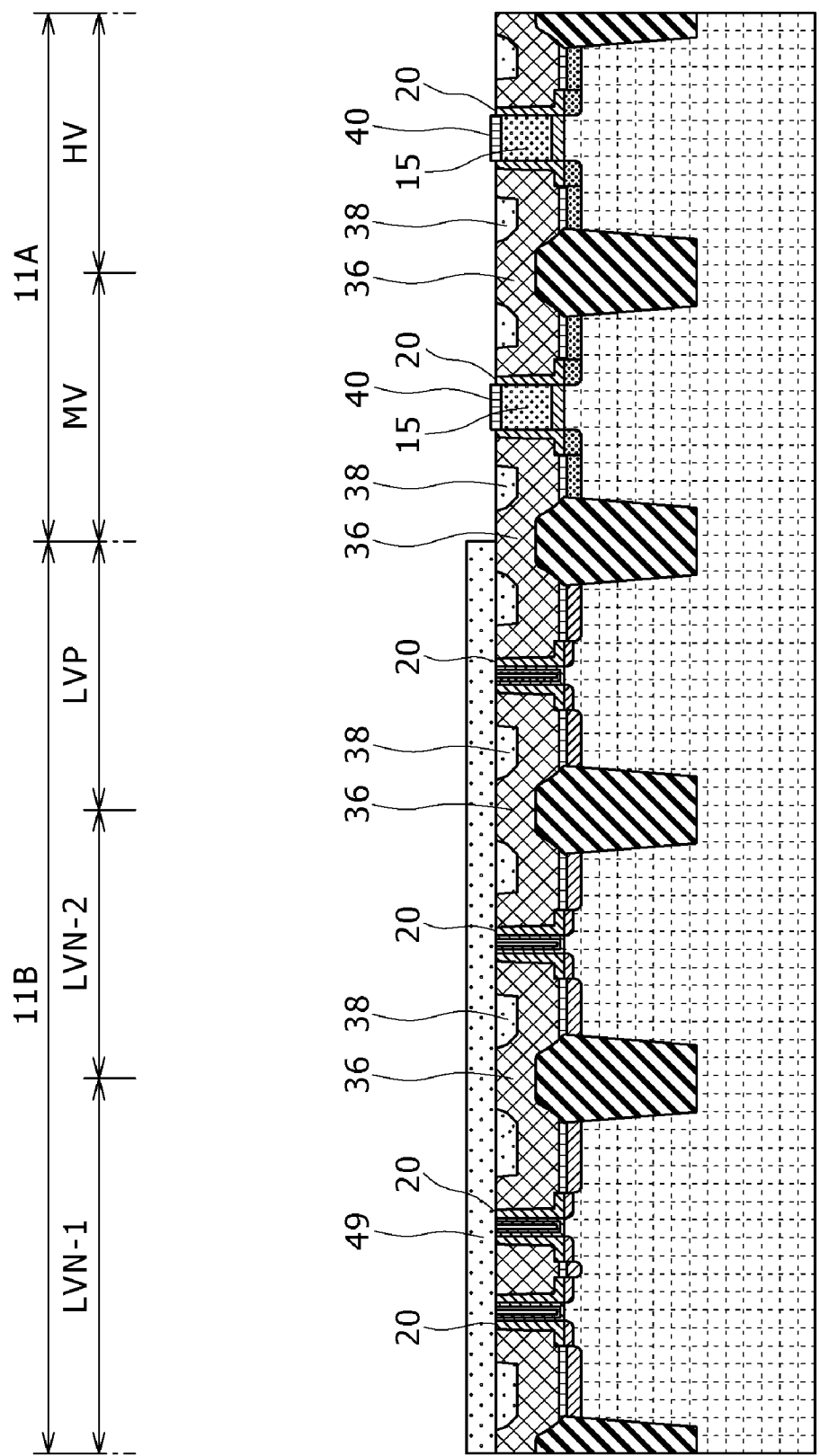

Next, as shown in FIG. 13I, the silicide layer 40 is formed on each of the first gate electrodes 15. Firstly, the metallic layer for formation of the silicide layer 40 is formed over the entire surface. The metallic layer may be made of either nickel (Ni) or nickel platinum (NiPt). In this case, as an example, the metallic layer is made of nickel (Ni). The nickel layer is deposited to have a thickness of, for example, 6 to 8 nm by, for example, utilizing the sputtering method, thereby forming the metallic layer. Next, the RTA is performed at a temperature of 350° C. or less allowing the silicidization for, for example, 30 seconds, so that the metallic layer is reacted with only silicon (Si) of each of the first gate electrodes 15, thereby forming the silicide layer 40. Since the metallic layer is made of nickel, the silicide layer 40 is made of nickel silicide. After that, unreacted nickel on the insulating films (such as the sidewalls 20, the liner film 36, and the first interlayer insulating film 38) is removed by utilizing the wet etching method using aqua regia. Subsequently, a heat treatment is performed, thereby forming a nickel silicide (NiSi$_2$) layer having a low resistance value. This heat treatment, for example, is performed at a temperature of 450° C. or less allowing the low resistance value for 30 seconds in the RTA.

Figure 13J:
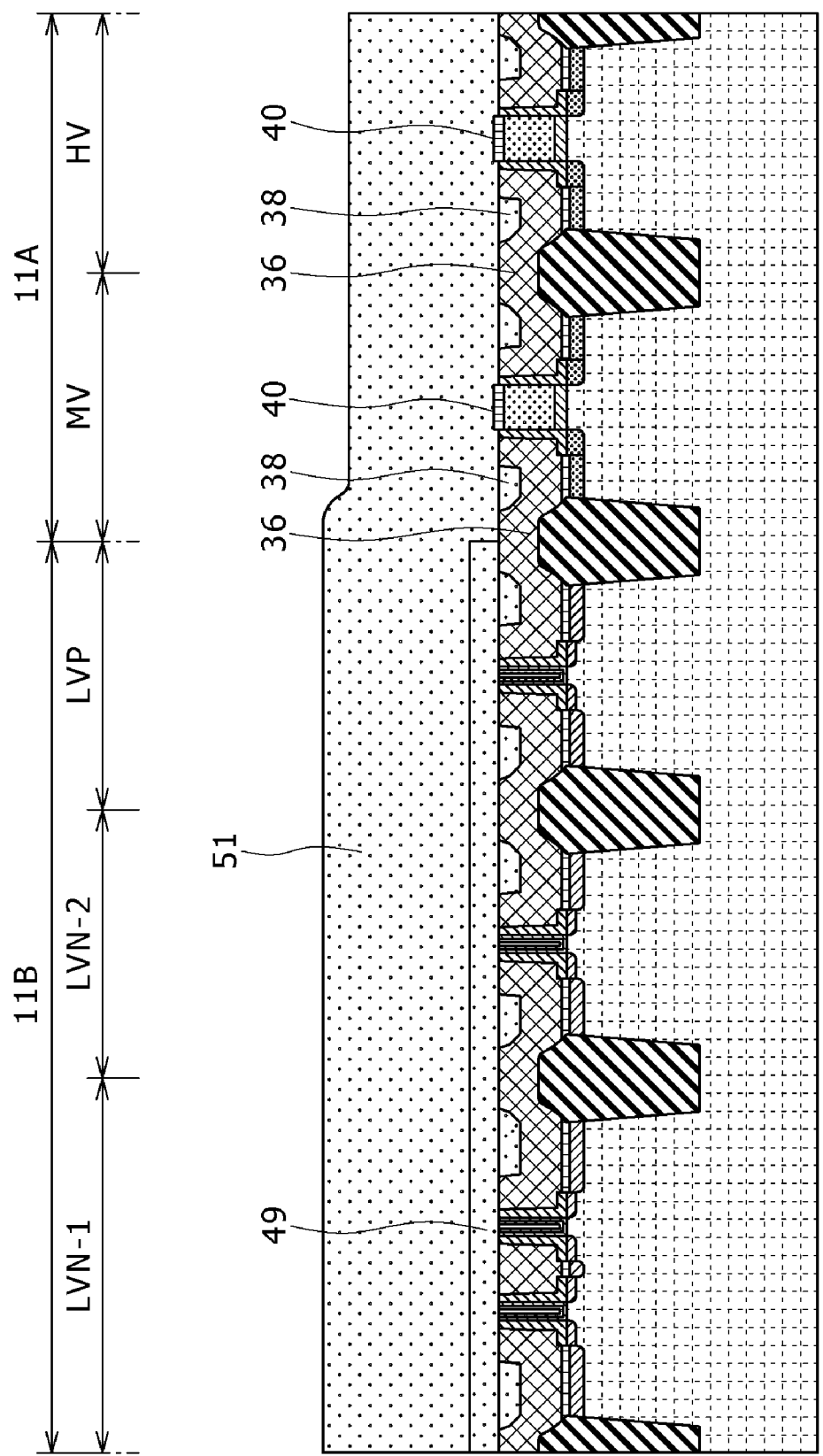

Next, as shown in FIG. 13J, the second interlayer insulating film 51 is formed over all the surfaces of the liner film 36, the first interlayer insulating film 38, the silicide layer 40, the protective film 49, and the like. The second interlayer insulating film 51, for example, is formed from a silicon oxide film. With regard to the film deposition conditions, the film deposition temperature is set at 450° C. or less by, for example, utilizing the HDP-CVD method.

Figure 13K:
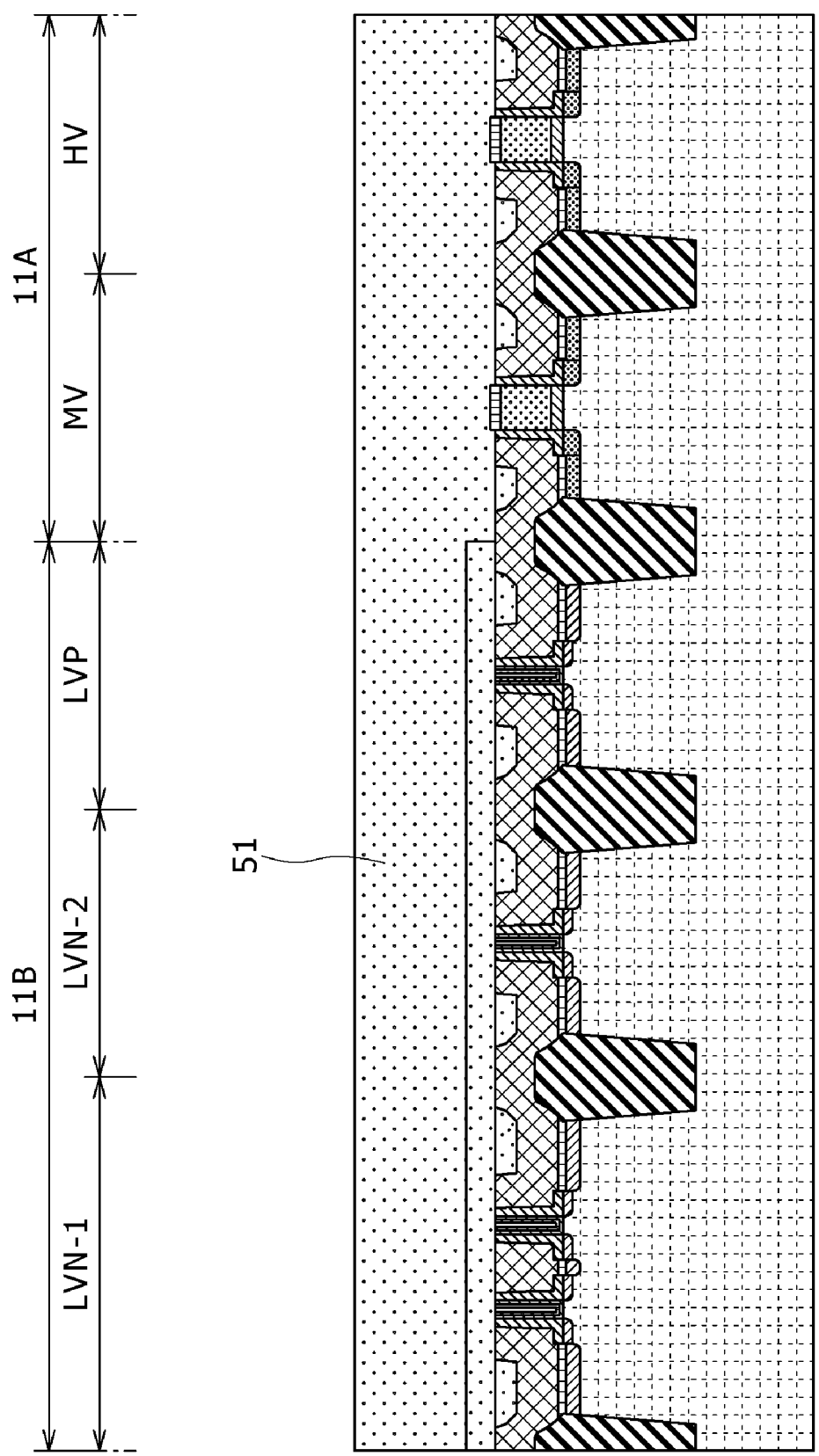

Next, as shown in FIG. 13K, the surface of the second interlayer insulating film 51 is planarized by, for example, utilizing the CMP method.

Figure 13L:
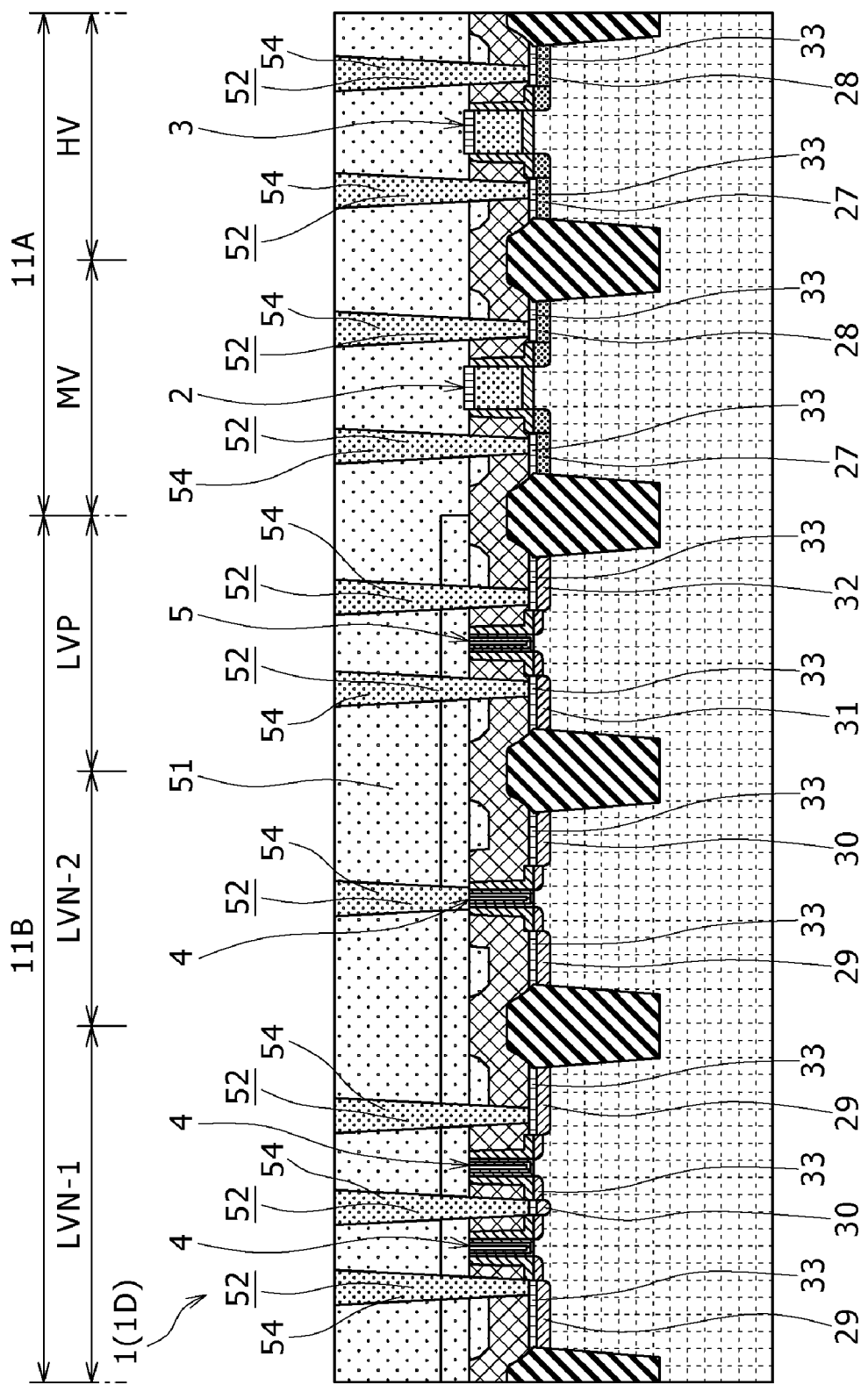

Next, as shown in FIG. 13L, by utilizing the processes in the manufacturing method described in the first embodiment with reference to FIGS. 3W to 3Y, the connection holes 52 to the respective silicide layers 33 corresponding to the first gate electrodes 15, the second gate electrodes 47 and 48, and the source/drain regions 27 to 32 of the transistors so as to extend completely through the liner film 36, the first interlayer insulating film 38, the protective film 49, and the second interlayer insulating film 51. It is noted that since FIG. 13L is a cross sectional view, an illustration of a part of the connection holes is omitted here for the sake of simplicity. Next, the conductive film is formed on the second interlayer film 51 so as to be filled in each of the connection holes 52. The conductive film, for example, is made of tungsten (W). The CVD method, for example, is utilized as a method of depositing the conductive film.

Next, a portion of the conductive layer overlying the second interlayer insulating film 51 is removed by utilizing either the CMP method or the dry etching method, so that each of the electrodes 54 is formed from the conductive film left in each of the insides of the connection holes 52. Although not illustrated, thereafter, the wiring process is carried out.

As has been described, the middle-voltage transistor (N-channel MISFET) 2 is formed in the region HV of the first region 11A, and the high-voltage voltage transistor (N-channel MISFET) 3 is formed in the region MV thereof. Also, the low-voltage transistors (N-channel MISFETs) 4 are densely formed in the region LVN-1 of the second region 11B, the low-voltage transistor (N-channel MISFET) 4 is formed in isolation in the region LVN-2 thereof, and the low-voltage transistor (P-channel MISFET) 5 is formed in the region LVP thereof. In such a manner, the semiconductor device 1(1D) is formed.

With the method of manufacturing the semiconductor device according to the fourth embodiment of the present invention, the middle-voltage transistor (N-channel MISFET) 2, and the high-voltage transistor (N-channel MISFET) 3 are formed as a first group of transistors in the region MV and the region HV, respectively, in the semiconductor substrate 11. In addition, the low-voltage transistors (N-channel MISFETs) 4, the low-voltage transistor (N-channel MISFET) 4, and the low-voltage transistor (P-channel MISFET) 5 are formed as a second group of transistors each having the lower operating voltage than that of each of the transistors in the first group in the region MV and the region HV, respectively, in the semiconductor substrate 11. In addition thereto, the protective film 49 is formed so as to cover the second gate electrodes 47 and 48 of the second group of transistors before the silicide layer 40 is formed on each of the first gate electrodes 15 of the first group of transistors. Thus, the second gate electrodes 47 and 48 of the second group of transistors are protected when the silicide layer 40 is formed on each of the first gate electrodes 15 of the first group of transistors. That is to say, when the unreacted metallic film formed for silicidization is removed away, each of the second gate electrodes 47 and 48 is prevented from being etched and removed away. The electrical resistance value of each of the first gate electrodes 15 is reduced since the silicide layer 40 is formed on each of the first gate electrodes 15 in such a manner.

Therefore, the following advantage is obtained. That is to say, the first group of transistors (the group of high-withstand voltage (high-voltage operation and middle-voltage operation)) transistors each having the first gate insulating film 13 made of either a silicon oxide or a silicon oxynitride, and the first gate electrode 15 made of either polysilicon or amorphous silicon, and the second group of transistors (for example, the group of low-voltage operation transistors) having the second gate insulating films 43 as the high-permittivity (High-k) films, and the second gate electrodes 47 and 48 as the so-called metallic gate electrodes are formed on the same semiconductor substrate 11. As a result, it is possible to reduce the electrical resistance value of each of the first gate electrodes 15 of the first group of transistors.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device including a first group of transistors, and a second group of transistors each of which is lower in operating voltage than each of said transistors in said first group, said first group of transistors and said second group of transistors being formed on a semiconductor substrate, each of said transistors in said first group having a first gate electrode formed on said semiconductor substrate through corresponding one of first gate insulating films, and a silicide layer formed on corresponding one of said first gate electrodes, each of said transistors in said second group having a second gate electrode formed in a trench for gate formation, formed in an insulating film above said semiconductor substrate, through corresponding one of second gate insulating films, said manufacturing method comprising the steps of:

forming a protective film for covering said silicide layer after said silicide layer is formed on each of said first gate electrodes of said first group of transistors; and forming said second gate electrodes in said trenches for gate formation through said second gate insulating films, respectively;

forming a gate having said first gate insulating film, said first gate electrode, and a hard mask laminated in order in each of said first region in which said first group of transistors is formed, and said second region in which said second group of transistors is formed on said semiconductor substrate;

forming a first source/drain region of each of said transistors in said first group in said first region of said semiconductor substrate, and forming a second source/drain region of each of said transistors in said second group in said second region of said semiconductor substrate;

planarizing a surface of said insulating film at the same time that said hard mask of each of said gates is exposed after said insulating film is formed so as to cover each of said gates in said first region and said second region;

removing said hard mask of each of said gates in said first region;

forming said silicide layer on each of upper surfaces of said first gate electrodes in said first region;

forming said protective film for covering said silicide layer on said insulating film in said first region;

forming trenches for gate formation in said insulating film by removing said gates in said second region; and filling a conductive material in each of said trenches for gate formation to form each of said second gate electrodes after said second gate insulating film is formed in each of said trenches for gate formation.

2. The method of manufacturing the semiconductor device according to claim 1, wherein said first gate insulating film is made of an oxide, an oxysilicate, an oxynitride, or a silicon oxynitride of hafnium, zirconium, lanthanum, yttrium, tantalum or aluminum.

3. A method of manufacturing a semiconductor device including a first region having a first group of transistors formed therein, and a second region having a second group of transistors formed therein, each of said transistors in said second group being lower in operating voltage than each of said transistors in said first group, said first group of transistors and said second group of transistors being formed on a semiconductor substrate, each of said transistors in said first group having a first gate electrode formed on said semiconductor substrate through corresponding one of first gate insulating films, and a silicide layer formed on corresponding one of said first gate electrodes, each of said transistors in said second group having a second gate electrode formed in a trench for gate formation, formed in an insulating film above said semiconductor substrate, through corresponding one of second gate insulating films, said manufacturing method, when said semiconductor device is manufactured, sequentially comprising the steps of:
forming said first gate electrodes in said first region and said second region on said semiconductor substrate through the corresponding ones of said first gate insulating films, respectively;
forming said insulating film for covering said first gate electrodes formed in said first region and said second region, respectively;
forming said silicide layer on each of said first gate electrodes formed in said first region after each of said first gate electrodes formed in said first region is formed so as to be lower than each of said first gate electrodes formed in said second region by removing an upper portion of said insulating film and upper portions of said first gate in said first region;
forming a protective film for covering said silicide layer so that a surface of said insulating film formed in said second region, and a surface of said protective film are formed to have a flat surface-like shape; and
filling a conductive material in each of said trenches for gate formation by removing said protective film in said second region, and removing said first gate electrodes and said first gate insulating films formed in said second region through corresponding one of said second gate insulating films, so as to form said second gate electrode of said second group of transistors.

4. The method of manufacturing the semiconductor device according to claim 3, further comprising the steps of:
forming a gate by laminating a hard mask on said first gate electrode transistors in said step of forming said first gate insulating films and said gate electrodes;
further forming a first source/drain region of each of said transistors in said first group in said first region of said semiconductor substrate, and forming a second source/drain region of each of said transistors in said second group in said second region of said semiconductor substrate;
further planarizing a surface of said insulating film at the same time that said hard mask of each of said gates is exposed after said insulating film is formed;
further exposing said first gate electrodes by removing an upper portion of said insulating film, and said hard mask in said first region; and
further performing the steps in and after the step of removing each of upper portions of said first gate electrodes.

5. The method of manufacturing the semiconductor device according to claim 4, wherein said protective film is formed to have the same thickness as that of said insulating film removed in a region in which said hard mask and said insulating film in said first region are removed.

6. The method of manufacturing the semiconductor device according to claim 4, wherein said first gate insulating film is made of an oxide, an oxysilicate or an oxynitride of hafnium, zirconium, lanthanum, yttrium, tantalum or aluminum.

7. A method of manufacturing a semiconductor device including a first group of transistors, and a second group of transistors each of which is lower in operating voltage than each of said transistors in said first group, said first group of transistors and said second group of transistors being formed on a semiconductor substrate, each of said transistors in said first group having a first gate electrode formed on said semiconductor substrate through corresponding one of first gate insulating films, and a silicide layer formed on corresponding one of said first gate electrodes, each of said transistors in said second group having a second gate electrode formed in a trench for gate formation, formed in an insulating film above said semiconductor substrate, through corresponding one of second gate insulating films, said manufacturing method comprising the step of:
forming a protective film for covering each of said second gate electrodes of said second group of transistors after said second gate electrodes of said second group of transistors are formed, and forming said silicide layer on each of said first gate electrodes of said first group of transistors;
forming a gate having said first gate insulating film, said first gate electrode, and a hard mask laminated in order in each of said first region in which said first group of transistors is formed, and said second region in which said second group of transistors is formed on said semiconductor substrate;
forming a first source/drain region of each of said transistors in said first group in said first region of said semiconductor substrate, and forming a second source/drain region of each of said transistors in said second group in said second region of said semiconductor substrate;
planarizing a surface of said insulating film at the same time that said hard mask of each of said gates is exposed after said insulating film is formed so as to cover each of said gates in said first region and said second region;
exposing said first gate electrodes by removing an upper portion of said insulating film, and said hard mask in said first region and said second region;
forming said trenches for gate formation in said insulating film by removing said first gate electrodes and said first gate insulating films in said second region;
filling a conductive material in each of said trenches for gate formation to form each of said second gate electrodes after said second gate insulating film is formed in each of said trenches for gate formation;
forming said protective film for covering said second gate electrodes on said insulating film in said second region; and forming said silicide layer on each of upper surfaces of said first gate electrodes in said first region.

8. The method of manufacturing the semiconductor device according to claim 7, wherein said first gate insulating film is made of an oxide, an oxysilicate or an oxynitride of hafnium, zirconium, lanthanum, yttrium, tantalum or aluminum.

* * * * *